: US008074011B2

(12) United States Patent
Flynn et al.

(10) Patent No.: US 8,074,011 B2
(45) Date of Patent: Dec. 6, 2011

(54) APPARATUS, SYSTEM, AND METHOD FOR STORAGE SPACE RECOVERY AFTER REACHING A READ COUNT LIMIT

(75) Inventors: David Flynn, Sandy, UT (US); Bert Lagerstedt, Pleasant Grove, UT (US); John Strasser, Syracuse, UT (US); Jonathan Thatcher, Lehi, UT (US); John Walker, Sandy, UT (US); Michael Zappe, Wheat Ridge, CO (US); Stephan Uphoff, Roswell, GA (US); Joshua Aune, South Jordan, UT (US); Kevin Vigor, Salt Lake City, UT (US)

(73) Assignee: Fusion-IO, Inc., Salt Lake City, UT (US)

( * ) Notice: Subject to any disclaimer, the term of this patent is extended or adjusted under 35 U.S.C. 154(b) by 441 days.

(21) Appl. No.: 12/273,532

(22) Filed: Nov. 18, 2008

(65) Prior Publication Data
US 2009/0125671 A1    May 14, 2009

Related U.S. Application Data

(63) Continuation-in-part of application No. 11/952,101, filed on Dec. 6, 2007.

(60) Provisional application No. 60/873,111, filed on Dec. 6, 2006, provisional application No. 60/974,470, filed on Sep. 22, 2007.

(51) Int. Cl.
  *G06F 13/00* (2006.01)
(52) U.S. Cl. ......... 711/103; 711/153; 711/165; 711/202
(58) Field of Classification Search ................. 711/103, 711/153, 165, 202
See application file for complete search history.

(56) References Cited

U.S. PATENT DOCUMENTS

| | | | |
|---|---|---|---|
| 5,261,068 A | 11/1993 | Gaskins et al. | |
| 5,325,509 A | 6/1994 | Lautzenheiser | |
| 5,388,083 A | 2/1995 | Assar et al. | |
| 5,438,671 A | 8/1995 | Miles | |
| 5,479,638 A | 12/1995 | Assar et al. | |
| 5,485,595 A | 1/1996 | Assar et al. | |

(Continued)

FOREIGN PATENT DOCUMENTS
EP   1100001   5/2001
(Continued)

OTHER PUBLICATIONS

PCT/US2007/086688, International Search Report and Written Opinion, Apr. 28, 2008.
(Continued)

*Primary Examiner* — Reba I Elmore
(74) *Attorney, Agent, or Firm* — Kunzler Needham Massey & Thorpe

(57) ABSTRACT

An apparatus, system, and method are disclosed for storage space recovery after reaching a read count limit. A read module reads data in a storage division of solid-state storage. A read counter module then increments a read counter corresponding to the storage division. A read counter limit module determines if the read count exceeds a maximum read threshold, and if so, a storage division selection module selects the corresponding storage division for recovery. A data recovery module reads valid data packets from the selected storage division, stores the valid data packets in another storage division of the solid-state storage, and updates a logical index with a new physical address of the valid data.

36 Claims, 14 Drawing Sheets

U.S. PATENT DOCUMENTS

| | | | |
|---|---|---|---|
| 5,504,882 | A | 4/1996 | Chai |
| 5,544,356 | A | 8/1996 | Robinson et al. |
| 5,551,003 | A | 8/1996 | Mattson et al. |
| 5,592,641 | A | 1/1997 | Fandrich et al. |
| 5,594,883 | A | 1/1997 | Pricer |
| 5,701,434 | A | 12/1997 | Nakagawa |
| 5,734,861 | A | 3/1998 | Cohn et al. |
| 5,754,563 | A | 5/1998 | White |
| 5,758,118 | A | 5/1998 | Choy et al. |
| 5,845,329 | A | 12/1998 | Onishi et al. |
| 5,960,462 | A | 9/1999 | Solomon et al. |
| 6,000,006 | A | 12/1999 | Bruce et al. |
| 6,000,019 | A | 12/1999 | Dykstal et al. |
| 6,014,724 | A | 1/2000 | Jenett |
| 6,078,520 | A | 6/2000 | Tobita et al. |
| 6,145,051 | A | 11/2000 | Estakhri et al. |
| 6,170,039 | B1 | 1/2001 | Kishida |
| 6,170,047 | B1 | 1/2001 | Dye |
| 6,173,381 | B1 | 1/2001 | Dye |
| 6,185,654 | B1 | 2/2001 | Van Doren |
| 6,240,040 | B1 | 5/2001 | Akaogi et al. |
| 6,330,688 | B1 | 12/2001 | Brown |
| 6,353,878 | B1 | 3/2002 | Dunham |
| 6,356,986 | B1 | 3/2002 | Solomon et al. |
| 6,370,631 | B1 | 4/2002 | Dye |
| 6,374,336 | B1 | 4/2002 | Peters et al. |
| 6,385,710 | B1 | 5/2002 | Goldman et al. |
| 6,404,647 | B1 | 6/2002 | Minne |
| 6,404,676 | B2 | 6/2002 | Kihara et al. |
| 6,412,080 | B1 | 6/2002 | Fleming et al. |
| 6,418,478 | B1 | 7/2002 | Ignatius et al. |
| 6,446,188 | B1 | 9/2002 | Henderson et al. |
| 6,523,102 | B1 | 2/2003 | Dye et al. |
| 6,535,869 | B1 | 3/2003 | Housel, III |
| 6,567,307 | B1 | 5/2003 | Estakhri |
| 6,571,312 | B1 | 5/2003 | Sugai et al. |
| 6,587,915 | B1 | 7/2003 | Kim |
| 6,601,211 | B1 | 7/2003 | Norman |
| 6,604,168 | B2 | 8/2003 | Ogawa |
| 6,625,685 | B1 | 9/2003 | Cho et al. |
| 6,671,757 | B1 | 12/2003 | Multer et al. |
| 6,697,076 | B1 | 2/2004 | Trivedi et al. |
| 6,715,046 | B1 | 3/2004 | Shoham et al. |
| 6,725,321 | B1 | 4/2004 | Sinclair et al. |
| 6,742,078 | B1 | 5/2004 | Chien et al. |
| 6,751,155 | B2 | 6/2004 | Gorobets |
| 6,754,774 | B2 | 6/2004 | Gruner et al. |
| 6,760,805 | B2 | 7/2004 | Lasser |
| 6,763,424 | B2 | 7/2004 | Conley |
| 6,775,185 | B2 | 8/2004 | Fujisawa et al. |
| 6,779,088 | B1 | 8/2004 | Benveniste et al. |
| 6,779,094 | B2 | 8/2004 | Selkirk et al. |
| 6,785,785 | B2 | 8/2004 | Piccirillo et al. |
| 6,795,890 | B1 | 9/2004 | Sugai et al. |
| 6,839,826 | B2 | 1/2005 | Cernea |
| 6,877,076 | B1 | 4/2005 | Cho et al. |
| 6,880,049 | B2 | 4/2005 | Gruner et al. |
| 6,883,079 | B1 | 4/2005 | Priborsky |
| 6,912,537 | B2 | 6/2005 | Selkirk et al. |
| 6,931,509 | B2 | 8/2005 | Lloyd-Jones |
| 6,938,133 | B2 | 8/2005 | Johnson et al. |
| 6,968,421 | B2 | 11/2005 | Conley |
| 6,996,676 | B2 | 2/2006 | Megiddo |
| 7,010,652 | B2 | 3/2006 | Piccirillo et al. |
| 7,010,662 | B2 | 3/2006 | Aasheim et al. |
| 7,043,599 | B1 | 5/2006 | Ware et al. |
| 7,050,337 | B2 | 5/2006 | Iwase et al. |
| 7,058,769 | B1 | 6/2006 | Danilak |
| 7,076,599 | B2 | 7/2006 | Aasheim |
| 7,082,495 | B2 | 7/2006 | DeWhitt |
| 7,082,512 | B2 | 7/2006 | Aasheim et al. |
| 7,085,879 | B2 | 8/2006 | Aasheim et al. |
| 7,089,391 | B2 | 8/2006 | Geiger et al. |
| 7,096,321 | B2 | 8/2006 | Modha |
| 7,130,960 | B1 | 10/2006 | Kano |
| 7,139,864 | B2 | 11/2006 | Bennett et al. |
| 7,167,953 | B2 | 1/2007 | Megiddo et al. |
| 7,173,852 | B2 | 2/2007 | Gorobets et al. |
| 7,181,572 | B2 | 2/2007 | Walmsley |
| 7,194,577 | B2 | 3/2007 | Johnson et al. |
| 7,215,580 | B2 | 5/2007 | Gorobets |
| 7,219,238 | B2 | 5/2007 | Saito et al. |
| 7,243,203 | B2 | 7/2007 | Scheuerlein |
| 7,246,179 | B2 | 7/2007 | Camara |
| 7,305,520 | B2 | 12/2007 | Voigt |
| 7,337,201 | B1 | 2/2008 | Yellin et al. |
| 7,340,566 | B2 | 3/2008 | Voth |
| 7,340,645 | B1 | 3/2008 | Martin et al. |
| 7,366,868 | B2 | 4/2008 | Reuter et al. |
| 7,392,365 | B2 | 6/2008 | Selkirk et al. |
| 7,450,420 | B2 | 11/2008 | Sinclair et al. |
| 7,451,346 | B2 | 11/2008 | Katsuragi et al. |
| 7,487,320 | B2 | 2/2009 | Bansal |
| 7,509,454 | B2 | 3/2009 | Kano |
| 7,529,905 | B2 | 5/2009 | Sinclair |
| 7,552,271 | B2 | 6/2009 | Sinclair |
| 7,644,239 | B2 | 1/2010 | Ergan |
| 7,676,728 | B2 | 3/2010 | Resnick et al. |
| 7,725,628 | B1 | 5/2010 | Phan |
| 2002/0057798 | A1* | 5/2002 | Zhang ............................ 380/44 |
| 2002/0069317 | A1 | 6/2002 | Chow et al. |
| 2002/0069318 | A1 | 6/2002 | Chow et al. |
| 2003/0028704 | A1 | 2/2003 | Mukaida et al. |
| 2003/0061296 | A1 | 3/2003 | Craddock |
| 2003/0163630 | A1 | 8/2003 | Aasheim et al. |
| 2003/0163633 | A1 | 8/2003 | Aasheim |
| 2003/0198084 | A1 | 10/2003 | Fujisawa et al. |
| 2004/0044705 | A1 | 3/2004 | Stager et al. |
| 2004/0088514 | A1 | 5/2004 | Bullen et al. |
| 2004/0186946 | A1 | 9/2004 | Lee |
| 2004/0268359 | A1 | 12/2004 | Hanes |
| 2005/0002263 | A1 | 1/2005 | Iwase et al. |
| 2005/0015539 | A1 | 1/2005 | Horii et al. |
| 2005/0027951 | A1 | 2/2005 | Piccirillo et al. |
| 2005/0055495 | A1 | 3/2005 | Vihmalo et al. |
| 2005/0141312 | A1 | 6/2005 | Sinclair et al. |
| 2005/0141313 | A1 | 6/2005 | Gorobets et al. |
| 2005/0144361 | A1 | 6/2005 | Gonzalez et al. |
| 2005/0193166 | A1 | 9/2005 | Johnson et al. |
| 2005/0223154 | A1 | 10/2005 | Uemura |
| 2005/0240713 | A1 | 10/2005 | Wu |
| 2005/0246510 | A1 | 11/2005 | Retnamma et al. |
| 2006/0004955 | A1 | 1/2006 | Ware et al. |
| 2006/0059326 | A1 | 3/2006 | Aasheim |
| 2006/0075057 | A1 | 4/2006 | Gildea |
| 2006/0248387 | A1 | 11/2006 | Nicholson |
| 2006/0271725 | A1 | 11/2006 | Wong |
| 2007/0016699 | A1 | 1/2007 | Minami |
| 2007/0028035 | A1 | 2/2007 | Nishihara |
| 2007/0030734 | A1 | 2/2007 | Sinclair et al. |
| 2007/0050571 | A1 | 3/2007 | Nakamura |
| 2007/0118713 | A1 | 5/2007 | Guterman |
| 2007/0143560 | A1 | 6/2007 | Gorobets |
| 2007/0168564 | A1 | 7/2007 | Conley et al. |
| 2007/0198770 | A1 | 8/2007 | Horii et al. |
| 2007/0204100 | A1 | 8/2007 | Shin et al. |
| 2007/0233937 | A1 | 10/2007 | Coulson |
| 2007/0268754 | A1 | 11/2007 | Lee et al. |
| 2007/0300008 | A1 | 12/2007 | Rogers |
| 2008/0034259 | A1 | 2/2008 | Ko et al. |
| 2008/0082736 | A1 | 4/2008 | Chow et al. |
| 2008/0098083 | A1 | 4/2008 | Shergill |
| 2008/0098159 | A1 | 4/2008 | Song et al. |
| 2009/0313453 | A1 | 12/2009 | Stefanus et al. |

FOREIGN PATENT DOCUMENTS

| | | |
|---|---|---|
| EP | 1607868 | 12/2005 |
| JP | 200486295 A | 3/2004 |
| JP | 2004086295 A | 3/2004 |
| WO | WO2005010773 | 2/2005 |

OTHER PUBLICATIONS

PCT/US2007/086688, International Preliminary Report on Patentability, Mar. 16, 2009.
ASPMC_660, Asine Group, http://www.asinegroup.com/products/aspc660.html, copyright 2002, downloaded on Nov. 18, 2009.

BiTMICRO Introduces E-Disk PMC Flash Disk Module at Military & Aerospace Electronics East, May 18, 2004, BiTMICRO, http://www.bitmicro.com/press_news_releases_20040518_prt.php.
NAND Flash 101: An Introduction to NAND Flash and How to Design It In to Your Next Product, Micron, pp. 1-28, Micron Technology Nov. 2006.
"Pivot3 RAIGE Storage Cluster: Technology Overview", Pivot 3, White Paper, www.pivot3.com, Jun. 2007, pp. 1-17.
PCT/US2009/039570, 2380.2.18pct, International Search Report and Written Opinion, Aug. 7, 2009.
Ari, Gottwals, Henze, "Performance Boosting and Workload Isolation in Storage Area Networks with SANcache", Hewlett Packard Laboratories, Proceedings of the 23rd IEEE/ 14th NASA Goddard Conference on Mass Storage Systems Technologies (MSST 2006), May 2006, pp. 263-273.
Plank, James S, "A Tutorial on Reed-Solomon coding for Fault Tolerance in RAID-like Systems", Dept. of computer Science, Univ. Of Tennessee, Sep. 1997, pp.. 995-1012.
Morgenstern, David, "Is there a Flash Memory RAID in your Future?", Nov. 2006.
"File System Primer", http://wiki.novell.com/index.php/File_System_Primer, Jul. 2006.
"Method for fault tolerance in nonvolatile storage", Ip.com, IPCOM000042269D, Feb. 2005.
Dan, Singer, Implementing MLC NAND Flash for Cost-Effective, High-Capacity Memory, M-systems White paper, Sep. 2003.
Introduction to Samsungs Linux Flash File System—RFS, Samsung Electronics, Nov. 2006.
Mesnier, Ganger, Riedel, "Object-Based Storage", IEEE Comm Magazine, Aug. 2003.
Hensbergen, "Dynamic Policy Disk Caching for Storage Networking", Nov. 2006.
PCT/US2009/039570, 2380.2.18pct_International Preliminary Report on Patentability, Oct. 21, 2010.
Kawaguchi, A Flash-Memory Based File System, Advanced Research Laboratory, Hitachi, Ltd., 1995.
Rosenbllum, The Design and Implementation of a Log-structured File System, 1992.
Wu, eNVy: A Non-Volatile, Main Memory Storage System, San Jose, California, 1994.
Office Action, U.S. Appl. No. 11/952,101, Jan. 6, 2011.
Office Action, U.S. Appl. No. 12/098,434, Oct. 29, 2010.
CN Office Action, CN Application No. 200780050969.8, Nov. 11, 2010.
EP Office Action, EP Application No. 07865335.9, Nov. 18, 2010.
David Woodhouse, Red Hat, Inc., JFFS: The Journaling Flash File System, Linux Symposium Jul. 2001, http://sourceware.org/jffs2/jffs2.pdf, "visited" Jun. 11, 2010.
Kleiman, S.R., "Vnodes: An Architecture for Multiple File System Types in SUN UNIX", SUN, Jan. 1986.
Datadirect Networks, White Paper: S2A9550 Overview, DataDirect Networks, www.datadirectnet.com, 2007, 17 pages.
STMicroelectronics, "Bad Block Management in NAND Flash Memories," Application note AN-1819 by STMicroelectronics (Geneva, Switzerland), May 19, 2004.

* cited by examiner

APPARATUS, SYSTEM, AND METHOD FOR STORAGE SPACE RECOVERY AFTER REACHING A READ COUNT LIMIT

CROSS-REFERENCES TO RELATED APPLICATIONS

This application is a continuation-in-part of U.S. patent application Ser. No. 11/952,101 entitled Apparatus, System, and Method for Storage Space Recovery in Solid-State Storage for David Flynn, et al. which claims the benefit of U.S. Provisional Patent Application No. 60/873,111 entitled "Elemental Blade System" and filed on Dec. 6, 2006 for David Flynn, et al., and U.S. Provisional Patent Application No. 60/974,470 entitled "Apparatus, System, and Method for Object-Oriented Solid-State Storage" and filed on Sep. 22, 2007 for David Flynn, et al., and, which are all incorporated herein by reference. This application claims the benefit of Application 60/873,111 and Application 60/974,470.

FIELD OF THE INVENTION

This invention relates to solid-state storage and more particularly relates to recovery of storage space in solid-state storage with a read count limit.

BACKGROUND

Data storage devices are typically random access in that data accessed at a particular location can be modified and then put back in the same location. A data structure, file, or object may be divided and placed piecemeal in the data storage device in various locations where no data is stored or where data is marked invalid. While this method works well for devices such as a hard disk drive ("HDD"), using random access for solid-state storage can be inefficient and can cause premature failure.

Using random access for solid-state storage can be inefficient because typically writing data often takes much longer than reading data. For flash memory, which is a type of solid-state storage, changing a bit from a "zero" state ("zero") to a "one" state ("one") usually takes longer than changing a bit from a one to a zero. This is the case for typical flash memory that uses capacitors as cells where a zero equates to a discharged capacitor in a cell and a one equates to a charged capacitor in a cell. Typically, charging a capacitor takes longer than discharging a capacitor.

Using random access for solid-state storage can lead to premature failure of the solid-state storage because typically each cell in a solid-state storage device can only be written to a certain number of times before the cell begins to fail. Random access typically does not evenly distribute writing data over the solid-state storage so some regions or addresses are used much more than other areas. This overuse of some areas can lead to premature failure of all or a portion of a solid-state storage device.

One form of overuse occurs when a portion of storage is read numerous times. A phenomenon called "read disturb" can affect data when adjacent data is being read numerous times. The data lines and control lines shared between the data and the adjacent data can disturb the data when the adjacent data is accessed and can cause bit errors that can remain undetected until the data is read.

Typical solid-state storage devices recover un-used storage space much the same way as non-solid-state storage by treating the solid-state storage device as random access and marking unused storage space as available for reuse. This is problematic because the typical storage space recovery methods applied to solid-state storage suffers the inefficiencies and failure tendencies as described above.

SUMMARY OF THE INVENTION

From the foregoing discussion, it should be apparent that a need exists for an apparatus, system, and method that efficiently recover storage space and data in a solid-state storage device. Beneficially, such an apparatus, system, and method would autonomously recover storage space in a bank within a solid-state storage device while other read and write operations occur on other banks of the solid-state storage device. In addition, the apparatus, system, and method would determine if an area of storage has been accessed during read operations an excessive amount such that the area of storage being read becomes a candidate for recovery.

The present invention has been developed in response to the present state of the art, and in particular, in response to the problems and needs in the art that have not yet been fully solved by currently available storage space recovery methods. Accordingly, the present invention has been developed to provide an apparatus, system, and method for storage space recovery after reaching a read count limit that overcome many or all of the above-discussed shortcomings in the art.

The apparatus to recover storage space in solid-state storage is provided with a plurality of modules configured to functionally execute the necessary steps of sequentially storing data packets, selecting a storage division for recovery, reads valid data in the selected storage division and copies the valid data to the next available storage location, and marks the selected storage division available for recovery. These modules in the described embodiments include a read module, a read counter module, a storage division selection module, and a data recovery module.

The read module reads at least a portion of a data packet stored in a first storage division. The first storage division includes a portion of solid-state storage in a solid-state storage device. The read counter module increments a read counter in response to the read module reading data stored in the first storage division. The read counter corresponds to the first storage division, where the solid-state storage device includes multiple of storage divisions and each storage division includes a separate read counter. The read counter limit module determines if the read counter corresponding to the first storage division has reached a maximum read threshold.

The storage division selection module selects the first storage division for recovery in response to a read counter reaching the maximum read threshold. The read counter corresponds to the first storage division. In response to the storage division selection module selecting the first storage division for recovery, the data recovery module that reads valid data packets from the first storage division, stores the valid data packets in a second storage division in the solid-state storage device, and updates a logical index with a new physical address of the valid data. The logical index includes a mapping of physical addresses of data packets stored in the solid-state storage to logical identifiers corresponding to the data packets. These logical identifiers may be used by a host or client and may be in the form of a Logical Block Address ("LBA"), an Object Identifier ("OID"), an Address Range, an Address within a thinly provisioned logical or physical space, or the like.

In one embodiment, the apparatus includes a read counter preliminary limit module, a storage division read module, and a storage division error module. The a read counter preliminary limit module determines if the read counter corresponding to the first storage division has reached a preliminary read threshold. The storage division read module reads at least a portion of the data locations within the first storage division in response to the read counter preliminary limit module determining that the read counter corresponding to the first storage division has reached the preliminary read threshold. The storage division read module reads the data locations within the storage division to determine if errors exist in data stored in the storage division. The storage division error module determines if errors identified by the storage division read module have reached an error threshold. In the embodiment, the storage division selection module further selects the first storage division for recovery in response to the storage division error module determining that the number of errors identified by the storage division read module has reached the error threshold.

In one embodiment, in response to the read counter preliminary limit module determining that the read counter corresponding to the first storage division has reached the preliminary read threshold, the storage division error module also increases the preliminary read threshold by a predetermined amount. In another embodiment, in response to the read counter limit module determining that the read counter corresponding to the first storage division has reached a maximum read threshold, the data recovery module also resets the read counter corresponding to the first storage division.

In one embodiment, the apparatus includes a threshold adjustment module that adjusts at least the maximum read threshold. In one example, the threshold adjustment module adjusts at least the maximum read threshold based on amount of time that the solid-state storage device is in operation, number of retired storage divisions, number of retired logical storage divisions where a logical storage division includes a group of storage divisions, number of erase cycles, number of program operations, read count, operating temperature, and/or an environmental condition. In another example, the threshold adjustment module adjusts at least the maximum read threshold based on a number of times the storage division selection module selected a storage division for recovery as a result of a number of errors found in one or more of a storage division, a chip, a group of chips, a die, a group of die, and a logical storage division wherein the logical storage division comprises a group of storage divisions.

In another embodiment, the threshold adjustment module adjusts at least the maximum read threshold based on statistical data, parameters, heuristics, rules, and/or algorithms related to solid-state storage life expectancy and/or curve fitting data. In another embodiment, the threshold adjustment module adjusts at least the maximum read threshold based on information from a management system, the information including information derived from one or more of test data related to solid-state storage, operational data collected from solid-state storage in use, and data from a solid-state storage supplier.

In one embodiment, the threshold adjustment module adjusts at least the maximum read threshold based on a confidence factor, where the confidence factor includes a probability that data transmitted from the solid-state storage as a result of a read request will be error free. In another embodiment, the threshold adjustment module adjusts at least the maximum read threshold based on one or more of data resulting from testing of the solid-state storage comprising the storage division, manufacturer representative test data, and data dependent upon configuration of the solid-state storage.

In one embodiment, the apparatus includes an ECC module where the storage division selection module selects the first storage division for recovery in response to the ECC module reading one or more ECC blocks within the first storage block and determining that the one or more ECC blocks include a number of errors that exceeds one or more correction thresholds. In a further embodiment, the ECC module determines that the one or more ECC blocks exceeds the correction thresholds by one or more of determining a mean number of errors, determining a median number of errors, a distribution of errors, determining that at least one ECC block exceeds a correction threshold, and determining that one or more ECC blocks exceeds a first correction threshold and a total number of errors of the one or more ECC blocks exceeds a second correction threshold.

In one embodiment, the apparatus includes a sequential storage module that sequentially writes data packets in a storage division of the solid-state storage device. The data packets are stored sequentially on the solid-state storage device in an order that the data packets are received from one or more clients and from a storage division marked for recovery such that the sequentially stored data packets are stored contiguously within a storage division and include the data packets received from the one or more clients interspersed with the data packets received from a storage division marked for recovery. In another embodiment, the apparatus includes a storage division recovery determination module that determines if the first storage division is in a condition to be available for writing data packets in response to the data recovery module completing copying valid data from the first storage division.

In one example, the apparatus includes a storage division recovery module that marks the first storage division available for writing data packets in response to the data recovery module storing the valid data packets in a second storage division. In a related embodiment, a storage division is an erase block and the apparatus includes an erase module that erases an erase block selected for recovery prior to the storage division recovery module marking the erase block available for writing data packets. The erase module erases the erase block selected for recovery in response to the data recovery module copying valid data packets from the selected erase block. In another related embodiment, the apparatus includes a garbage marking module that identifies a data packet in a storage division as invalid in response to an operation indicating that the data packet is no longer valid.

In one case, the data packet in the storage division is a first data packet and an operation indicating that the first data packet is no longer valid includes writing a second data packet to the solid-state storage device where the second data packet indicates that the first data packet is invalid. In another case, an operation indicating that the data packet is no longer valid includes a delete operation or a read-modify-write operation. The delete operation signifies that the data packet is to be deleted and the read-modify-write operation includes reading the data packet, modifying the data packet, and writing the modified data packet to another location in the solid-state storage device. In another embodiment, identifying a data packet as invalid includes modifying an entry in the logical index to indicate that the data packet is invalid. In yet another embodiment, one or more of the storage division selection module, the data recovery module, and the storage division recovery determination module operate autonomously from the read module, the read counter module, and the read counter limit module.

In one embodiment, the storage division selection module selects a storage division for recovery by identifying a storage division with a low amount of wear. In a related embodiment, identifying a storage division with a low amount of wear includes identifying a storage division with one or more of a low number of erase cycles, a low read count, and a low bit error rate.

In one embodiment, the storage division selection module selects a storage division for recovery by identifying a storage division with a high amount of wear. In a related embodiment, identifying a storage division with a high amount of wear includes one or more of identifying a storage division with one or more of a high number of erase cycles, a high read count, a high bit error rate, a high bit error rate with a low read count, and a non-recoverable error-correcting code ("ECC") block. In another related embodiment, the storage division recovery module marks the storage division selected for recovery as unavailable for storing data.

In one embodiment, the storage division selection module selects a storage division for recovery by identifying a storage division with a high amount of invalid data. In another embodiment, the storage division selection module selects a storage division for recovery by identifying a storage division using a combination of two or more of a program count, erase cycle count, read count, bit error rate, amount of invalid data, erase cycles, and a non-recoverable ECC block. In another embodiment, the solid-state storage is arranged in an array of storage elements and a storage division comprises a virtual storage division that includes a storage division within each storage element in a row of storage elements accessed together.

A system of the present invention is also presented to recover storage space after reaching a read count limit. The system may be embodied by a solid-state storage device with a solid-state storage and a solid-state storage controller. The solid-state storage includes one or more storage divisions, where each storage division includes a portion of the solid-state storage. In particular, the solid-state storage controller includes a read module, a read counter module, a read counter limit module, a storage division selection module, and a data recovery module, which are substantially similar to those described above.

A method of the present invention is also presented for recovering storage space after reaching a read count limit. The method in the disclosed embodiments substantially includes the steps necessary to carry out the functions presented above with respect to the operation of the described apparatus and system. In one embodiment, the method includes reading at least a portion of a data packet stored in a first storage division. The first storage division includes a portion of solid-state storage in a solid-state storage device. The method includes incrementing a read counter in response to reading data stored in the first storage division. The read counter corresponds to the first storage division. The solid-state storage device includes multiple storage divisions and each storage division has a separate read counter.

The method includes determining if the read counter corresponding to the first storage division has reached a maximum read threshold. The method includes selecting the first storage division for recovery in response to a read counter reaching the maximum read threshold where the read counter corresponds to the first storage division. The method includes, in response to selecting the first storage division for recovery, reading valid data packets from the first storage division, storing the valid data packets in a second storage division in the solid-state storage device, and updating a logical index with a new physical address of the valid data. The logical index includes a mapping of physical addresses of data packets stored in the solid-state storage to logical identifiers corresponding to the data packets.

In one embodiment, the method includes determining if the read counter corresponding to the storage division has reached a preliminary read threshold and reading at least a portion of the data locations within the first storage division in response to determining that the read counter corresponding to the first storage division has reached the preliminary read threshold, where the method reads the data locations within the storage division to determine if errors exist in data stored in the storage division. The method includes determining if a number of identified errors has reached an error threshold, and selecting the first storage division for recovery in response to determining that the number of identified errors has reached the error threshold.

In another embodiment, the method includes sequentially writing data packets in a storage division of the solid-state storage device. The data packets are stored sequentially on the solid-state storage device in an order that the data packets are received from one or more clients and from a storage division marked for recovery such that the sequentially stored data packets are stored contiguously within a storage division and comprise the data packets received from the one or more clients interspersed with the data packets received from a storage division marked for recovery. In another embodiment, the method includes marking the first storage division available for writing data packets in response to storing the valid data packets on a second storage division. In a related embodiment, a storage division is an erase block and the method includes erasing an erase block selected for recovery prior to marking the erase block available for writing data packets, wherein the erase block is erased in response to copying valid data packets from the selected erase block.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Figure 1A:
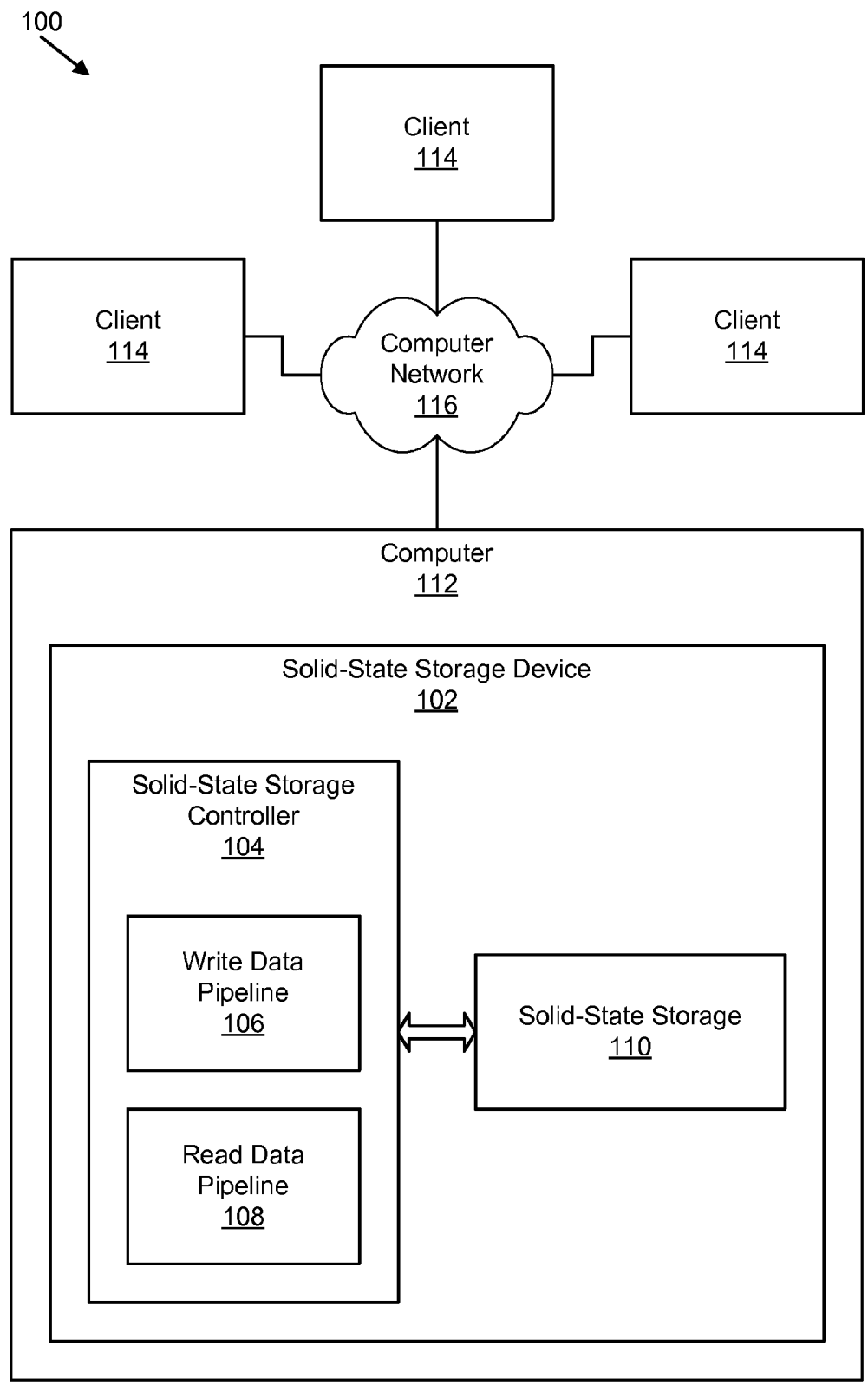
FIG. 1A is a schematic block diagram illustrating one embodiment of a system for data management in a solid-state storage device in accordance with the present invention.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the software portions are stored on one or more computer readable media.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Reference to a signal bearing medium may take any form capable of generating a signal, causing a signal to be generated, or causing execution of a program of machine-readable instructions on a digital processing apparatus. A signal bearing medium may be embodied by a transmission line, a compact disk, digital-video disk, a magnetic tape, a Bernoulli drive, a magnetic disk, a punch card, flash memory, integrated circuits, or other digital processing apparatus memory device.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Solid-State Storage System FIG. 1A is a schematic block diagram illustrating one embodiment of a system 100 for data management in a solid-state storage device in accordance with the present invention. The system 100 includes a solid-state storage device 102, a solid-state storage controller 104, a write data pipeline 106, a read data pipeline 108, a solid-state storage 110, a computer 112, a client 114, and a computer network 116, which are described below.

The system 100 includes at least one solid-state storage device 102. In another embodiment, the system 100 includes two or more solid-state storage devices 102. Each solid-state storage device 102 may include non-volatile, solid-state storage 110, such as flash memory, nano random access memory ("nano RAM or NRAM"), magneto-resistive RAM ("MRAM"), dynamic RAM ("DRAM"), phase change RAM ("PRAM"), etc. The solid-state storage device 102 is described in more detail with respect to FIGS. 2 and 3. The solid-state storage device 102 is depicted in a computer 112 connected to a client 114 through a computer network 116. In one embodiment, the solid-state storage device 102 is internal to the computer 112 and is connected using a system bus, such as a peripheral component interconnect express ("PCI-e") bus, a Serial Advanced Technology Attachment ("serial ATA") bus, or the like. In another embodiment, the solid-state storage device 102 is external to the computer 112 and is connected, a universal serial bus ("USB") connection, an Institute of Electrical and Electronics Engineers ("IEEE") 1394 bus ("FireWire"), or the like. In other embodiments, the solid-state storage device 102 is connected to the computer 112 using a peripheral component interconnect ("PCI") express bus using external electrical or optical bus extension or bus networking solution such as Infiniband or PCI Express Advanced Switching ("PCIe-AS"), or the like.

In various embodiments, the solid-state storage device 102 may be in the form of a dual-inline memory module ("DIMM"), a daughter card, or a micro-module. In another embodiment, the solid-state storage device 102 is an element within a rack-mounted blade. In another embodiment, the solid state storage device 102 is contained within a package that is integrated directly onto a higher level assembly (e.g. mother board, lap top, graphics processor). In another embodiment, individual components comprising the solid-state storage device 102 are integrated directly onto a higher level assembly without intermediate packaging.

The solid-state storage device 102 includes one or more solid-state storage controllers 104, each may include a write data pipeline 106 and a read data pipeline 108 and each includes a solid-state storage 110, which are described in more detail below with respect to FIGS. 2 and 3.

The system 100 includes one or more computers 112 connected to the solid-state storage device 102. A computer 112 may be a host, a server, a storage controller of a storage area network ("SAN"), a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. In another embodiment, a computer 112 may be a client and the solid-state storage device 102 operates autonomously to service data requests sent from the computer 112. In this embodiment, the computer 112 and solid-state storage device 102 may be connected using a computer network, system bus, or other communication means suitable for connection between a computer 112 and an autonomous solid-state storage device 102.

In one embodiment, the system 100 includes one or more clients 114 connected to one or more computer 112 through one or more computer networks 116. A client 114 may be a host, a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. The computer network 116 may include the Internet, a wide area network ("WAN"), a metropolitan area network ("MAN"), a local area network ("LAN"), a token ring, a wireless network, a fiber channel network, a SAN, network attached storage ("NAS"), ESCON, or the like, or any combination of networks. The computer network 116 may also include a network from the IEEE 802 family of network technologies, such Ethernet, token ring, WiFi, WiMax, and the like.

The computer network 116 may include servers, switches, routers, cabling, radios, and other equipment used to facilitate networking computers 112 and clients 114. In one embodiment, the system 100 includes multiple computers 112 that communicate as peers over a computer network 116. In another embodiment, the system 100 includes multiple solid-state storage devices 102 that communicate as peers over a computer network 116. One of skill in the art will recognize other computer networks 116 comprising one or more computer networks 116 and related equipment with single or redundant connection between one or more clients 114 or other computer with one or more solid-state storage devices 102 or one or more solid-state storage devices 102 connected to one or more computers 112. In one embodiment, the system 100 includes two or more solid-state storage devices 102 connected through the computer network 118 to a client 116 without a computer 112.

Storage Controller-Managed Objects

Figure 1B:
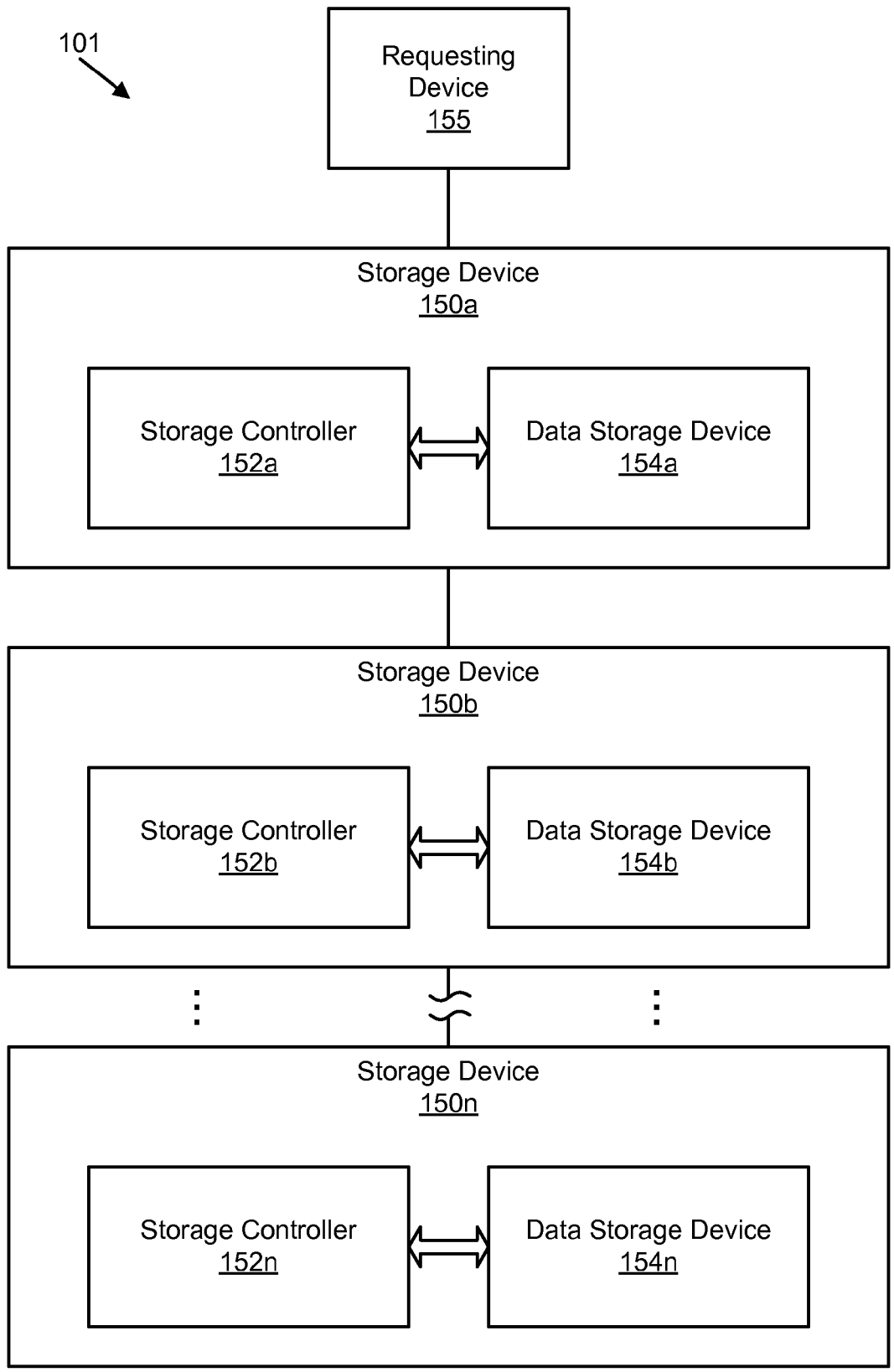
FIG. 1B is a schematic block diagram illustrating one embodiment of a system for object management in a storage device in accordance with the present invention.

FIG. 1B is a schematic block diagram illustrating one embodiment of a system 101 for object management in a storage device in accordance with the present invention. The system 101 includes one or more storage device 150, each with a storage controller 152 and one or more data storage devices 154, and one or more requesting devices 155. The storage devices 152 are networked together and coupled to one or more requesting devices 155. The requesting device 155 sends object requests to a storage device 150a. An object request may be a request to create an object, a request to write data to an object, a request to read data from an object, a request to delete an object, a request to checkpoint an object, a request to copy an object, and the like. One of skill in the art will recognize other object requests.

In one embodiment, the storage controller 152 and data storage device 154 are separate devices. In another embodiment, the storage controller 152 and data storage device 154 are integrated into one storage device 150. In another embodiment, a data storage device 154 is a solid-state storage 110 and the storage controller is a solid-state storage device controller 202. In other embodiments, a data storage device 154 may be a hard disk drive, an optical drive, tape storage, or the like. In another embodiment, a storage device 150 may include two or more data storage devices 154 of different types.

In one embodiment, the data storage device 154 is a solid-state storage 110 and is arranged as an array of solid-state storage elements 216, 218, 220. In another embodiment, the solid-state storage 110 is arranged in two or more banks 214a-n. Solid-state storage 110 is described in more detail below with respect to FIG. 2B.

The storage devices 150a-n may be networked together and act as a distributed storage device. The storage device 150a coupled to the requesting device 155 controls object requests to the distributed storage device. In one embodiment, the storage devices 150 and associated storage controllers 152 manage objects and appear to the requesting device(s) 155 as a distributed object file system. In this context, a parallel object file system is an example of a type of distributed object file system. In another embodiment, the storage devices 150 and associated storage controllers 152 manage objects and appear to the requesting device 155(s) as distributed object file servers. In this context, a parallel object file server is an example of a type of distributed object file server. In these and other embodiments the requesting device 155 may exclusively manage objects or participate in managing objects in conjunction with storage devices 150; this typically does not limit the ability of storage devices 150 to fully manage objects for other clients 114. In the degenerate case, each distributed storage device, distributed object file system and distributed object file server can operate independently as a single device. The networked storage devices 150a-n may operate as distributed storage devices, distributed object file systems, distributed object file servers, and any combination thereof having images of one or more of these capabilities configured for one or more requesting devices 155. Fore example, the storage devices 150 may be configured to operate as distributed storage devices for a first requesting device 155a, while operating as distributed storage devices and distributed object file systems for requesting devices 155b. Where the system 101 includes one storage device 150a, the storage controller 152a of the storage device 150a manages objects may appear to the requesting device(s) 155 as an object file system or an object file server.

In one embodiment where the storage devices 150 are networked together as a distributed storage device, the storage devices 150 serve as a redundant array of independent drives ("RAID") managed by one or more distributed storage controllers 152. For example, a request to write a data segment of an object results in the data segment being stripped across the data storage devices 154a-n with a parity stripe, depending upon the RAID level. One benefit of such an arrangement is that such an object management system may continue to be available when a single storage device 150 has a failure, whether of the storage controller 152, the data storage device 154, or other components of storage device 150.

When redundant networks are used to interconnect the storage devices 150 and requesting devices 155, the object management system may continue to be available in the presence of network failures as long as one of the networks remains operational. A system 101 with a single storage device 150a may also include multiple data storage devices 154a and the storage controller 152a of the storage device 150a may act as a RAID controller and stripe the data segment across the data storage devices 154a of the storage device 150a and may include a parity stripe, depending upon the RAID level.

In one embodiment, where the one or more storage devices 150a-n are solid-state storage devices 102 with a solid-state storage device controller 202 and solid-state storage 110, the solid-state storage device(s) 102 may be configured in a DIMM configuration, daughter card, micro-module, etc. and reside in a computer 112. The computer 112 may be a server or similar device with the solid-state storage devices 102 networked together and acting as distributed RAID controllers. Beneficially, the storage devices 102 may be connected using PCI-e, PCIe-AS, Infiniband or other high-performance bus, switched bus, networked bus, or network and may provide a very compact, high performance RAID storage system with single or distributed solid-state storage controllers 202 autonomously striping a data segment across solid-state storage 110a-n.

In one embodiment, the same network used by the requesting device 155 to communicate with storage devices 150 may be used by the peer storage device 150a to communicate with peer storage devices 150b-n to accomplish RAID functionality. In another embodiment, a separate network may be used between the storage devices 150 for the purpose of RAIDing. In another embodiment, the requesting devices 155 may participate in the RAIDing process by sending redundant requests to the storage devices 150. For example, requesting device 155 may send a first object write request to a first storage device 150a and a second object write request with the same data segment to a second storage device 150b to achieve simple mirroring.

With the ability for object handling within the storage device(s) 102, the storage controller(s) 152 uniquely have the ability to store one data segment or object using one RAID level while another data segment or object is stored using a different RAID level or without RAID striping. These multiple RAID groupings may be associated with multiple partitions within the storage devices 150. RAID 0, RAID 1, RAID5, RAID6 and composite RAID types 10, 50, 60, can be supported simultaneously across a variety of RAID groups comprising data storage devices 154a-n. One skilled in the art will recognize other RAID types and configurations that may also be simultaneously supported.

Also, because the storage controller(s) 152 operate autonomously as RAID controllers, the RAID controllers can perform progressive RAIDing and can transform objects or portions of objects striped across data storage devices 154 with one RAID level to another RAID level without the requesting device 155 being affected, participating or even detecting the change in RAID levels. In the preferred embodiment, progressing the RAID configuration from one level to another level may be accomplished autonomously on an object or even a packet bases and is initiated by a distributed RAID control module operating in one of the storage devices 150 or the storage controllers 152. Typically, RAID progression will be from a higher performance and lower efficiency storage configuration such as RAID1 to a lower performance and higher storage efficiency configuration such as RAID5 where the transformation is dynamically initiated based on the frequency of access. But, one can see that progressing the configuration from RAID5 to RAID1 is also possible. Other processes for initiating RAID progression may be configured or requested from clients or external agents such a storage system management server request. One of skill in the art will recognize other features and benefits of a storage device 102 with a storage controller 152 that autonomously manages objects.

Apparatus for Storage Controller-Managed Objects

Figure 2A:
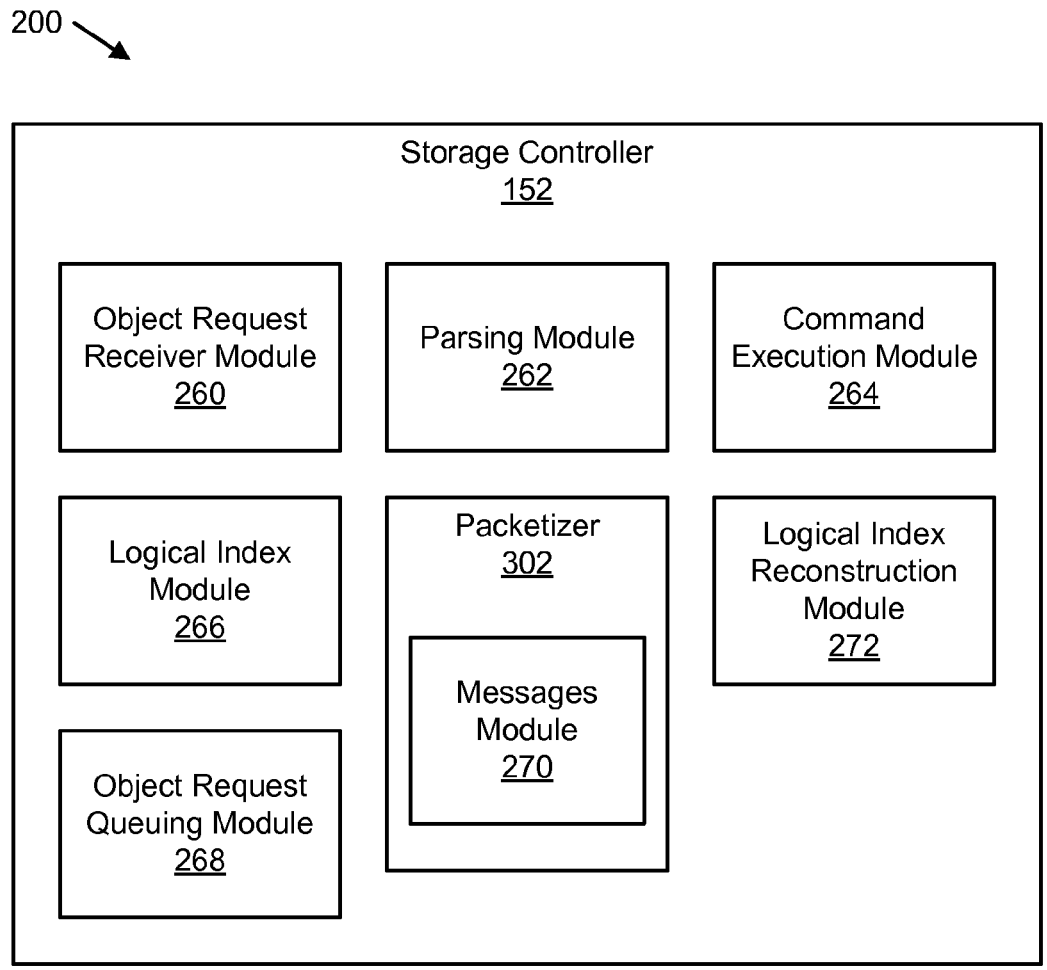
FIG. 2A is a schematic block diagram illustrating one embodiment of an apparatus for object management in a storage device in accordance with the present invention.

FIG. 2A is a schematic block diagram illustrating one embodiment of an apparatus 200 for object management in a storage device in accordance with the present invention. The apparatus 200 includes a storage controller 152 with an object request receiver module 260, a parsing module 262, a command execution module 264, an logical index module 266, an object request queuing module 268, a packetizer 302 with a messages module 270, and an logical index reconstruction module 272, which are described below.

The storage controller 152 is substantially similar to the storage controller 152 described in relation to the system 102 of FIG. 1B and may be a solid-state storage device controller 202 described in relation to FIG. 2. The apparatus 200 includes an object request receiver module 260 that receives an object request from one or more requesting devices 155. For example, for a store object data request, the storage controller 152 stores the data segment as a data packet in a data storage device 154 coupled to the storage controller 152. The object request is typically directed at a data segment stored or to be stored in one or more object data packets for an object managed by the storage controller. The object request may request that the storage controller 152 create an object to be later filled with data through later object request which may utilize a local or remote direct memory access ("DMA," "RDMA") transfer.

Hereinafter, a data packet may refer to data stored as one or more logical blocks, physical blocks, arbitrarily sized constant or variable storage units, each with or without associated metadata, and index metadata. The data may come from a data structure, a file, an object, or other data construct used by a host or client 114. Hereinafter a data structure, a file, an object, or other data construct is typically referred to as an "object." Typically this "object" is identified by the host or client 114 using a logical identifier. Typically, a logical index is used to associate the logical identifier with the one or more physical address where the one or more packets of the data are stored.

In one embodiment, the object request is a write request to write all or part of an object to a previously created object. In one example, the write request is for a data segment of an object. The other data segments of the object may be written to the storage device 150 or to other storage devices 152. In another example, the write request is for an entire object. In another example, the object request is to read data from a data segment managed by the storage controller 152. In yet another embodiment, the object request is a delete request to delete a data segment or object.

Advantageously, the storage controller 152 can accept write requests that do more than write a new object or append data to an existing object. For example, a write request received by the object request receiver module 260 may include a request to add data ahead of data stored by the storage controller 152, to insert data into the stored data, or to replace a segment of data. The logical index maintained by the storage controller 152 provides the flexibility required for these complex write operations that is not available in other storage controllers, but is currently available only outside of storage controllers in file systems of servers and other computers.

The apparatus 200 includes a parsing module 262 that parses the object request into one or more commands. Typically, the parsing module 262 parses the object request into one or more buffers. For example, one or more commands in the object request may be parsed into a command buffer. Typically the parsing module 262 prepares an object request so that the information in the object request can be understood and executed by the storage controller 152. One of skill in the art will recognize other functions of a parsing module 262 that parses an object request into one or more commands.

The apparatus 200 includes a command execution module 264 that executes the command(s) parsed from the object request. In one embodiment, the command execution module 264 executes one command. In another embodiment, the command execution module 264 executes multiple commands. Typically, the command execution module 264 interprets a command parsed from the object request, such as a write command, and then creates, queues, and executes subcommands. For example, a write command parsed from an object request may direct the storage controller 152 to store multiple data segments. The object request may also include required attributes such as encryption, compression, etc. The command execution module 264 may direct the storage controller 152 to compress the data segments, encrypt the data segments, create one or more data packets and associated headers for each data packet, encrypt the data packets with a media encryption key, add error correcting code, and store the data packets a specific location. Storing the data packets at a specific location and other subcommands may also be broken down into other lower level subcommands. One of skill in the art will recognize other ways that the command execution module 264 can execute one or more commands parsed from an object request.

The apparatus 200 includes an logical index module 266 that creates an object entry in an logical index in response to the storage controller 152 creating an object or storing the data segment of the object. Typically, the storage controller 152 creates a data packet from the data segment and the location of where the data packet is stored is assigned at the time the data segment is stored. Object metadata received with a data segment or as part of an object request may be stored in a similar way.

The logical index module 266 creates an object entry into an logical index at the time the data packet is stored and the physical address of the data packet is assigned. The object entry includes a mapping between a logical identifier of the object and one or more physical addresses corresponding to where the storage controller 152 stored one or more data packets and any object metadata packets. In another embodiment, the entry in the logical index is created before the data packets of the object are stored. For example, if the storage controller 152 determines a physical address of where the data packets are to be stored earlier, the logical index module 266 may create the entry in the logical index earlier.

Typically, when an object request or group of object requests results in an object or data segment being modified, possibly during a read-modify-write operation, the logical index module 266 updates an entry in the logical index corresponding the modified object. In one embodiment, the logical index creates a new object and a new entry in the logical index for the modified object. Typically, where only a portion of an object is modified, the object includes modified data packets and some data packets that remain unchanged. In this case, the new entry includes a mapping to the unchanged data packets as where they were originally written and to the modified objects written to a new location.

In another embodiment, where the object request receiver module 260 receives an object request that includes a command that erases a data block or other object elements, the storage controller 152 may store at least one packet such as an erase packet that includes information including a reference to the object, relationship to the object, and the size of the data block erased. Additionally, it may further indicate that the erased object elements are filled with zeros. Thus, the erase object request can be used to emulate actual memory or storage that is erased and actually has a portion of the appropriate memory/storage actually stored with zeros in the cells of the memory/storage.

Beneficially, creating an logical index with entries indicating mapping between data segments and metadata of an object allows the storage controller 152 to autonomously handle and manage objects. This capability allows a great amount of flexibility for storing data in the storage device 150. Once the index entry for the object is created, subsequent object requests regarding the object can be serviced efficiently by the storage controller 152.

In one embodiment, the storage controller 152 includes an object request queuing module that queues one or more object requests received by the object request receiver module 260 prior to parsing by the parsing module 262. The object request queuing module 268 allows flexibility between when an object request is received and when it is executed.

In another embodiment, the storage controller 152 includes a packetizer 302 that creates one or more data packets from the one or more data segments where the data packets are sized for storage in the data storage device 154. The packetizer 302 is described below in more detail with respect to FIG. 3. The packetizer 302 includes, in one embodiment, a messages module 270 that creates a header for each packet. The header includes a packet identifier and a packet length. The packet identifier relates the packet to the object for which the packet was formed.

In one embodiment, each packet includes a packet identifier that is self-contained in that the packet identifier contains adequate information to identify the object and relationship within the object of the object elements contained within the packet. However, a more efficient preferred embodiment is to store packets in containers.

A container is a data construct that facilitates more efficient storage of packets and helps establish relationships between an object and data packets, metadata packets, and other packets related to the object that are stored within the container. Note that the storage controller 152 typically treats object metadata received as part of an object and data segments in a similar manner. Typically "packet" may refer to a data packet comprising data, a metadata packet comprising metadata, or another packet of another packet type. An object may be stored in one or more containers and a container typically includes packets for no more than one unique object. An object may be distributed between multiple containers. Typically a container is stored within a single logical erase block (storage division) and is typically never split between logical erase blocks.

A container, in one example, may be split between two or more logical/virtual pages. A container is identified by a container label that associates that container with an object. A container may contain zero to many packets and the packets within a container are typically from one object. A packet may be of many object element types, including object attribute elements, object data elements, logical index elements, and the like. Hybrid packets may be created that include more than one object element type. Each packet may contain zero to many elements of the same element type. Each packet within a container typically contains a unique identifier that identifies the relationship to the object.

Each packet is associated with one container. In a preferred embodiment, containers are limited to an erase block so that at or near the beginning of each erase block a container packet can be found. This helps limit data loss to an erase block with a corrupted packet header. In this embodiment, if the logical index is unavailable and a packet header within the erase block is corrupted, the contents from the corrupted packet header to the end of the erase block may be lost because there is possibly no reliable mechanism to determine the location of subsequent packets. In another embodiment, a more reliable approach is to have a container limited to a page boundary. This embodiment requires more header overhead. In another embodiment, containers can flow across page and erase block boundaries. This requires less header overhead but a larger portion of data may be lost if a packet header is corrupted. For these several embodiments it is expected that some type of RAID is used to further ensure data integrity.

In one embodiment, the apparatus 200 includes a logical index reconstruction module 272 that reconstructs the entries in the logical index using information from packet headers stored in the data storage device 154. In one embodiment, the logical index reconstruction module 272 reconstructs the entries of the logical index by reading headers to determine the object to which each packet belongs and sequence information to determine where in the object the data or metadata belongs. The logical index reconstruction module 272 uses physical address information for each packet and timestamp or sequence information to create a mapping between the physical locations of the packets and the object identifier and data segment sequence. Timestamp or sequence information is used by the logical index reconstruction module 272 to replay the sequence of changes made to the index and thereby typically reestablish the most recent state.

In another embodiment, the logical index reconstruction module 272 locates packets using packet header information along with container packet information to identify physical locations of the packets, object identifier, and sequence number of each packet to reconstruct entries in the logical index. In one embodiment, erase blocks are time stamped or given a sequence number as packets are written and the timestamp or sequence information of an erase block is used along with information gathered from container headers and packet headers to reconstruct the logical index. In another embodiment, timestamp or sequence information is written to an erase block when the erase block is recovered.

Where the logical index is stored in volatile memory, an error, loss of power, or other problem causing the storage controller 152 to shut down without saving the logical index could be a problem if the logical index cannot be reconstructed. The logical index reconstruction module 272 allows the logical index to be stored in volatile memory allowing the advantages of volatile memory, such as fast access. The logical index reconstruction module 272 allows quick reconstruction of the logical index autonomously without dependence on a device external to the storage device 150.

In one embodiment, the logical index in volatile memory is stored periodically in a data storage device 154. In a particular example, the logical index, or "index metadata," is stored periodically in a solid-state storage 110. In another embodiment, the index metadata is stored in a solid-state storage 110n separate from solid-state storage 110a-110n-1 storing packets. The index metadata is managed independently from data and object metadata transmitted from a requesting device 155 and managed by the storage controller 152/solid-state storage device controller 202. Managing and storing index metadata separate from other data and metadata from an object allows efficient data flow without the storage controller 152/solid-state storage device controller 202 unnecessarily processing object metadata.

In one embodiment, where an object request received by the object request receiver module 260 includes a write request, the storage controller 152 receives one or more data segments of an object from memory of a requesting device 155 as a local or remote direct memory access ("DMA," "RDMA") operation. In a preferred example, the storage controller 152 pulls data from the memory of the requesting device 155 in one or more DMA or RDMA operations. In another example, the requesting device 155 pushes the data segment(s) to the storage controller 152 in one or more DMA or RDMA operations. In another embodiment, where the object request includes a read request, the storage controller 152 transmits one or more data segments of an object to the memory of the requesting device 155 in one or more DMA or RDMA operations. In a preferred example, the storage controller 152 pushes data to the memory of the requesting device 155 in one or more DMA or RDMA operations. In another example, the requesting device 155 pulls data from the storage controller 152 in one or more DMA or RDMA operations. In another example, the controller 152 pulls object command request sets from the memory of the requesting device 155 in one or more DMA or RDMA operations. In another example, the requesting device 155 pushes object command request sets to the storage controller 152 in one or more DMA or RDMA operations.

In one embodiment, the storage controller 152 emulates block storage and an object communicated between the requesting device 155 and the storage controller 152 comprises one or more data blocks. In one embodiment, the requesting device 155 includes a driver so that the storage device 150 appears as a block storage device. For example, the requesting device 152 may send a block of data of a certain size along with a physical address of where the requesting device 155 wants the data block stored. The storage controller 152 receives the data block and uses the physical block address transmitted with the data block or a transformation of the physical block address as an object identifier. The storage controller 152 then stores the data block as an object or data segment of an object by packetizing the data block and storing the data block at will. The logical index module 266 then creates an entry in the logical index using the physical block-based object identifier and the actual physical location where the storage controller 152 stored the data packets comprising the data from the data block.

In another embodiment, the storage controller 152 emulates block storage by accepting block objects. A block object may include one or more data blocks in a block structure. In one embodiment, the storage controller 152 treats the block object as any other object. In another embodiment, an object may represent an entire block device, partition of a block device, or some other logical or physical sub-element of a block device including a track, sector, channel, and the like. Of particular note is the ability to remap a block device RAID group to an object supporting a different RAID construction such as progressive RAID. One skilled in the art will recognize other mappings of traditional or future block devices to objects.

Solid-State Storage Device

Figure 2B:
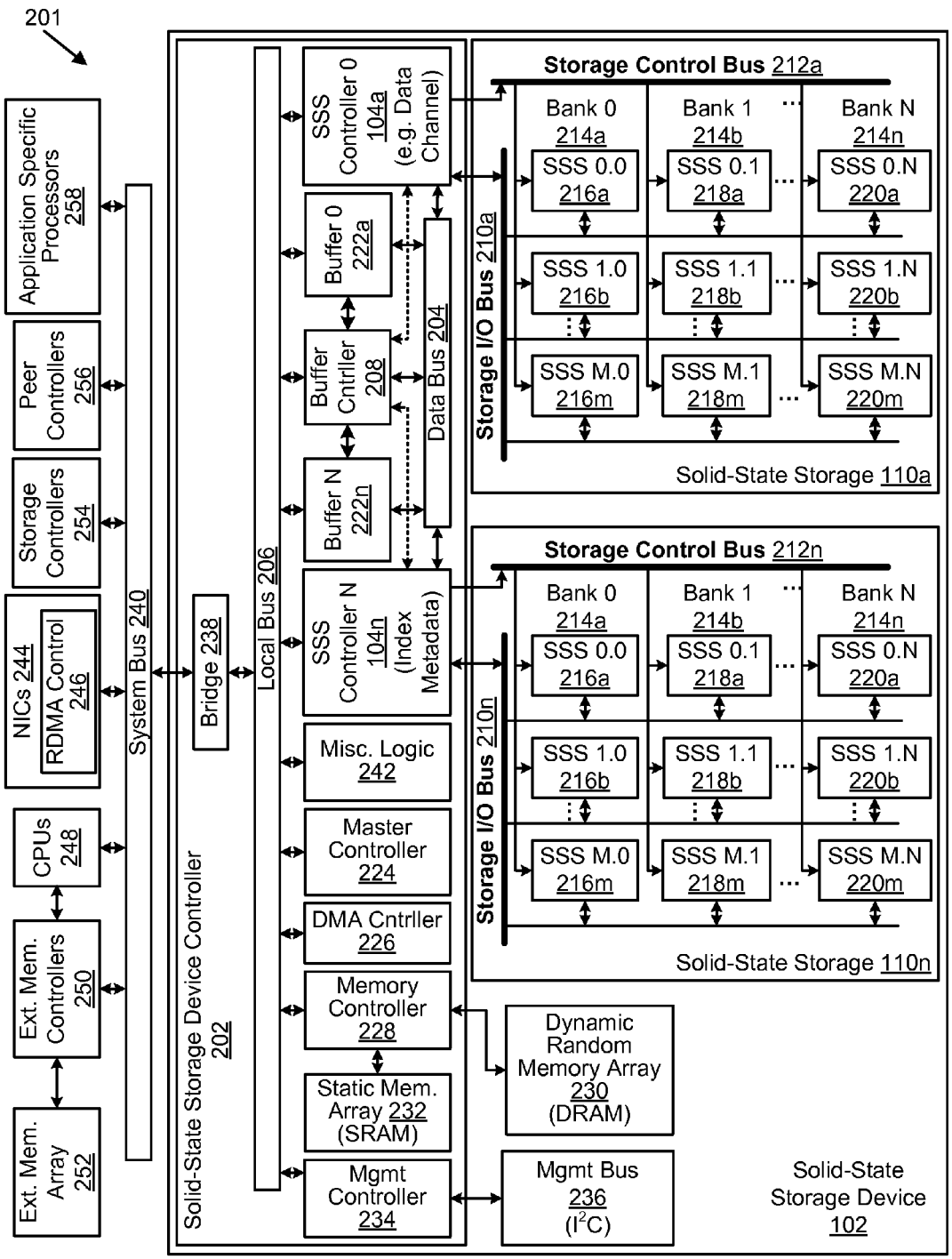
FIG. 2B is a schematic block diagram illustrating one embodiment of a solid-state storage device controller in a solid-state storage device in accordance with the present invention.

FIG. 2B is a schematic block diagram illustrating one embodiment 201 of a solid-state storage device controller 202 that includes a write data pipeline 106 and a read data pipeline 108 in a solid-state storage device 102 in accordance with the present invention. The solid-state storage device controller 202 may include a number of solid-state storage controllers 0-N 104a-n, each controlling solid-state storage 110. In the depicted embodiment, two solid-state controllers are shown: solid-state controller 0 104a and solid-state storage controller N 104n, and each controls solid-state storage 110a-n. In the depicted embodiment, solid-state storage controller 0 104a controls a data channel so that the attached solid-state storage 110a stores data. Solid-state storage controller N 104n controls an index metadata channel associated with the stored data and the associated solid-state storage 110n stores index metadata. In an alternate embodiment, the solid-state storage device controller 202 includes a single solid-state controller 104a with a single solid-state storage 110a. In another embodiment, there are a plurality of solid-state storage controllers 104a-n and associated solid-state storage 110a-n. In one embodiment, one or more solid state controllers 104a-104n-1, coupled to their associated solid-state storage 110a-110n-1, control data while at least one solid-state storage controller 104n, coupled to its associated solid-state storage 110n, controls index metadata.

In one embodiment, at least one solid-state controller 104 is field-programmable gate array ("FPGA") and controller functions are programmed into the FPGA. In a particular embodiment, the FPGA is a Xilinx® FPGA. In another embodiment, the solid-state storage controller 104 comprises components specifically designed as a solid-state storage controller 104, such as an application-specific integrated circuit ("ASIC") or custom logic solution. Each solid-state storage controller 104 typically includes a write data pipeline 106 and a read data pipeline 108, which are describe further in relation to FIG. 3. In another embodiment, at least one solid-state storage controller 104 is made up of a combination FPGA, ASIC, and custom logic components.

Solid-State Storage

The solid state storage 110 is an array of non-volatile solid-state storage elements 216, 218, 220, arranged in banks 214, and accessed in parallel through a bi-directional storage input/output ("I/O") bus 210. The storage I/O bus 210, in one embodiment, is capable of unidirectional communication at any one time. For example, when data is being written to the solid-state storage 110, data cannot be read from the solid-state storage 110. In another embodiment, data can flow both directions simultaneously. However bi-directional, as used herein with respect to a data bus, refers to a data pathway that can have data flowing in only one direction at a time, but when data flowing one direction on the bi-directional data bus is stopped, data can flow in the opposite direction on the bi-directional data bus.

A solid-state storage element (e.g. SSS 0.0 216a) is typically configured as a chip (a package of one or more dies) or a die on a circuit board. As depicted, a solid-state storage element (e.g. 216a) operates independently or semi-independently of other solid-state storage elements (e.g. 218a) even if these several elements are packaged together in a chip package, a stack of chip packages, or some other package element. As depicted, a column of solid-state storage elements 216, 218, 220 is designated as a bank 214. As depicted, there may be "n" banks 214a-n and "m" solid-state storage elements 216a-m, 218a-m, 220a-m per bank in an array of n×m solid-state storage elements 216, 218, 220 in a solid-state storage 110. In one embodiment, a solid-state storage 110a includes twenty solid-state storage elements 216, 218, 220 per bank 214 with eight banks 214 and a solid-state storage 110n includes 2 solid-state storage elements 216, 218 per bank 214 with one bank 214. In one embodiment, each solid-state storage element 216, 218, 220 is comprised of a single-level cell ("SLC") devices. In another embodiment, each solid-state storage element 216, 218, 220 is comprised of multi-level cell ("MLC") devices.

In one embodiment, solid-state storage elements for multiple banks that share a common storage I/O bus 210a row (e.g. 216b, 218b, 220b) are packaged together. In one embodiment, a solid-state storage element 216, 218, 220 may have one or more dies per chip with one or more chips stacked vertically and each die may be accessed independently. In another embodiment, a solid-state storage element (e.g. SSS 0.0 216a) may have one or more virtual dies per die and one or more dies per chip and one or more chips stacked vertically and each virtual die may be accessed independently. In another embodiment, a solid-state storage element SSS 0.0 216a may have one or more virtual dies per die and one or more dies per chip with some or all of the one or more dies stacked vertically and each virtual die may be accessed independently.

In one embodiment, two dies are stacked vertically with four stacks per group to form eight storage elements (e.g. SSS 0.0-SSS 0.8) 216a-220a, each in a separate bank 214a-n. In another embodiment, 20 storage elements (e.g. SSS 0.0-SSS 20.0) 216 form a virtual bank 214a so that each of the eight virtual banks has 20 storage elements (e.g. SSS0.0-SSS 20.8) 216, 218, 220. Data is sent to the solid-state storage 110 over the storage I/O bus 210 to all storage elements of a particular group of storage elements (SSS 0.0-SSS 0.8) 216a, 218a, 220a. The storage control bus 212a is used to select a particular bank (e.g. Bank-0 214a) so that the data received over the storage I/O bus 210 connected to all banks 214 is written just to the selected bank 214a.

In a preferred embodiment, the storage I/O bus 210 is comprised of one or more independent I/O buses ("IIOBa-m" comprising 210a.a-m, 210n.a-m) wherein the solid-state storage elements within each row share one of the independent I/O buses accesses each solid-state storage element 216, 218, 220 in parallel so that all banks 214 are accessed simultaneously. For example, one channel of the storage I/O bus 210 may access a first solid-state storage element 216a, 218a, 220a of each bank 214a-n simultaneously. A second channel of the storage I/O bus 210 may access a second solid-state storage element 216b, 218b, 220b of each bank 214a-n simultaneously. Each row of solid-state storage element 216, 218, 220 is accessed simultaneously. In one embodiment, where solid-state storage elements 216, 218, 220 are multi-level (physically stacked), all physical levels of the solid-state storage elements 216, 218, 220 are accessed simultaneously. As used herein, "simultaneously" also includes near simultaneous access where devices are accessed at slightly different intervals to avoid switching noise. Simultaneously is used in this context to be distinguished from a sequential or serial access wherein commands and/or data are sent individually one after the other.

Typically, banks 214a-n are independently selected using the storage control bus 212. In one embodiment, a bank 214 is selected using a chip enable or chip select. Where both chip select and chip enable are available, the storage control bus 212 may select one level of a multi-level solid-state storage element 216, 218, 220. In other embodiments, other commands are used by the storage control bus 212 to individually select one level of a multi-level solid-state storage element 216, 218, 220. Solid-state storage elements 216, 218, 220 may also be selected through a combination of control and of address information transmitted on storage I/O bus 210 and the storage control bus 212.

In one embodiment, each solid-state storage element 216, 218, 220 is partitioned into erase blocks and each erase block is partitioned into pages. A typical page is 2000 bytes ("2 kB"). In one example, a solid-state storage element (e.g. SSS0.0) includes two registers and can program two pages so that a two-register solid-state storage element 216, 218, 220 has a capacity of 4 kB. A bank 214 of 20 solid-state storage elements 216, 218, 220 would then have an 80 kB capacity of pages accessed with the same address going out the channels of the storage I/O bus 210.

This group of pages in a bank 214 of solid-state storage elements 216, 218, 220 of 80 kB may be called a virtual page. Similarly, an erase block of each storage element 216a-m of a bank 214a may be grouped to form a virtual erase block. In a preferred embodiment, an erase block of pages within a solid-state storage element 216, 218, 220 is erased when an erase command is received within a solid-state storage element 216, 218, 220. Whereas the size and number of erase blocks, pages, planes, or other logical and physical divisions within a solid-state storage element 216, 218, 220 are expected to change over time with advancements in technology, it is to be expected that many embodiments consistent with new configurations are possible and are consistent with the general description herein.

Typically, when a packet is written to a particular location within a solid-state storage element 216, 218, 220, wherein the packet is intended to be written to a location within a particular page which is specific to a of a particular erase block of a particular element of a particular bank, a physical address is sent on the storage I/O bus 210 and followed by the packet. The physical address contains enough information for the solid-state storage element 216, 218, 220 to direct the packet to the designated location within the page. Since all storage elements in a row of storage elements (e.g. SSS 0.0-SSS 0.N 216a, 218a, 220a) are accessed simultaneously by the appropriate bus within the storage I/O bus 210a.a, to reach the proper page and to avoid writing the data packet to similarly addressed pages in the row of storage elements (55S 0.0-SSS 0.N 216a, 218a, 220a), the bank 214a that includes the solid-state storage element SSS 0.0 216a with the correct page where the data packet is to be written is simultaneously selected by the storage control bus 212.

Similarly, a read command traveling on the storage I/O bus 212 requires a simultaneous command on the storage control bus 212 to select a single bank 214a and the appropriate page within that bank 214a. In a preferred embodiment, a read command reads an entire page, and because there are multiple solid-state storage elements 216, 218, 220 in parallel in a bank 214, an entire virtual page is read with a read command. However, the read command may be broken into subcommands, as will be explained below with respect to bank interleave. A virtual page may also be accessed in a write operation.

An erase block erase command may be sent out to erase an erase block over the storage I/O bus 210 with a particular erase block address to erase a particular erase block. Typically, an erase block erase command may be sent over the parallel paths of the storage I/O bus 210 to erase a virtual erase block, each with a particular erase block address to erase a particular erase block. Simultaneously a particular bank (e.g. bank-0 214a) is selected over the storage control bus 212 to prevent erasure of similarly addressed erase blocks in all of the banks (banks 1-N 214b-n). Other commands may also be sent to a particular location using a combination of the storage I/O bus 210 and the storage control bus 212. One of skill in the art will recognize other ways to select a particular storage location using the bi-directional storage I/O bus 210 and the storage control bus 212.

In one embodiment, packets are written sequentially to the solid-state storage 110. For example, packets are streamed to the storage write buffers of a bank 214a of storage elements 216 and when the buffers are full, the packets are programmed to a designated virtual page. Packets then refill the storage write buffers and, when full, the packets are written to the next virtual page. The next virtual page may be in the same bank 214a or another bank (e.g. 214b). This process continues, virtual page after virtual page, typically until a virtual erase block is filled. In another embodiment, the streaming may continue across virtual erase block boundaries with the process continuing, virtual erase block after virtual erase block.

In a read, modify, write operation, data packets associated with the object are located and read in a read operation. Data segments of the modified object that have been modified are not written to the location from which they are read. Instead, the modified data segments are again converted to data packets and then written to the next available location in the virtual page currently being written. The logical index entries for the respective data packets are modified to point to the packets that contain the modified data segments. The entry or entries in the logical index for data packets associated with the same object that have not been modified will include pointers to original location of the unmodified data packets. Thus, if the original object is maintained, for example to maintain a previous version of the object, the original object will have pointers in the logical index to all data packets as originally written. The new object will have pointers in the logical index to some of the original data packets and pointers to the modified data packets in the virtual page that is currently being written.

In a copy operation, the logical index includes an entry for the original object mapped to a number of packets stored in the solid-state storage 110. When a copy is made, a new object is created and a new entry is created in the logical index mapping the new object to the original packets. The new object is also written to the solid-state storage 110 with its location mapped to the new entry in the logical index. The new object packets may be used to identify the packets within the original object that are referenced in case changes have been made in the original object that have not been propagated to the copy and the logical index is lost or corrupted.

Beneficially, sequentially writing packets facilitates a more even use of the solid-state storage 110 and allows the solid-storage device controller 202 to monitor storage hot spots and level usage of the various virtual pages in the solid-state storage 110. Sequentially writing packets also facilitates a powerful, efficient garbage collection system, which is described in detail below. One of skill in the art will recognize other benefits of sequential storage of data packets.

Solid-State Storage Device Controller

In various embodiments, the solid-state storage device controller 202 also includes a data bus 204, a local bus 206, a buffer controller 208, buffers 0-N 222a-n, a master controller 224, a direct memory access ("DMA") controller 226, a memory controller 228, a dynamic memory array 230, a static random memory array 232, a management controller 234, a management bus 236, a bridge 238 to a system bus 240, and miscellaneous logic 242, which are described below. In other embodiments, the system bus 240 is coupled to one or more network interface cards ("NICs") 244, some of which may include remote DMA ("RDMA") controllers 246, one or more central processing unit ("CPU") 248, one or more external memory controllers 250 and associated external memory arrays 252, one or more storage controllers 254, peer controllers 256, and application specific processors 258, which are described below. The components 244-258 connected to the system bus 240 may be located in the computer 112 or may be other devices.

Typically the solid-state storage controller(s) 104 communicate data to the solid-state storage 110 over a storage I/O bus 210. In a typical embodiment where the solid-state storage is arranged in banks 214 and each bank 214 includes multiple storage elements 216, 218, 220 accessed in parallel, the storage I/O bus 210 is an array of busses, one for each row of storage elements 216, 218, 220 spanning the banks 214. As used herein, the term "storage I/O bus" may refer to one storage I/O bus 210 or an array of data independent busses 204. In a preferred embodiment, each storage I/O bus 210 accessing a row of storage elements (e.g. 216a, 218a, 220a) may include a logical-to-physical mapping for storage divisions (e.g. erase blocks) accessed in a row of storage elements 216a, 218a, 220a. This mapping allows a logical address mapped to a physical address of a storage division to be remapped to a different storage division if the first storage division fails, partially fails, is inaccessible, or has some other problem. Remapping is explained further in relation to the remapping module 314 of FIG. 3.

Data may also be communicated to the solid-state storage controller(s) 104 from a requesting device 155 through the system bus 240, bridge 238, local bus 206, buffer(s) 22, and finally over a data bus 204. The data bus 204 typically is connected to one or more buffers 222a-n controlled with a buffer controller 208. The buffer controller 208 typically controls transfer of data from the local bus 206 to the buffers 222 and through the data bus 204 to the pipeline input buffer 306 and output buffer 330. The buffer controller 222 typically controls how data arriving from a requesting device can be temporarily stored in a buffer 222 and then transferred onto a data bus 204, or vice versa, to account for different clock domains, to prevent data collisions, etc. The buffer controller 208 typically works in conjunction with the master controller 224 to coordinate data flow. As data arrives, the data will arrive on the system bus 240, be transferred to the local bus 206 through a bridge 238.

Typically the data is transferred from the local bus 206 to one or more data buffers 222 as directed by the master controller 224 and the buffer controller 208. The data then flows out of the buffer(s) 222 to the data bus 204, through a solid-state controller 104, and on to the solid-state storage 110 such as NAND flash or other storage media. In a preferred embodiment, data and associated out-of-band metadata ("object metadata") arriving with the data is communicated using one or more data channels comprising one or more solid-state storage controllers 104a-104n-1 and associated solid-state storage 110a-110n-1 while at least one channel (solid-state storage controller 104n, solid-state storage 110n) is dedicated to in-band metadata, such as index information and other metadata generated internally to the solid-state storage device 102.

The local bus 206 is typically a bidirectional bus or set of busses that allows for communication of data and commands between devices internal to the solid-state storage device controller 202 and between devices internal to the solid-state storage device 102 and devices 244-258 connected to the system bus 240. The bridge 238 facilitates communication between the local bus 206 and system bus 240. One of skill in the art will recognize other embodiments such as ring structures or switched star configurations and functions of buses 240, 206, 204, 210 and bridges 238.

The system bus 240 is typically a bus of a computer 112 or other device in which the solid-state storage device 102 is installed or connected. In one embodiment, the system bus 240 may be a PCI-e bus, a Serial Advanced Technology Attachment ("serial ATA") bus, parallel ATA, or the like. In another embodiment, the system bus 240 is an external bus such as small computer system interface ("SCSI"), FireWire, Fiber Channel, USB, PCIe-AS, or the like. The solid-state storage device 102 may be packaged to fit internally to a device or as an externally connected device.

The solid-state storage device controller 202 includes a master controller 224 that controls higher-level functions within the solid-state storage device 102. The master controller 224, in various embodiments, controls data flow by interpreting object requests and other requests, directs creation of indexes to map object identifiers associated with data to physical locations of associated data, coordinating DMA requests, etc. Many of the functions described herein are controlled wholly or in part by the master controller 224.

In one embodiment, the master controller 224 uses embedded controller(s). In another embodiment, the master controller 224 uses local memory such as a dynamic memory array 230 (dynamic random access memory "DRAM"), a static memory array 323 (static random access memory "SRAM"), etc. In one embodiment, the local memory is controlled using the master controller 224. In another embodiment, the master controller accesses the local memory via a memory controller 228. In another embodiment, the master controller runs a Linux server and may support various common server interfaces, such as the World Wide Web, hyper-text markup language ("HTML"), etc. In another embodiment, the master controller 224 uses a nano-processor. The master controller 224 may be constructed using programmable or standard logic, or any combination of controller types listed above. One skilled in the art will recognize many embodiments for the master controller.

In one embodiment, where the storage device 152/solid-state storage device controller 202 manages multiple data storage devices/solid-state storage 110a-n, the master controller 224 divides the work load among internal controllers, such as the solid-state storage controllers 104a-n. For example, the master controller 224 may divide an object to be written to the data storage devices (e.g. solid-state storage 110a-n) so that a portion of the object is stored on each of the attached data storage devices. This feature is a performance enhancement allowing quicker storage and access to an object. In one embodiment, the master controller 224 is implemented using an FPGA. In another embodiment, the firmware within the master controller 224 may be updated through the management bus 236, the system bus 240 over a network connected to a NIC 244 or other device connected to the system bus 240.

In one embodiment, the master controller 224, which manages objects, emulates block storage such that a computer 102 or other device connected to the storage device 152/solid-state storage device 102 views the storage device 152/solid-state storage device 102 as a block storage device and sends data to specific physical addresses in the storage device 152/solid-state storage device 102. The master controller 224 then divides up the blocks and stores the data blocks as it would objects. The master controller 224 then maps the blocks and physical address sent with the block to the actual locations determined by the master controller 224. The mapping is stored in the logical index. Typically, for block emulation, a block device application program interface ("API") is provided in a driver in the computer 112, client 114, or other device wishing to use the storage device 152/solid-state storage device 102 as a block storage device.

In another embodiment, the master controller 224 coordinates with NIC controllers 244 and embedded RDMA controllers 246 to deliver just-in-time RDMA transfers of data and command sets. NIC controller 244 may be hidden behind a non-transparent port to enable the use of custom drivers. Also, a driver on a client 114 may have access to the computer network 118 through an I/O memory driver using a standard stack API and operating in conjunction with NICs 244.

In one embodiment, the master controller 224 is also a redundant array of independent drive ("RAID") controller. Where the data storage device/solid-state storage device 102 is networked with one or more other data storage devices/solid-state storage devices 102, the master controller 224 may be a RAID controller for single tier RAID, multi-tier RAID, progressive RAID, etc. The master controller 224 also allows some objects to be stored in a RAID array and other objects to be stored without RAID. In another embodiment, the master controller 224 may be a distributed RAID controller element.

In another embodiment, the master controller 224 may comprise many RAID, distributed RAID, and other functions as described elsewhere.

In one embodiment, the master controller 224 coordinates with single or redundant network managers (e.g. switches) to establish routing, to balance bandwidth utilization, failover, etc. In another embodiment, the master controller 224 coordinates with integrated application specific logic (via local bus 206) and associated driver software. In another embodiment, the master controller 224 coordinates with attached application specific processors 258 or logic (via the external system bus 240) and associated driver software. In another embodiment, the master controller 224 coordinates with remote application specific logic (via the computer network 118) and associated driver software. In another embodiment, the master controller 224 coordinates with the local bus 206 or external bus attached hard disk drive ("HDD") storage controller.

In one embodiment, the master controller 224 communicates with one or more storage controllers 254 where the storage device/solid-state storage device 102 may appear as a storage device connected through a SCSI bus, Internet SCSI ("iSCSI"), fiber channel, etc. Meanwhile the storage device/solid-state storage device 102 may autonomously manage objects and may appear as an object file system or distributed object file system. The master controller 224 may also be accessed by peer controllers 256 and/or application specific processors 258.

In another embodiment, the master controller 224 coordinates with an autonomous integrated management controller to periodically validate FPGA code and/or controller software, validate FPGA code while running (reset) and/or validate controller software during power on (reset), support external reset requests, support reset requests due to watchdog timeouts, and support voltage, current, power, temperature, and other environmental measurements and setting of threshold interrupts. In another embodiment, the master controller 224 manages garbage collection to free erase blocks for reuse. In another embodiment, the master controller 224 manages wear leveling. In another embodiment, the master controller 224 allows the data storage device/solid-state storage device 102 to be partitioned into multiple virtual devices and allows partition-based media encryption. In yet another embodiment, the master controller 224 supports a solid-state storage controller 104 with advanced, multi-bit ECC correction. One of skill in the art will recognize other features and functions of a master controller 224 in a storage controller 152, or more specifically in a solid-state storage device 102.

In one embodiment, the solid-state storage device controller 202 includes a memory controller 228 which controls a dynamic random memory array 230 and/or a static random memory array 232. As stated above, the memory controller 228 may be independent or integrated with the master controller 224. The memory controller 228 typically controls volatile memory of some type, such as DRAM (dynamic random memory array 230) and SRAM (static random memory array 232). In other examples, the memory controller 228 also controls other memory types such as electrically erasable programmable read only memory ("EEPROM"), etc. In other embodiments, the memory controller 228 controls two or more memory types and the memory controller 228 may include more than one controller. Typically, the memory controller 228 controls as much SRAM 232 as is feasible and by DRAM 230 to supplement the SRAM 232.

In one embodiment, the logical index is stored in memory 230, 232 and then periodically off-loaded to a channel of the solid-state storage 110n or other non-volatile memory. One of skill in the art will recognize other uses and configurations of the memory controller 228, dynamic memory array 230, and static memory array 232.

In one embodiment, the solid-state storage device controller 202 includes a DMA controller 226 that controls DMA operations between the storage device/solid-state storage device 102 and one or more external memory controllers 250 and associated external memory arrays 252 and CPUs 248. Note that the external memory controllers 250 and external memory arrays 252 are called external because they are external to the storage device/solid-state storage device 102. In addition the DMA controller 226 may also control RDMA operations with requesting devices through a NIC 244 and associated RDMA controller 246. DMA and RDMA are explained in more detail below.

In one embodiment, the solid-state storage device controller 202 includes a management controller 234 connected to a management bus 236. Typically the management controller 234 manages environmental metrics and status of the storage device/solid-state storage device 102. The management controller 234 may monitor device temperature, fan speed, power supply settings, etc. over the management bus 236. The management controller may support the reading and programming of erasable programmable read only memory ("EEPROM") for storage of FPGA code and controller software. Typically the management bus 236 is connected to the various components within the storage device/solid-state storage device 102. The management controller 234 may communicate alerts, interrupts, etc. over the local bus 206 or may include a separate connection to a system bus 240 or other bus. In one embodiment the management bus 236 is an Inter-Integrated Circuit ("I²C") bus. One of skill in the art will recognize other related functions and uses of a management controller 234 connected to components of the storage device/solid-state storage device 102 by a management bus 236.

In one embodiment, the solid-state storage device controller 202 includes miscellaneous logic 242 that may be customized for a specific application. Typically where the solid-state device controller 202 or master controller 224 is/are configured using a FPGA or other configurable controller, custom logic may be included based on a particular application, customer requirement, storage requirement, etc.

Data Pipeline

Figure 3:
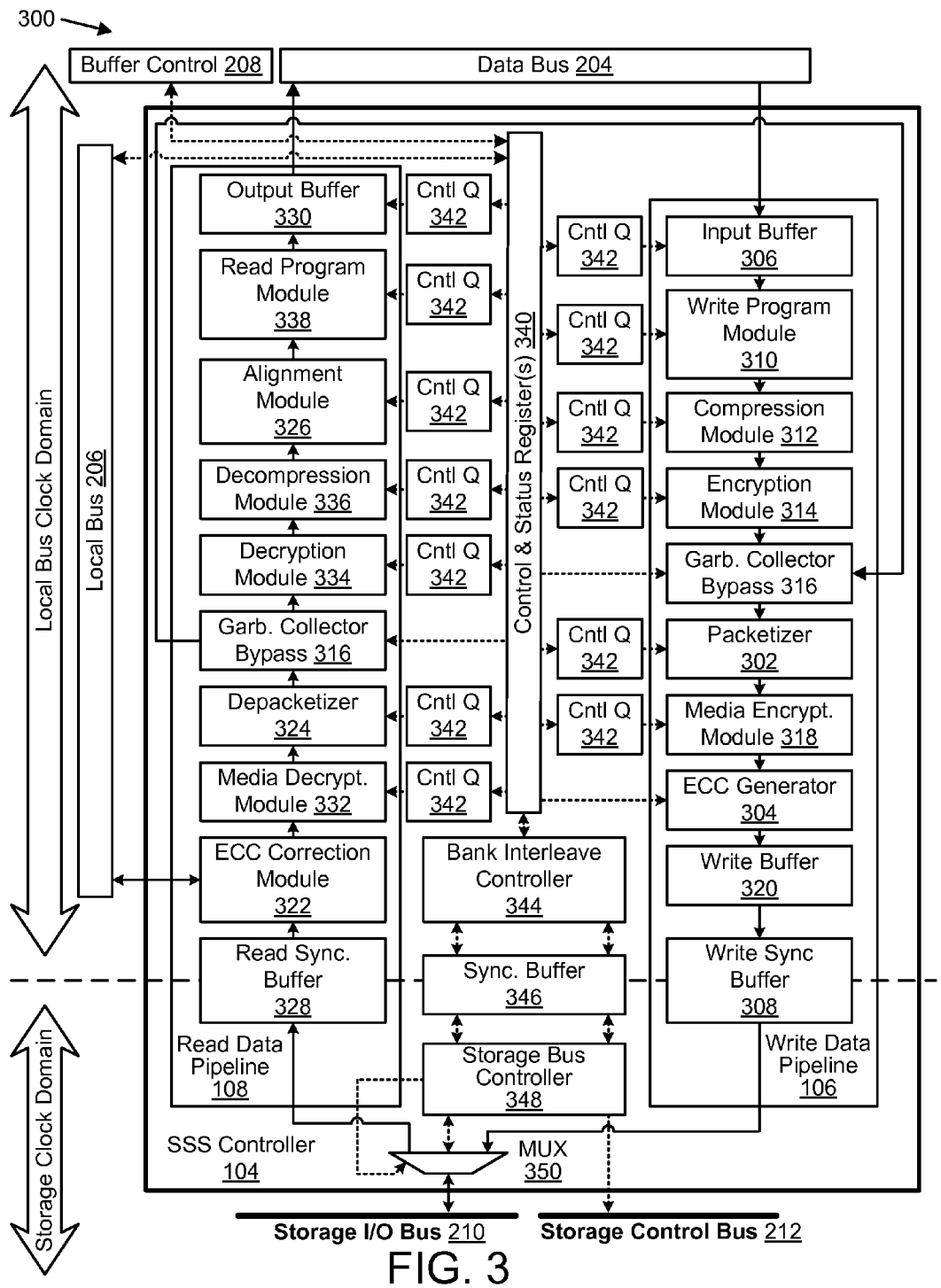
FIG. 3 is a schematic block diagram illustrating one embodiment of a solid-state storage controller with a write data pipeline and a read data pipeline in a solid-state storage device in accordance with the present invention.

FIG. 3 is a schematic block diagram illustrating one embodiment 300 of a solid-state storage controller 104 with a write data pipeline 106 and a read data pipeline 108 in a solid-state storage device 102 in accordance with the present invention. The embodiment 300 includes a data bus 204, a local bus 206, and buffer control 208, which are substantially similar to those described in relation to the solid-state storage device controller 202 of FIG. 2. The write data pipeline includes a packetizer 302 and an error-correcting code ("ECC") generator 304. In other embodiments, the write data pipeline includes an input buffer 306, a write synchronization buffer 308, a write program module 310, a compression module 312, an encryption module 314, a garbage collector bypass 316 (with a portion within the read data pipeline), a media encryption module 318, and a write buffer 320. The read data pipeline 108 includes a read synchronization buffer 328, an ECC correction module 322, a depacketizer 324, an alignment module 326, and an output buffer 330. In other embodiments, the read data pipeline 108 may include a media decryption module 332, a portion of the garbage collector bypass 316, a decryption module 334, a decompression module 336, and a read program module 338. The solid-state storage controller 104 may also include control and status registers 340 and control queues 342, a bank interleave controller 344, a synchronization buffer 346, a storage bus controller 348, and a multiplexer ("MUX") 350. The components of the solid-state controller 104 and associated write data pipeline 106 and read data pipeline 108 are described below. In other embodiments, synchronous solid-state storage 110 may be used and synchronization buffers 308 328 may be eliminated.

Write Data Pipeline

The write data pipeline 106 includes a packetizer 302 that receives a data or metadata segment to be written to the solid-state storage, either directly or indirectly through another write data pipeline 106 stage, and creates one or more packets sized for the solid-state storage 110. The data or metadata segment is typically part of an object, but may also include an entire object. In another embodiment, the data segment is part of a block of data, but may also include an entire block of data. Typically, an object is received from a computer 112, client 114, or other computer or device and is transmitted to the solid-state storage device 102 in data segments streamed to the solid-state storage device 102 or computer 112. A data segment may also be known by another name, such as data parcel, but as referenced herein includes all or a portion of an object or data block.

Each object is stored as one or more packets. Each object may have one or more container packets. Each packet contains a header. The header may include a header type field. Type fields may include data, object attribute, metadata, data segment delimiters (multi-packet), object structures, object linkages, and the like. The header may also include information regarding the size of the packet, such as the number of bytes of data included in the packet. The length of the packet may be established by the packet type. The header may include information that establishes the relationship of the packet to the object. An example might be the use of an offset in a data packet header to identify the location of the data segment within the object. One of skill in the art will recognize other information that may be included in a header added to data by a packetizer 302 and other information that may be added to a data packet.

Each packet includes a header and possibly data from the data or metadata segment. The header of each packet includes pertinent information to relate the packet to the object to which the packet belongs. For example, the header may include an object identifier and offset that indicates the data segment, object, or data block from which the data packet was formed. The header may also include a logical address used by the storage bus controller 348 to store the packet. The header may also include information regarding the size of the packet, such as the number of bytes included in the packet. The header may also include a sequence number that identifies where the data segment belongs with respect to other packets within the object when reconstructing the data segment or object. The header may include a header type field. Type fields may include data, object attributes, metadata, data segment delimiters (multi-packet), object structures, object linkages, and the like. One of skill in the art will recognize other information that may be included in a header added to data or metadata by a packetizer 302 and other information that may be added to a packet.

The write data pipeline 106 includes an ECC generator 304 that generates one or more error-correcting codes ("ECC") for the one or more packets received from the packetizer 302. The ECC generator 304 typically uses an error correcting algorithm to generate ECC which is stored with the packet. The ECC stored with the packet is typically used to detect and correct errors introduced into the data through transmission and storage. In one embodiment, packets are streamed into the ECC generator 304 as un-encoded blocks of length N. A syndrome of length S is calculated, appended and output as an encoded block of length N+S. The value of N and S are dependent upon the characteristics of the algorithm which is selected to achieve specific performance, efficiency, and robustness metrics. In the preferred embodiment, there is no fixed relationship between the ECC blocks and the packets; the packet may comprise more than one ECC block; the ECC block may comprise more than one packet; and a first packet may end anywhere within the ECC block and a second packet may begin after the end of the first packet within the same ECC block. In the preferred embodiment, ECC algorithms are not dynamically modified. In a preferred embodiment, the ECC stored with the data packets is robust enough to correct errors in more than two bits.

Beneficially, using a robust ECC algorithm allowing more than single bit correction or even double bit correction allows the life of the solid-state storage 110 to be extended. For example, if flash memory is used as the storage medium in the solid-state storage 110, the flash memory may be written approximately 100,000 times without error per erase cycle. This usage limit may be extended using a robust ECC algorithm. Having the ECC generator 304 and corresponding ECC correction module 322 onboard the solid-state storage device 102, the solid-state storage device 102 can internally correct errors and has a longer useful life than if a less robust ECC algorithm is used, such as single bit correction. However, in other embodiments the ECC generator 304 may use a less robust algorithm and may correct single-bit or double-bit errors. In another embodiment, the solid-state storage device 110 may comprise less reliable storage such as multi-level cell ("MLC") flash in order to increase capacity, which storage may not be sufficiently reliable without more robust ECC algorithms.

In one embodiment, the write pipeline 106 includes an input buffer 306 that receives a data segment to be written to the solid-state storage 110 and stores the incoming data segments until the next stage of the write data pipeline 106, such as the packetizer 302 (or other stage for a more complex write data pipeline 106) is ready to process the next data segment. The input buffer 306 typically allows for discrepancies between the rate data segments are received and processed by the write data pipeline 106 using an appropriately sized data buffer. The input buffer 306 also allows the data bus 204 to transfer data to the write data pipeline 106 at rates greater than can be sustained by the write data pipeline 106 in order to improve efficiency of operation of the data bus 204. Typically when the write data pipeline 106 does not include an input buffer 306, a buffering function is performed elsewhere, such as in the solid-state storage device 102 but outside the write data pipeline 106, in the computer 112, such as within a network interface card ("NIC"), or at another device, for example when using remote direct memory access ("RDMA").

In another embodiment, the write data pipeline 106 also includes a write synchronization buffer 308 that buffers packets received from the ECC generator 304 prior to writing the packets to the solid-state storage 110. The write synch buffer 308 is located at a boundary between a local clock domain and a solid-state storage clock domain and provides buffering to account for the clock domain differences. In other embodiments, synchronous solid-state storage 110 may be used and synchronization buffers 308 328 may be eliminated.

In one embodiment, the write data pipeline 106 also includes a media encryption module 318 that receives the one or more packets from the packetizer 302, either directly or indirectly, and encrypts the one or more packets using an encryption key unique to the solid-state storage device 102 prior to sending the packets to the ECC generator 304. Typically, the entire packet is encrypted, including the headers. In another embodiment, headers are not encrypted. In this document, encryption key is understood to mean a secret encryption key that is managed externally from an embodiment that integrates the solid-state storage 110 and where the embodiment requires encryption protection. The media encryption module 318 and corresponding media decryption module 332 provide a level of security for data stored in the solid-state storage 110. For example, where data is encrypted with the media encryption module 318, if the solid-state storage 110 is connected to a different solid-state storage controller 104, solid-state storage device 102, or computer 112, the contents of the solid-state storage 110 typically could not be read without use of the same encryption key used during the write of the data to the solid-state storage 110 without significant effort.

In a typical embodiment, the solid-state storage device 102 does not store the encryption key in non-volatile storage and allows no external access to the encryption key. The encryption key is provided to the solid-state storage controller 104 during initialization. The solid-sate storage device 102 may use and store a non-secret cryptographic nonce that is used in conjunction with an encryption key. A different nonce may be stored with every packet. Data segments may be split between multiple packets with unique nonces for the purpose of improving protection by the encryption algorithm. The encryption key may be received from a client 114, a computer 112, key manager, or other device that manages the encryption key to be used by the solid-state storage controller 104. In another embodiment, the solid-state storage 110 may have two or more partitions and the solid-state storage controller 104 behaves as though it were two or more solid-state storage controllers 104, each operating on a single partition within the solid-state storage 110. In this embodiment, a unique media encryption key may be used with each partition.

In another embodiment, the write data pipeline 106 also includes an encryption module 314 that encrypts a data or metadata segment received from the input buffer 306, either directly or indirectly, prior sending the data segment to the packetizer 302, the data segment encrypted using an encryption key received in conjunction with the data segment. The encryption module 314 differs from the media encryption module 318 in that the encryption keys used by the encryption module 318 to encrypt data may not be common to all data stored within the solid-state storage device 102 but may vary on an object basis and received in conjunction with receiving data segments as described below. For example, an encryption key for a data segment to be encrypted by the encryption module 318 may be received with the data segment or may be received as part of a command to write an object to which the data segment belongs. The solid-sate storage device 102 may use and store a non-secret cryptographic nonce in each object packet that is used in conjunction with the encryption key. A different nonce may be stored with every packet. Data segments may be split between multiple packets with unique nonces for the purpose of improving protection by the encryption algorithm. In one embodiment, the nonce used by the media encryption module 318 is the same as that used by the encryption module 314.

The encryption key may be received from a client 114, a computer 112, key manager, or other device that holds the encryption key to be used to encrypt the data segment. In one embodiment, encryption keys are transferred to the solid-state storage controller 104 from one of a solid-state storage device 102, computer 112, client 114, or other external agent which has the ability to execute industry standard methods to securely transfer and protect private and public keys.

In one embodiment, the encryption module 318 encrypts a first packet with a first encryption key received in conjunction with the packet and encrypts a second packet with a second encryption key received in conjunction with the second packet. In another embodiment, the encryption module 318 encrypts a first packet with a first encryption key received in conjunction with the packet and passes a second data packet on to the next stage without encryption. Beneficially, the encryption module 318 included in the write data pipeline 106 of the solid-state storage device 102 allows object-by-object or segment-by-segment data encryption without a single file system or other external system to keep track of the different encryption keys used to store corresponding objects or data segments. Each requesting device 155 or related key manager independently manages encryption keys used to encrypt only the objects or data segments sent by the requesting device 155.

In another embodiment, the write data pipeline 106 includes a compression module 312 that compresses the data for metadata segment prior to sending the data segment to the packetizer 302. The compression module 312 typically compresses a data or metadata segment using a compression routine known to those of skill in the art to reduce the storage size of the segment. For example, if a data segment includes a string of 512 zeros, the compression module 312 may replace the 512 zeros with code or token indicating the 512 zeros where the code is much more compact than the space taken by the 512 zeros.

In one embodiment, the compression module 312 compresses a first segment with a first compression routine and passes along a second segment without compression. In another embodiment, the compression module 312 compresses a first segment with a first compression routine and compresses the second segment with a second compression routine. Having this flexibility within the solid-state storage device 102 is beneficial so that clients 114 or other devices writing data to the solid-state storage device 102 may each specify a compression routine or so that one can specify a compression routine while another specifies no compression. Selection of compression routines may also be selected according to default settings on a per object type or object class basis. For example, a first object of a specific object may be able to override default compression routine settings and a second object of the same object class and object type may use the default compression routine and a third object of the same object class and object type may use no compression.

In one embodiment, the write data pipeline 106 includes a garbage collector bypass 316 that receives data segments from the read data pipeline 108 as part of a data bypass in a garbage collection system. A garbage collection system typically marks packets that are no longer valid, typically because the packet is marked for deletion or has been modified and the modified data is stored in a different location. At some point, the garbage collection system determines that a particular section of storage may be recovered. This determination may be due to a lack of available storage capacity, the percentage of data marked as invalid reaching a threshold, a consolidation of valid data, an error detection rate for that section of storage reaching a threshold, or improving performance based on data distribution, etc. Numerous factors may be considered by a garbage collection algorithm to determine when a section of storage is to be recovered.

Once a section of storage has been marked for recovery, valid packets in the section typically must be relocated. The garbage collector bypass 316 allows packets to be read into the read data pipeline 108 and then transferred directly to the write data pipeline 106 without being routed out of the solid-state storage controller 104. In a preferred embodiment, the garbage collector bypass 316 is part of an autonomous garbage collector system that operates within the solid-state storage device 102. This allows the solid-state storage device 102 to manage data so that data is systematically spread throughout the solid-state storage 110 to improve performance, data reliability and to avoid overuse and underuse of any one location or area of the solid-state storage 110 and to lengthen the useful life of the solid-state storage 110.

The garbage collector bypass 316 coordinates insertion of segments into the write data pipeline 106 with other segments being written by clients 116 or other devices. In the depicted embodiment, the garbage collector bypass 316 is before the packetizer 302 in the write data pipeline 106 and after the depacketizer 324 in the read data pipeline 108, but may also be located elsewhere in the read and write data pipelines 106, 108. The garbage collector bypass 316 may be used during a flush of the write pipeline 106 to fill the remainder of the virtual page in order to improve the efficiency of storage within the Solid-State Storage 110 and thereby reduce the frequency of garbage collection.

In one embodiment, the write data pipeline 106 includes a write buffer 320 that buffers data for efficient write operations. Typically, the write buffer 320 includes enough capacity for packets to fill at least one virtual page in the solid-state storage 110. This allows a write operation to send an entire page of data to the solid-state storage 110 without interruption. By sizing the write buffer 320 of the write data pipeline 106 and buffers within the read data pipeline 108 to be the same capacity or larger than a storage write buffer within the solid-state storage 110, writing and reading data is more efficient since a single write command may be crafted to send a full virtual page of data to the solid-state storage 110 instead of multiple commands.

While the write buffer 320 is being filled, the solid-state storage 110 may be used for other read operations. This is advantageous because other solid-state devices with a smaller write buffer or no write buffer may tie up the solid-state storage when data is written to a storage write buffer and data flowing into the storage write buffer stalls. Read operations will be blocked until the entire storage write buffer is filled and programmed. Another approach for systems without a write buffer or a small write buffer is to flush the storage write buffer that is not full in order to enable reads. Again this is inefficient because multiple write/program cycles are required to fill a page.

For depicted embodiment with a write buffer 320 sized larger than a virtual page, a single write command, which includes numerous subcommands, can then be followed by a single program command to transfer the page of data from the storage write buffer in each solid-state storage element 216, 218, 220 to the designated page within each solid-state storage element 216, 218, 220. This technique has the benefits of eliminating partial page programming, which is known to reduce data reliability and durability and freeing up the destination bank for reads and other commands while the buffer fills.

In one embodiment, the write buffer 320 is a ping-pong buffer where one side of the buffer is filled and then designated for transfer at an appropriate time while the other side of the ping-pong buffer is being filled. In another embodiment, the write buffer 320 includes a first-in first-out ("FIFO") register with a capacity of more than a virtual page of data segments. One of skill in the art will recognize other write buffer 320 configurations that allow a virtual page of data to be stored prior to writing the data to the solid-state storage 110.

In another embodiment, the write buffer 320 is sized smaller than a virtual page so that less than a page of information could be written to a storage write buffer in the solid-state storage 110. In the embodiment, to prevent a stall in the write data pipeline 106 from holding up read operations, data is queued using the garbage collection system that needs to be moved from one location to another as part of the garbage collection process. In case of a data stall in the write data pipeline 106, the data can be fed through the garbage collector bypass 316 to the write buffer 320 and then on to the storage write buffer in the solid-state storage 110 to fill the pages of a virtual page prior to programming the data. In this way a data stall in the write data pipeline 106 would not stall reading from the solid-state storage device 106.

In another embodiment, the write data pipeline 106 includes a write program module 310 with one or more user-definable functions within the write data pipeline 106. The write program module 310 allows a user to customize the write data pipeline 106. A user may customize the write data pipeline 106 based on a particular data requirement or application. Where the solid-state storage controller 104 is an FPGA, the user may program the write data pipeline 106 with custom commands and functions relatively easily. A user may also use the write program module 310 to include custom functions with an ASIC, however, customizing an ASIC may be more difficult than with an FPGA. The write program module 310 may include buffers and bypass mechanisms to allow a first data segment to execute in the write program module 310 while a second data segment may continue through the write data pipeline 106. In another embodiment, the write program module 310 may include a processor core that can be programmed through software.

Note that the write program module 310 is shown between the input buffer 306 and the compression module 312, however, the write program module 310 could be anywhere in the write data pipeline 106 and may be distributed among the various stages 302-320. In addition, there may be multiple write program modules 310 distributed among the various states 302-320 that are programmed and operate independently. In addition, the order of the stages 302-320 may be altered. One of skill in the art will recognize workable alterations to the order of the stages 302-320 based on particular user requirements.

Read Data Pipeline

The read data pipeline 108 includes an ECC correction module 322 that determines if a data error exists in ECC blocks a requested packet received from the solid-state storage 110 by using ECC stored with each ECC block of the requested packet. The ECC correction module 322 then corrects any errors in the requested packet if any error exists and the errors are correctable using the ECC. For example, if the ECC can detect an error in six bits but can only correct three bit errors, the ECC correction module 322 corrects ECC blocks of the requested packet with up to three bits in error. The ECC correction module 322 corrects the bits in error by changing the bits in error to the correct one or zero state so that the requested data packet is identical to when it was written to the solid-state storage 110 and the ECC was generated for the packet.

If the ECC correction module 322 determines that the requested packets contains more bits in error than the ECC can correct, the ECC correction module 322 cannot correct the errors in the corrupted ECC blocks of the requested packet and sends an interrupt. In one embodiment, the ECC correction module 322 sends an interrupt with a message indicating that the requested packet is in error. The message may include information that the ECC correction module 322 cannot correct the errors or the inability of the ECC correction module 322 to correct the errors may be implied. In another embodiment, the ECC correction module 322 sends the corrupted ECC blocks of the requested packet with the interrupt and/or the message.

In the preferred embodiment, a corrupted ECC block or portion of a corrupted ECC block of the requested packet that cannot be corrected by the ECC correction module 322 is read by the master controller 224, corrected, and returned to the ECC correction module 322 for further processing by the read data pipeline 108. In one embodiment, a corrupted ECC block or portion of a corrupted ECC block of the requested packet is sent to the device requesting the data. The requesting device 155 may correct the ECC block or replace the data using another copy, such as a backup or mirror copy, and then may use the replacement data of the requested data packet or return it to the read data pipeline 108. The requesting device 155 may use header information in the requested packet in error to identify data required to replace the corrupted requested packet or to replace the object to which the packet belongs. In another preferred embodiment, the solid-state storage controller 104 stores data using some type of RAID and is able to recover the corrupted data. In another embodiment, the ECC correction module 322 sends and interrupt and/or message and the receiving device fails the read operation associated with the requested data packet. One of skill in the art will recognize other options and actions to be taken as a result of the ECC correction module 322 determining that one or more ECC blocks of the requested packet are corrupted and that the ECC correction module 322 cannot correct the errors.

The read data pipeline 108 includes a depacketizer 324 that receives ECC blocks of the requested packet from the ECC correction module 322, directly or indirectly, and checks and removes one or more packet headers. The depacketizer 324 may validate the packet headers by checking packet identifiers, data length, data location, etc. within the headers. In one embodiment, the header includes a hash code that can be used to validate that the packet delivered to the read data pipeline 108 is the requested packet. The depacketizer 324 also removes the headers from the requested packet added by the packetizer 302. The depacketizer 324 may directed to not operate on certain packets but pass these forward without modification. An example might be a container label that is requested during the course of a rebuild process where the header information is required by the logical index reconstruction module 272. Further examples include the transfer of packets of various types destined for use within the solid-state storage device 102. In another embodiment, the depacketizer 324 operation may be packet type dependent.

The read data pipeline 108 includes an alignment module 326 that receives data from the depacketizer 324 and removes unwanted data. In one embodiment, a read command sent to the solid-state storage 110 retrieves a packet of data. A device requesting the data may not require all data within the retrieved packet and the alignment module 326 removes the unwanted data. If all data within a retrieved page is requested data, the alignment module 326 does not remove any data.

The alignment module 326 re-formats the data as data segments of an object in a form compatible with a device requesting the data segment prior to forwarding the data segment to the next stage. Typically, as data is processed by the read data pipeline 108, the size of data segments or packets changes at various stages. The alignment module 326 uses received data to format the data into data segments suitable to be sent to the requesting device 155 and joined to form a response. For example, data from a portion of a first data packet may be combined with data from a portion of a second data packet. If a data segment is larger than a data requested by the requesting device, the alignment module 326 may discard the unwanted data.

In one embodiment, the read data pipeline 108 includes a read synchronization buffer 328 that buffers one or more requested packets read from the solid-state storage 110 prior to processing by the read data pipeline 108. The read synchronization buffer 328 is at the boundary between the solid-state storage clock domain and the local bus clock domain and provides buffering to account for the clock domain differences.

In another embodiment, the read data pipeline 108 includes an output buffer 330 that receives requested packets from the alignment module 326 and stores the packets prior to transmission to the requesting device. The output buffer 330 accounts for differences between when data segments are received from stages of the read data pipeline 108 and when the data segments are transmitted to other parts of the solid-state storage controller 104 or to the requesting device. The output buffer 330 also allows the data bus 204 to receive data from the read data pipeline 108 at rates greater than can be sustained by the read data pipeline 108 in order to improve efficiency of operation of the data bus 204.

In one embodiment, the read data pipeline 108 includes a media decryption module 332 that receives one or more encrypted requested packets from the ECC correction module 322 and decrypts the one or more requested packets using the encryption key unique to the solid-state storage device 102 prior to sending the one or more requested packets to the depacketizer 324. Typically the encryption key used to decrypt data by the media decryption module 332 is identical to the encryption key used by the media encryption module 318. In another embodiment, the solid-state storage 110 may have two or more partitions and the solid-state storage controller 104 behaves as though it were two or more solid-state storage controllers 104 each operating on a single partition within the solid-state storage 110. In this embodiment, a unique media encryption key may be used with each partition.

In another embodiment, the read data pipeline 108 includes a decryption module 334 that decrypts a data segment formatted by the depacketizer 324 prior to sending the data segment to the output buffer 330. The data segment decrypted using an encryption key received in conjunction with the read request that initiates retrieval of the requested packet received by the read synchronization buffer 328. The decryption module 334 may decrypt a first packet with an encryption key received in conjunction with the read request for the first packet and then may decrypt a second packet with a different encryption key or may pass the second packet on to the next stage of the read data pipeline 108 without decryption. Typically, the decryption module 334 uses a different encryption key to decrypt a data segment than the media decryption module 332 uses to decrypt requested packets. When the packet was stored with a non-secret cryptographic nonce, the nonce is used in conjunction with an encryption key to decrypt the data packet. The encryption key may be received from a client 114, a computer 112, key manager, or other device that manages the encryption key to be used by the solid-state storage controller 104.

In another embodiment, the read data pipeline 108 includes a decompression module 336 that decompresses a data segment formatted by the depacketizer 324. In the preferred embodiment, the decompression module 336 uses compression information stored in one or both of the packet header and the container label to select a complementary routine to that used to compress the data by the compression module 312. In another embodiment, the decompression routine used by the decompression module 336 is dictated by the device requesting the data segment being decompressed. In another embodiment, the decompression module 336 selects a decompression routine according to default settings on a per object type or object class basis. A first packet of a first object may be able to override a default decompression routine and a second packet of a second object of the same object class and object type may use the default decompression routine and a third packet of a third object of the same object class and object type may use no decompression.

In another embodiment, the read data pipeline 108 includes a read program module 338 that includes one or more user-definable functions within the read data pipeline 108. The read program module 338 has similar characteristics to the write program module 310 and allows a user to provide custom functions to the read data pipeline 108. The read program module 338 may be located as shown in FIG. 3, may be located in another position within the read data pipeline 108, or may include multiple parts in multiple locations within the read data pipeline 108. Additionally, there may be multiple read program modules 338 within multiple locations within the read data pipeline 108 that operate independently. One of skill in the art will recognize other forms of a read program module 338 within a read data pipeline 108. As with the write data pipeline 106, the stages of the read data pipeline 108 may be rearranged and one of skill in the art will recognize other orders of stages within the read data pipeline 108.

The solid-state storage controller 104 includes control and status registers 340 and corresponding control queues 342. The control and status registers 340 and control queues 342 facilitate control and sequencing commands and subcommands associated with data processed in the write and read data pipelines 106, 108. For example, a data segment in the packetizer 302 may have one or more corresponding control commands or instructions in a control queue 342 associated with the ECC generator. As the data segment is packetized, some of the instructions or commands may be executed within the packetizer 302. Other commands or instructions may be passed to the next control queue 342 through the control and status registers 340 as the newly formed data packet created from the data segment is passed to the next stage.

Commands or instructions may be simultaneously loaded into the control queues 342 for a packet being forwarded to the write data pipeline 106 with each pipeline stage pulling the appropriate command or instruction as the respective packet is executed by that stage. Similarly, commands or instructions may be simultaneously loaded into the control queues 342 for a packet being requested from the read data pipeline 108 with each pipeline stage pulling the appropriate command or instruction as the respective packet is executed by that stage. One of skill in the art will recognize other features and functions of control and status registers 340 and control queues 342.

Figure 4A:
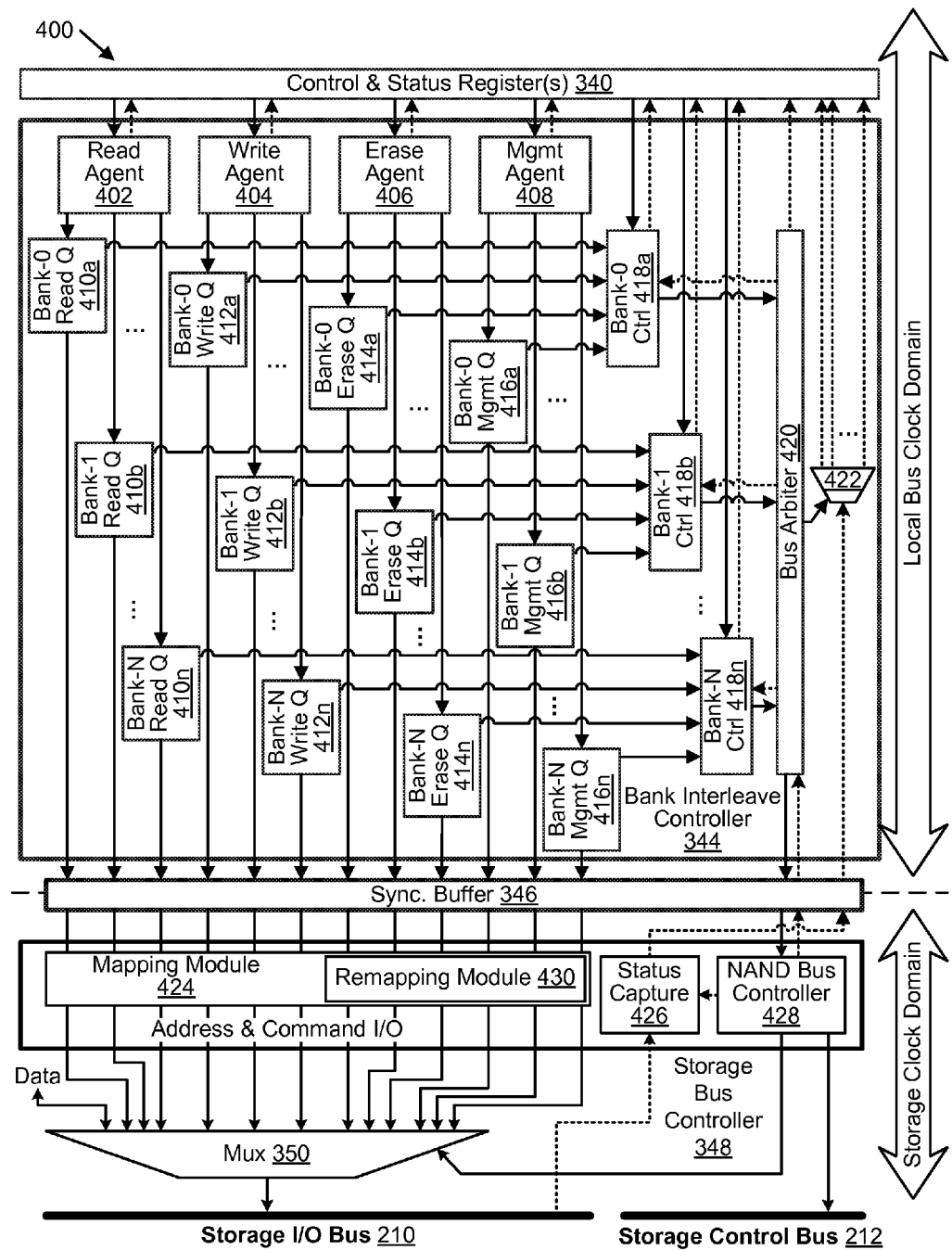
FIG. 4A is a schematic block diagram illustrating one embodiment of a bank interleave controller in the solid-state storage controller in accordance with the present invention.
Figure 4B:
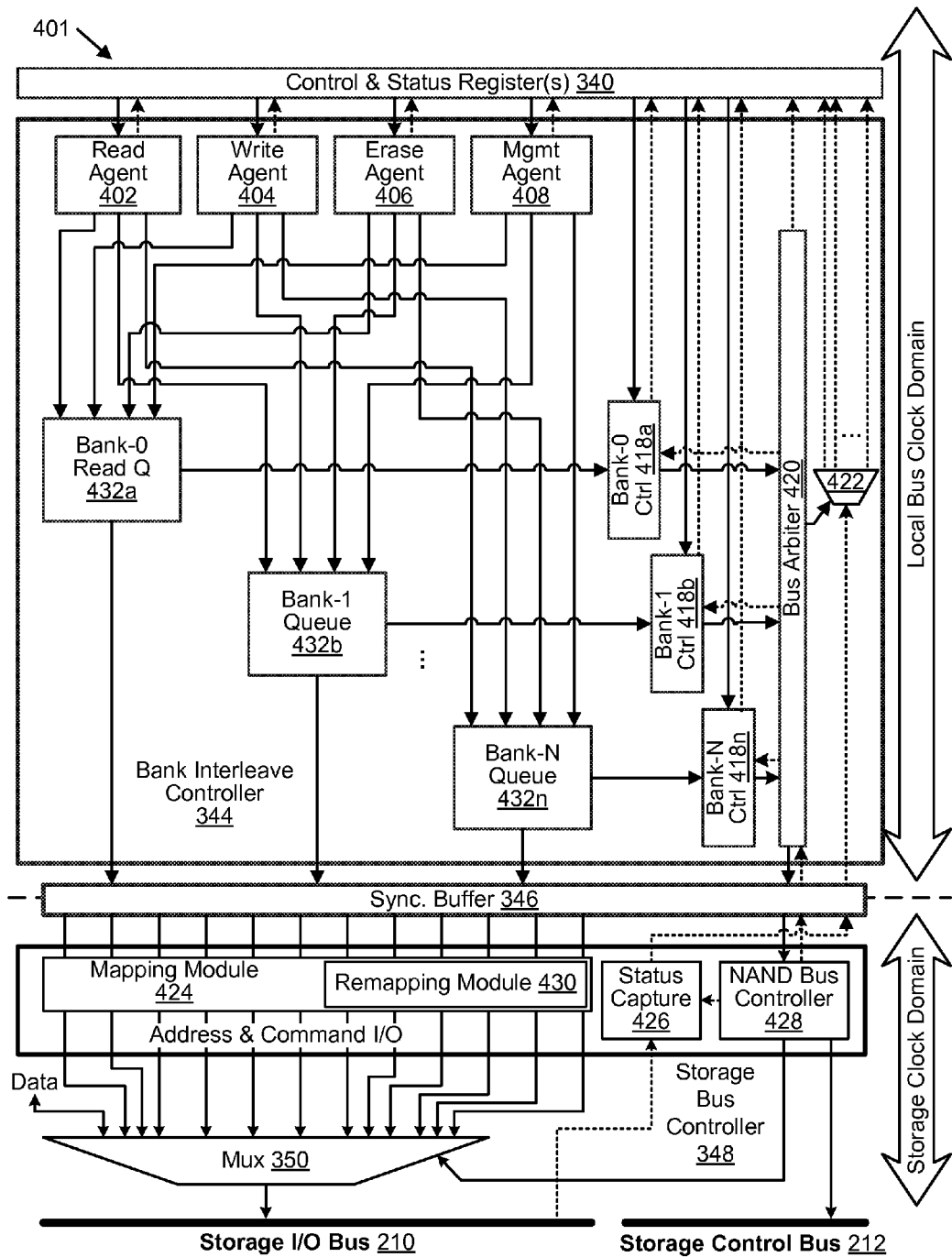
FIG. 4B is a schematic block diagram illustrating an alternate embodiment of a bank interleave controller in the solid-state storage controller in accordance with the present invention.

The solid-state storage controller 104 and or solid-state storage device 102 may also include a bank interleave controller 344, a synchronization buffer 346, a storage bus controller 348, and a multiplexer ("MUX") 350, which are described in relation to FIGS. 4A and 4B.

Bank Interleave

FIG. 4A is a schematic block diagram illustrating one embodiment 400 of a bank interleave controller 344 in the solid-state storage controller 104 in accordance with the present invention. The bank interleave controller 344 is connected to the control and status registers 340 and to the storage I/O bus 210 and storage control bus 212 through the MUX 350, storage bus controller 348, and synchronous buffer 346, which are described below. The bank interleave controller includes a read agent 402, a write agent 404, an erase agent 406, a management agent 408, read queues 410a-n, write queues 412a-n, erase queues 414a-n, and management queues 416a-n for the banks 214 in the solid-state storage 110, bank controllers 418a-n, a bus arbiter 420, and a status MUX 422, which are described below. The storage bus controller 348 includes a mapping module 424 with a remapping module 430, a status capture module 426, and a NAND bus controller 428, which are described below.

The bank interleave controller 344 directs one or more commands to two or more queues in the bank interleave controller 344 and coordinates among the banks 214 of the solid-state storage 110 execution of the commands stored in the queues, such that a command of a first type executes on one bank 214a while a command of a second type executes on a second bank 214b. The one or more commands are separated by command type into the queues. Each bank 214 of the solid-state storage 110 has a corresponding set of queues within the bank interleave controller 344 and each set of queues includes a queue for each command type.

The bank interleave controller 344 coordinates among the banks 214 of the solid-state storage 110 execution of the commands stored in the queues. For example, a command of a first type executes on one bank 214a while a command of a second type executes on a second bank 214b. Typically the command types and queue types include read and write commands and queues 410, 412, but may also include other commands and queues that are storage media specific. For example, in the embodiment depicted in FIG. 4A, erase and management queues 414, 416 are included and would be appropriate for flash memory, NRAM, MRAM, DRAM, PRAM, etc.

For other types of solid-state storage 110, other types of commands and corresponding queues may be included without straying from the scope of the invention. The flexible nature of an FPGA solid-state storage controller 104 allows flexibility in storage media. If flash memory were changed to another solid-state storage type, the bank interleave controller 344, storage bus controller 348, and MUX 350 could be altered to accommodate the media type without significantly affecting the data pipelines 106, 108 and other solid-state storage controller 104 functions.

In the embodiment depicted in FIG. 4A, the bank interleave controller 344 includes, for each bank 214, a read queue 410 for reading data from the solid-state storage 110, a write queue 412 for write commands to the solid-state storage 110, an erase queue 414 for erasing an erase block in the solid-state storage, an a management queue 416 for management commands. The bank interleave controller 344 also includes corresponding read, write, erase, and management agents 402, 404, 406, 408. In another embodiment, the control and status registers 340 and control queues 342 or similar components queue commands for data sent to the banks 214 of the solid-state storage 110 without a bank interleave controller 344.

The agents 402, 404, 406, 408, in one embodiment, direct commands of the appropriate type destined for a particular bank 214a to the correct queue for the bank 214a. For example, the read agent 402 may receive a read command for bank-1 214b and directs the read command to the bank-1 read queue 410b. The write agent 404 may receive a write command to write data to a location in bank-0 214a of the solid-state storage 110 and will then send the write command to the bank-0 write queue 412a. Similarly, the erase agent 406 may receive an erase command to erase an erase block in bank-1 214b and will then pass the erase command to the bank-1 erase queue 414b. The management agent 408 typically receives management commands, status requests, and the like, such as a reset command or a request to read a configuration register of a bank 214, such as bank-0 214a. The management agent 408 sends the management command to the bank-0 management queue 416a.

The agents 402, 404, 406, 408 typically also monitor status of the queues 410, 412, 414, 416 and send status, interrupt, or other messages when the queues 410, 412, 414, 416 are full, nearly full, non-functional, etc. In one embodiment, the agents 402, 404, 406, 408 receive commands and generate corresponding sub-commands. In one embodiment, the agents 402, 404, 406, 408 receive commands through the control & status registers 340 and generate corresponding sub-commands which are forwarded to the queues 410, 412, 414, 416. One of skill in the art will recognize other functions of the agents 402, 404, 406, 408.

The queues 410, 412, 414, 416 typically receive commands and store the commands until required to be sent to the solid-state storage banks 214. In a typical embodiment, the queues 410, 412, 414, 416 are first-in, first-out ("FIFO") registers or a similar component that operates as a FIFO. In another embodiment, the queues 410, 412, 414, 416 store commands in an order that matches data, order of importance, or other criteria.

The bank controllers 418 typically receive commands from the queues 410, 412, 414, 416 and generate appropriate sub-commands. For example, the bank-0 write queue 412a may receive a command to write a page of data packets to bank-0 214a. The bank-0 controller 418a may receive the write command at an appropriate time and may generate one or more write subcommands for each data packet stored in the write buffer 320 to be written to the page in bank-0 214a. For example, bank-0 controller 418a may generate commands to validate the status of bank 0 214a and the solid-state storage array 216, select the appropriate location for writing one or more data packets, clear the input buffers within the solid-state storage memory array 216, transfer the one or more data packets to the input buffers, program the input buffers into the selected location, verify that the data was correctly programmed, and if program failures occur do one or more of interrupting the master controller, retrying the write to the same physical location, and retrying the write to a different physical location. Additionally, in conjunction with example write command, the storage bus controller 348 will cause the one or more commands to multiplied to each of the each of the storage I/O buses 210a-n with the logical address of the command mapped to a first physical addresses for storage I/O bus 210a, and mapped to a second physical address for storage I/O bus 210b, and so forth as further described below.

Typically, bus arbiter 420 selects from among the bank controllers 418 and pulls subcommands from output queues within the bank controllers 418 and forwards these to the Storage Bus Controller 348 in a sequence that optimizes the performance of the banks 214. In another embodiment, the bus arbiter 420 may respond to a high level interrupt and modify the normal selection criteria. In another embodiment, the master controller 224 can control the bus arbiter 420 through the control and status registers 340. One of skill in the art will recognize other means by which the bus arbiter 420 may control and interleave the sequence of commands from the bank controllers 418 to the solid-state storage 110.

The bus arbiter 420 typically coordinates selection of appropriate commands, and corresponding data when required for the command type, from the bank controllers 418 and sends the commands and data to the storage bus controller 348. The bus arbiter 420 typically also sends commands to the storage control bus 212 to select the appropriate bank 214. For the case of flash memory or other solid-state storage 110 with an asynchronous, bi-directional serial storage I/O bus 210, only one command (control information) or set of data can be transmitted at a time. For example, when write commands or data are being transmitted to the solid-state storage 110 on the storage I/O bus 210, read commands, data being read, erase commands, management commands, or other status commands cannot be transmitted on the storage I/O bus 210. For example, when data is being read from the storage I/O bus 210, data cannot be written to the solid-state storage 110.

For example, during a write operation on bank-0 the bus arbiter 420 selects the bank-0 controller 418a which may have a write command or a series of write sub-commands on the top of its queue which cause the storage bus controller 348 to execute the following sequence. The bus arbiter 420 forwards the write command to the storage bus controller 348, which sets up a write command by selecting bank-0 214a through the storage control bus 212, sending a command to clear the input buffers of the solid-state storage elements 110 associated with the bank-0 214a, and sending a command to validate the status of the solid-state storage elements 216, 218, 220 associated with the bank-0 214a. The storage bus controller 348 then transmits a write subcommand on the storage I/O bus 210, which contains the physical addresses including the address of the logical erase block for each individual physical erase solid-stage storage element 216a-m as mapped from the logical erase block address. The storage bus controller 348 then muxes the write buffer 320 through the write sync buffer 308 to the storage I/O bus 210 through the MUX 350 and streams write data to the appropriate page. When the page is full, then storage bus controller 348 causes the solid-state storage elements 216a-m associated with the bank-0 214a to program the input buffer to the memory cells within the solid-state storage elements 216a-m. Finally, the storage bus controller 348 validates the status to ensure that page was correctly programmed.

A read operation is similar to the write example above. During a read operation, typically the bus arbiter 420, or other component of the bank interleave controller 344, receives data and corresponding status information and sends the data to the read data pipeline 108 while sending the status information on to the control and status registers 340. Typically, a read data command forwarded from bus arbiter 420 to the storage bus controller 348 will cause the MUX 350 to gate the read data on storage I/O bus 210 to the read data pipeline 108 and send status information to the appropriate control and status registers 340 through the status MUX 422.

The bus arbiter 420 coordinates the various command types and data access modes so that only an appropriate command type or corresponding data is on the bus at any given time. If the bus arbiter 420 has selected a write command, and write subcommands and corresponding data are being written to the solid-state storage 110, the bus arbiter 420 will not allow other command types on the storage I/O bus 210. Beneficially, the bus arbiter 420 uses timing information, such as predicted command execution times, along with status information received concerning bank 214 status to coordinate execution of the various commands on the bus with the goal of minimizing or eliminating idle time of the busses.

The master controller 224 through the bus arbiter 420 typically uses expected completion times of the commands stored in the queues 410, 412, 414, 416, along with status information, so that when the subcommands associated with a command are executing on one bank 214a, other subcommands of other commands are executing on other banks 214b-n. When one command is fully executed on a bank 214a, the bus arbiter 420 directs another command to the bank 214a. The bus arbiter 420 may also coordinate commands stored in the queues 410, 412, 414, 416 with other commands that are not stored in the queues 410, 412, 414, 416.

For example, an erase command may be sent out to erase a group of erase blocks within the solid-state storage 110. An erase command may take 10 to 1000 times more time to execute than a write or a read command or 10 to 100 times more time to execute than a program command. For N banks 214, the bank interleave controller 344 may split the erase command into N commands, each to erase a virtual erase block of a bank 214a. While bank-0 214a is executing an erase command, the bus arbiter 420 may select other commands for execution on the other banks 214b-n. The bus arbiter 420 may also work with other components, such as the storage bus controller 348, the master controller 224, etc., to coordinate command execution among the buses. Coordinating execution of commands using the bus arbiter 420, bank controllers 418, queues 410, 412, 414, 416, and agents 402, 404, 406, 408 of the bank interleave controller 344 can dramatically increase performance over other solid-state storage systems without a bank interleave function.

In one embodiment, the solid-state controller 104 includes one bank interleave controller 344 that serves all of the storage elements 216, 218, 220 of the solid-state storage 110. In another embodiment, the solid-state controller 104 includes a bank interleave controller 344 for each row of storage elements 216a-m, 218a-m, 220a-m. For example, one bank interleave controller 344 serves one row of storage elements SSS 0.0-SSS 0.N 216a, 218a, 220a, a second bank interleave controller 344 serves a second row of storage elements SSS 1.0-SSS 1.N 216b, 218b, 220b, etc.

FIG. 4B is a schematic block diagram illustrating an alternate embodiment 401 of a bank interleave controller in the solid-state storage controller in accordance with the present invention. The components 210, 212, 340, 346, 348, 350, 402-430 depicted in the embodiment shown in FIG. 4B are substantially similar to the bank interleave apparatus 400 described in relation to FIG. 4A except that each bank 214 includes a single queue 432a-n and the read commands, write commands, erase commands, management commands, etc. for a bank (e.g. Bank-0 214a) are directed to a single queue 432a for the bank 214a. The queues 432, in one embodiment, are FIFO. In another embodiment, the queues 432 can have commands pulled from the queues 432 in an order other than the order they were stored. In another alternate embodiment (not shown), the read agent 402, write agent 404, erase agent 406, and management agent 408 may be combined into a single agent assigning commands to the appropriate queues 432a-n.

In another alternate embodiment (not shown), commands are stored in a single queue where the commands may be pulled from the queue in an order other than how they are stored so that the bank interleave controller 344 can execute a command on one bank 214a while other commands are executing on the remaining banks 214b-n. One of skill in the art will easily recognize other queue configurations and types to enable execution of a command on one bank 214a while other commands are executing on other banks 214b-n.

Storage-Specific Components

The solid-state storage controller 104 includes a synchronization buffer 346 that buffers commands and status messages sent and received from the solid-state storage 110. The synchronization buffer 346 is located at the boundary between the solid-state storage clock domain and the local bus clock domain and provides buffering to account for the clock domain differences. The synchronization buffer 346, write synchronization buffer 308, and read synchronization buffer 328 may be independent or may act together to buffer data, commands, status messages, etc. In the preferred embodiment, the synchronization buffer 346 is located where there are the fewest number of signals crossing the clock domains. One skilled in the art will recognize that synchronization between clock domains may be arbitrarily moved to other locations within the solid-state storage device 102 in order to optimize some aspect of design implementation.

The solid-state storage controller 104 includes a storage bus controller 348 that interprets and translates commands for data sent to and read from the solid-state storage 110 and status messages received from the solid-state storage 110 based on the type of solid-state storage 110. For example, the storage bus controller 348 may have different timing requirements for different types of storage, storage with different performance characteristics, storage from different manufacturers, etc. The storage bus controller 348 also sends control commands to the storage control bus 212.

In the preferred embodiment, the solid-state storage controller 104 includes a MUX 350 that comprises an array of multiplexers 350a-n where each multiplexer is dedicated to a row in the solid-state storage array 110. For example, multiplexer 350a is associated with solid-state storage elements 216a, 218a, 220a. MUX 350 routes the data from the write data pipeline 106 and commands from the storage bus controller 348 to the solid-state storage 110 via the storage I/O bus 210 and routes data and status messages from the solid-state storage 110 via the storage I/O bus 210 to the read data pipeline 106 and the control and status registers 340 through the storage bus controller 348, synchronization buffer 346, and bank interleave controller 344.

In the preferred embodiment, the solid-state storage controller 104 includes a MUX 350 for each row of solid-state storage elements (e.g. SSS 0.1 216a, SSS 0.2 218a, SSS 0.N 220a). A MUX 350 combines data from the write data pipeline 106 and commands sent to the solid-state storage 110 via the storage I/O bus 210 and separates data to be processed by the read data pipeline 108 from commands. Packets stored in the write buffer 320 are directed on busses out of the write buffer 320 through a write synchronization buffer 308 for each row of solid-state storage elements (SSS x.0 to SSS x.N 216, 218, 220) to the MUX 350 for each row of solid-state storage elements (SSS x.0 to SSS x.N 216, 218, 220). The commands and read data are received by the MUXes 350 from the storage I/O bus 210. The MUXes 350 also direct status messages to the storage bus controller 348.

The storage bus controller 348 includes a mapping module 424. The mapping module 424 maps a logical address of an erase block to one or more physical addresses of an erase block. For example, a solid-state storage 110 with an array of twenty storage elements (e.g. SSS 0.0 to SSS M.0 216) per block 214a may have a logical address for a particular erase block mapped to twenty physical addresses of the erase block, one physical address per storage element. Because the storage elements are accessed in parallel, erase blocks at the same position in each storage element in a row of storage elements 216a, 218a, 220a will share a physical address. To select one erase block (e.g. in storage element SSS 0.0 216a) instead of all erase blocks in the row (e.g. in storage elements SSS 0.0, 0.1, . . . 0.N 216a, 218a, 220a), one bank (in this case bank-0 214a) is selected.

This logical-to-physical mapping for erase blocks is beneficial because if one erase block becomes damaged or inaccessible, the mapping can be changed to map to another erase block. This mitigates the loss of losing an entire virtual erase block when one element's erase block is faulty. The remapping module 430 changes a mapping of a logical address of an erase block to one or more physical addresses of a virtual erase block (spread over the array of storage elements). For example, virtual erase block 1 may be mapped to erase block 1 of storage element SSS 0.0 216a, to erase block 1 of storage element SSS 1.0 216b, . . . , and to storage element M.0 216m, virtual erase block 2 may be mapped to erase block 2 of storage element SSS 0.1 218a, to erase block 2 of storage element SSS 1.1 218b, . . . , and to storage element M.1 218m, etc.

If erase block 1 of a storage element SSS0.0 216a is damaged, experiencing errors due to wear, etc., or cannot be used for some reason, the remapping module could change the logical-to-physical mapping for the logical address that pointed to erase block 1 of virtual erase block 1. If a spare erase block (call it erase block 221) of storage element SSS 0.0 216a is available and currently not mapped, the remapping module could change the mapping of virtual erase block 1 to point to erase block 221 of storage element SSS 0.0 216a, while continuing to point to erase block 1 of storage element SSS 1.0 216b, erase block 1 of storage element SSS 2.0 (not shown) . . . , and to storage element M.0 216m. The mapping module 424 or remapping module 430 could map erase blocks in a prescribed order (virtual erase block 1 to erase block 1 of the storage elements, virtual erase block 2 to erase block 2 of the storage elements, etc.) or may map erase blocks of the storage elements 216, 218, 220 in another order based on some other criteria.

In one embodiment, the erase blocks could be grouped by access time. Grouping by access time, meaning time to execute a command, such as programming (writing) data into pages of specific erase blocks, can level command completion so that a command executed across the erase blocks of a virtual erase block is not limited by the slowest erase block. In other embodiments, the erase blocks may be grouped by wear level, health, etc. One of skill in the art will recognize other factors to consider when mapping or remapping erase blocks.

In one embodiment, the storage bus controller 348 includes a status capture module 426 that receives status messages from the solid-state storage 110 and sends the status messages to the status MUX 422. In another embodiment, when the solid-state storage 110 is flash memory, the storage bus controller 348 includes a NAND bus controller 428. The NAND bus controller 428 directs commands from the read and write data pipelines 106, 108 to the correct location in the solid-state storage 110, coordinates timing of command execution based on characteristics of the flash memory, etc. If the solid-state storage 110 is another solid-state storage type, the NAND bus controller 428 would be replaced by a bus controller specific to the storage type. One of skill in the art will recognize other functions of a NAND bus controller 428.

Flow Charts

Figure 5:
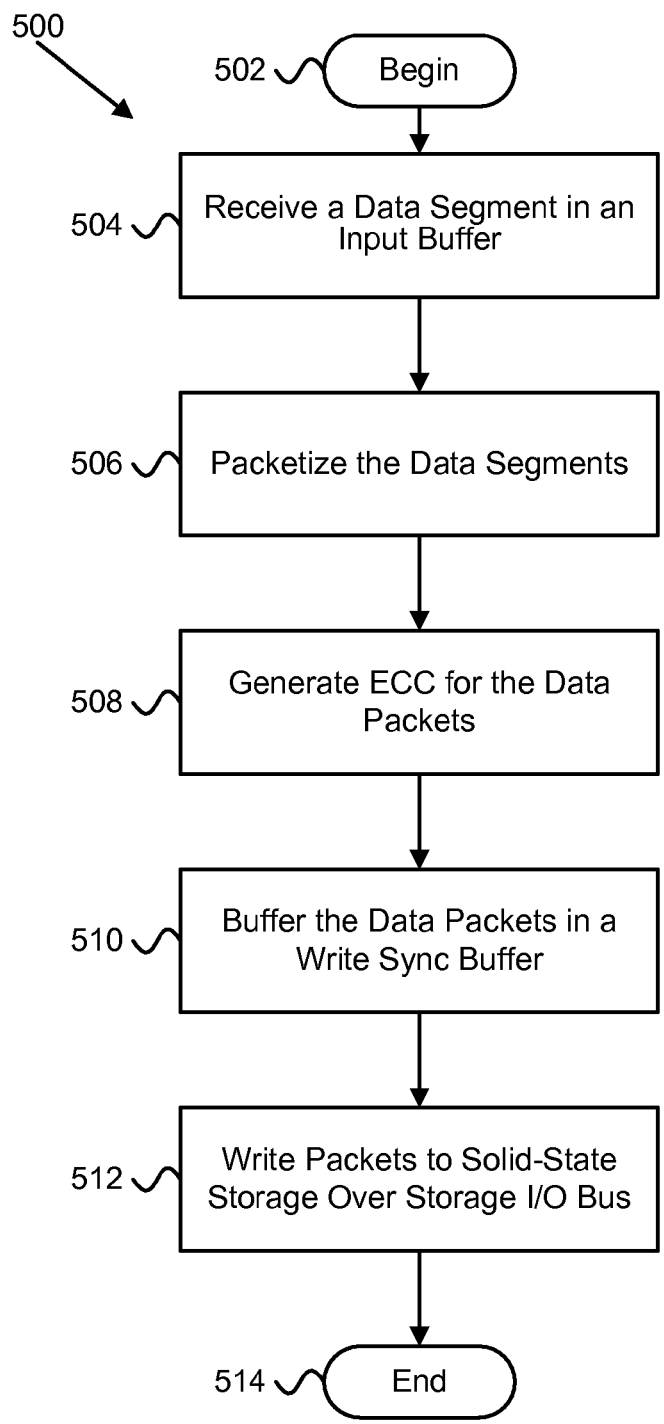
FIG. 5 is a schematic flow chart diagram illustrating one embodiment of a method for managing data in a solid-state storage device using a data pipeline in accordance with the present invention.

FIG. 5 is a schematic flow chart diagram illustrating one embodiment of a method 500 for managing data in a solid-state storage device 102 using a data pipeline in accordance with the present invention. The method 500 begins 502 and the input buffer 306 receives 504 one or more data segments to be written to the solid-state storage 110. The one or more data segments typically include at least a portion of an object but may be an entire object. The packetizer 302 may create one or more object specific packets in conjunction with an object. The packetizer 302 adds a header to each packet which typically includes the length of the packet and a sequence number for the packet within the object. The packetizer 302 receives 504 the one or more data or metadata segments that were stored in the input buffer 306 and packetizes 506 the one or more data or metadata segments by creating one or more packets sized for the solid-state storage 110 where each packet includes one header and data from the one or more segments.

Typically, a first packet includes an object identifier that identifies the object for which the packet was created. A second packet may include a header with information used by the solid-state storage device 102 to associate the second packet to the object identified in the first packet and offset information locating the second packet within the object, and data. The solid-state storage device controller 202 manages the bank 214 and physical area to which the packets are streamed.

The ECC generator 304 receives a packet from the packetizer 302 and generates 508 ECC for the data packets. Typically, there is no fixed relationship between packets and ECC blocks. An ECC block may comprise one or more packets. A packet may comprise one or more ECC blocks. A packet may start and end anywhere within an ECC block. A packet may start anywhere in a first ECC block and end anywhere in a subsequent ECC block.

The write synchronization buffer 308 buffers 510 the packets as distributed within the corresponding ECC blocks prior to writing ECC blocks to the solid-state storage 110 and then the solid-state storage controller 104 writes 512 the data at an appropriate time considering clock domain differences, and the method 500 ends 514. The write synch buffer 308 is located at the boundary between a local clock domain and a solid-state storage 110 clock domain. Note that the method 500 describes receiving one or more data segments and writing one or more data packets for convenience, but typically a stream of data segments is received and a group. Typically a number of ECC blocks comprising a complete virtual page of solid-state storage 110 are written to the solid-state storage 110. Typically the packetizer 302 receives data segments of one size and generates packets of another size. This necessarily requires data or metadata segments or parts of data or metadata segments to be combined to form data packets to capture all of the data of the segments into packets.

Figure 6:
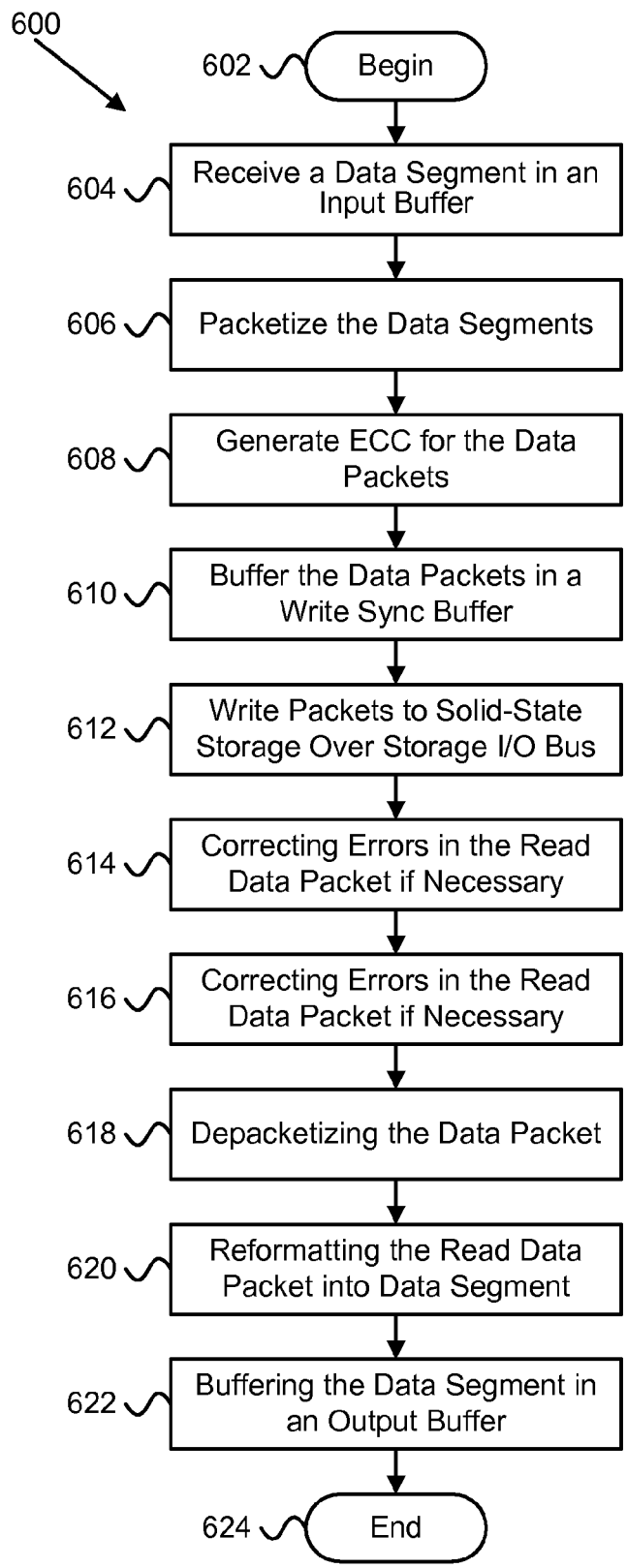
FIG. 6 is a schematic flow chart diagram illustrating another embodiment of a method for managing data in a solid-state storage device using a data pipeline in accordance with the present invention.

FIG. 6 is a schematic flow chart diagram illustrating another embodiment of a method 600 for managing data in a solid-state storage device 102 using a data pipeline in accordance with the present invention. The method 600 begins 602 and the input buffer 306 receives 604 one or more data or metadata segments to be written to the solid-state storage 110. The packetizer 302 adds a header to each packet which typically includes the length of the packet within the object. The packetizer 302 receives 604 the one or more segments that were stored in the input buffer 306 and packetizes 606 the one or more segments by creating one or more packets sized for the solid-state storage 110 where each packet includes a header and data from the one or more segments.

The ECC generator 304 receives a packet from the packetizer 302 and generates 608 one or more ECC blocks for the packets. The write synchronization buffer 308 buffers 610 the packets as distributed within the corresponding ECC blocks prior to writing ECC blocks to the solid-state storage 110 and then the solid-state storage controller 104 writes 612 the data at an appropriate time considering clock domain differences. When data is requested from the solid-state storage 110, ECC blocks comprising one or more data packets are read into the read synchronization buffer 328 and buffered 614. The ECC blocks of the packet are received over the storage I/O bus 210. Since the storage I/O bus 210 is bi-directional, when data is read, write operations, command operations, etc. are halted.

The ECC correction module 322 receives the ECC blocks of the requested packets held in the read synchronization buffer 328 and corrects 616 errors within each ECC block as necessary. If the ECC correction module 322 determines that one or more errors exist in an ECC block and the errors are correctable using the ECC syndrome, the ECC correction module 322 corrects 616 the error in the ECC block. If the ECC correction module 322 determines that a detected error is not correctable using the ECC, the ECC correction module 322 sends an interrupt.

The depacketizer 324 receives 618 the requested packet after the ECC correction module 322 corrects any errors and depacketizes 618 the packets by checking and removing the packet header of each packet. The alignment module 326 receives packets after depacketizing, removes unwanted data, and re-formats 620 the data packets as data or metadata segments of an object in a form compatible with the device requesting the segment or object. The output buffer 330 receives requested packets after depacketizing and buffers 622 the packets prior to transmission to the requesting device, and the method 600 ends 624.

Figure 7:
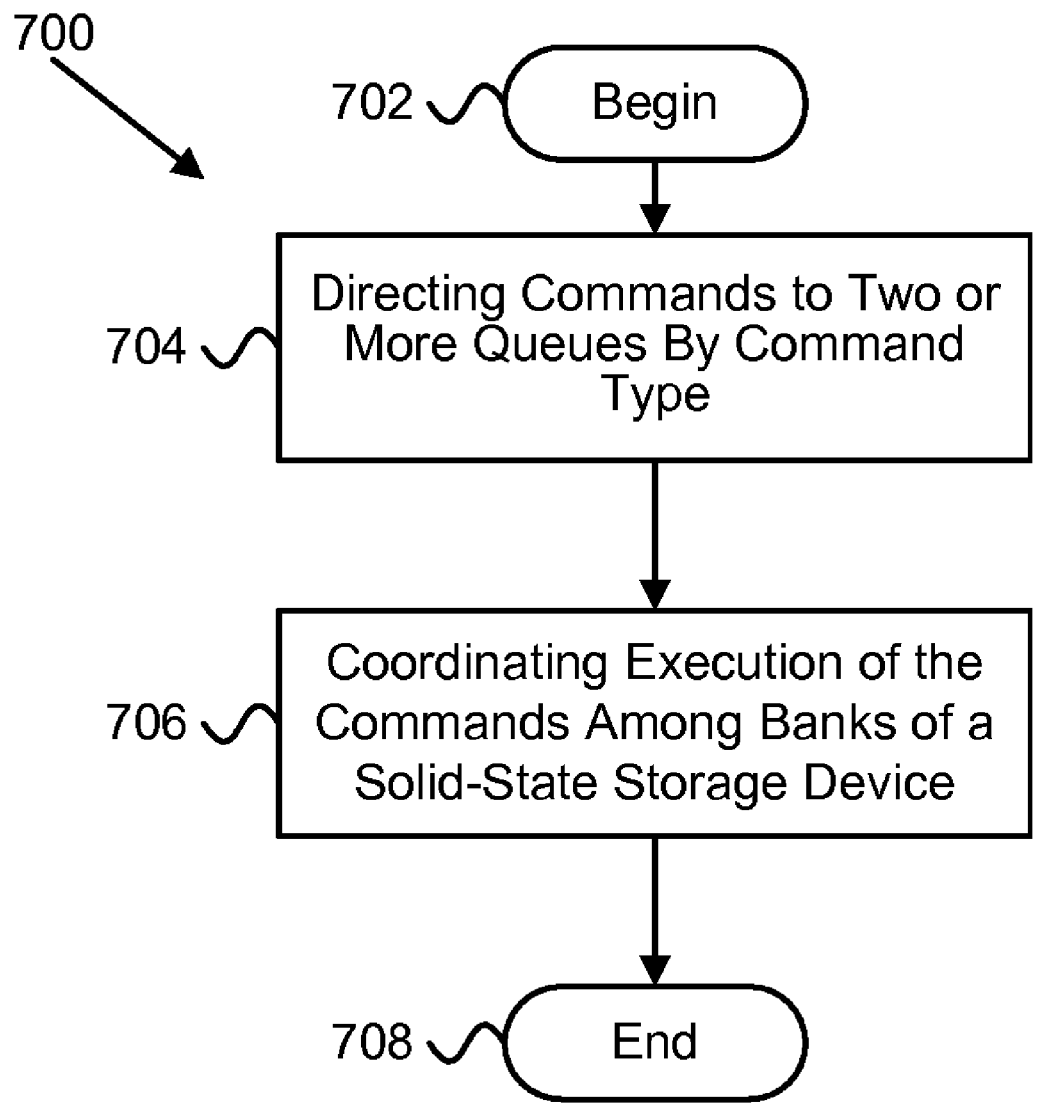
FIG. 7 is a schematic flow chart diagram illustrating an embodiment of a method for managing data in a solid-state storage device using a bank interleave in accordance with the present invention.

FIG. 7 is a schematic flow chart diagram illustrating an embodiment of a method 700 for managing data in a solid-state storage device 102 using a bank interleave in accordance with the present invention. The method 600 begins 602 and the bank interleave controller 344 directs 604 one or more commands to two or more queues 410, 412, 414, 416. Typically the agents 402, 404, 406, 408 direct 604 the commands to the queues 410, 412, 414, 416 by command type. Each set of queues 410, 412, 414, 416 includes a queue for each command type. The bank interleave controller 344 coordinates 606 among the banks 214 execution of the commands stored in the queues 410, 412, 414, 416 so that a command of a first type executes on one bank 214a while a command of a second type executes on a second bank 214b, and the method 600 ends 608.

Storage Space Recovery

Figure 8:
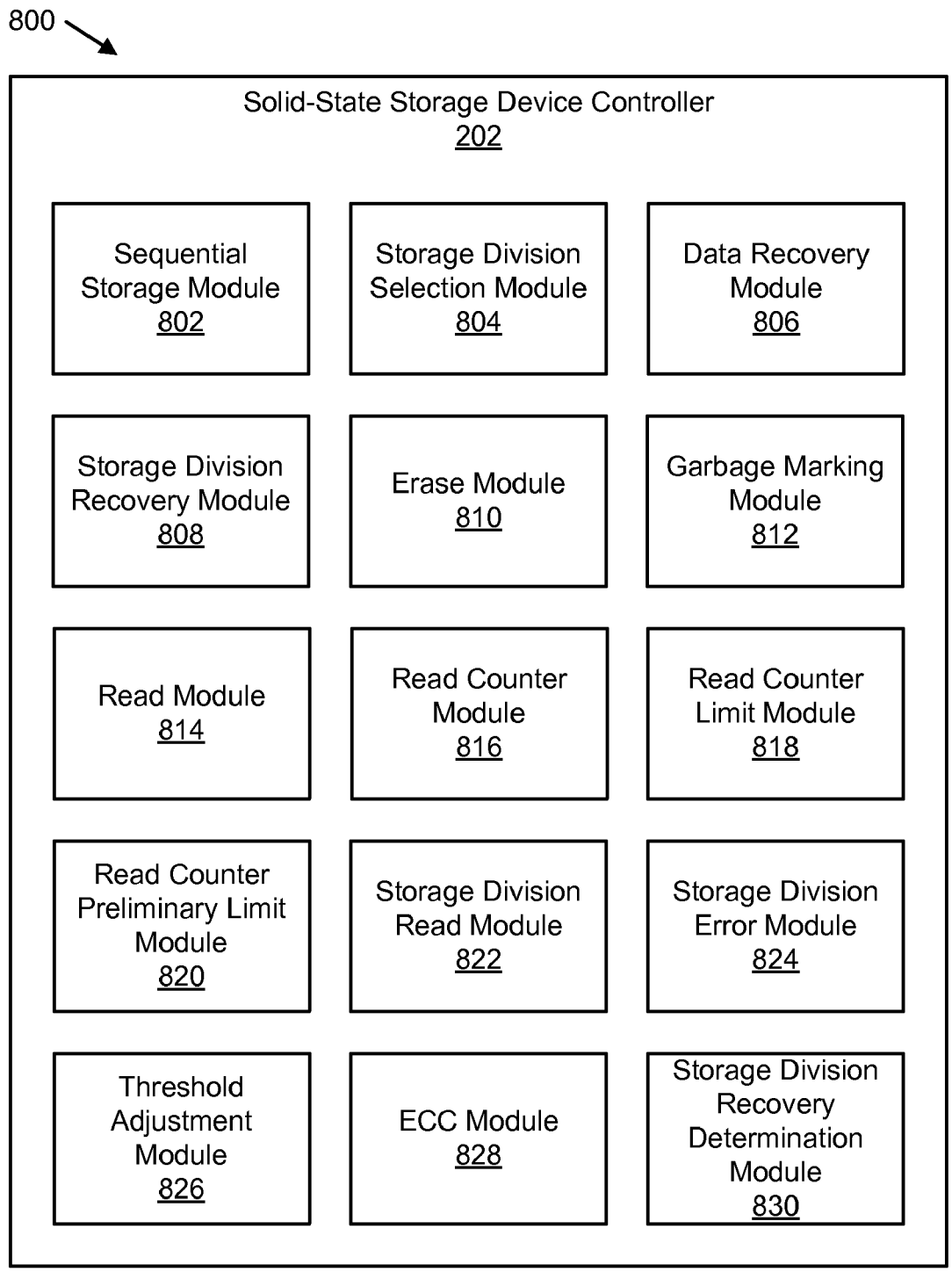
FIG. 8 is a schematic block diagram illustrating one embodiment of an apparatus for garbage collection in a solid-state storage device in accordance with the present invention.

FIG. 8 is a schematic block diagram illustrating one embodiment of an apparatus 800 for garbage collection in a solid-state storage device 102 in accordance with the present invention. The apparatus 800 includes a sequential storage module 802, a storage division selection module 804, a data recovery module 806, and a storage division recovery module 808, which are described below. In other embodiments, the apparatus 800 includes a garbage marking module 810 and an erase module 812.

The apparatus 800 includes a sequential storage module 802 that sequentially writes data packets in a page within a storage division. The packets are sequentially stored whether they are new packets or modified packets. Modified packets are in this embodiment are typically not written back to a location where they were previously stored. In one embodiment, the sequential storage module 802 writes a packet to a first location in a page of a storage division, then to the next location in the page, and to the next, and the next, until the page is filled. The sequential storage module 802 then starts to fill the next page in the storage division. This continues until the storage division is filled.

In a preferred embodiment, the sequential storage module 802 starts writing packets to storage write buffers in the storage elements (e.g. SSS 0.0 to SSS M.0 216) of a bank (bank-0 214a). When the storage write buffers are full, the solid-state storage controller 104 causes the data in the storage write buffers to be programmed into designated pages within the storage elements 216 of the bank 214a. Then another bank (e.g. bank-1 214b) is selected and the sequential storage module 802 starts writing packets to storage write buffers of the storage elements 218 of the bank 214*b* while the first bank-0 is programming the designated pages. When the storage write buffers of this bank 214*b* are full, the contents of the storage write buffers are programmed into another designated page in each storage element 218. This process is efficient because while one bank 214*a* is programming a page, storage write buffers of another bank 214*b* can be filling.

The storage division includes a portion of a solid-state storage 110 in a solid-state storage device 102. Typically the storage division is an erase block. For flash memory, an erase operation on an erase block writes ones to every bit in the erase block by charging each cell. This is a lengthy process compared to a program operation which starts with a location being all ones, and as data is written, some bits are changed to zero by discharging the cells written with a zero. However, where the solid-state storage 110 is not flash memory or has flash memory where an erase cycle takes a similar amount of time as other operations, such as a read or a program, the storage division may not be required to be erased.

As used herein, a storage division is equivalent in area to an erase block but may or may not be erased. Where erase block is used herein, an erase block may refer to a particular area of a designated size within a storage element (e.g. SSS 0.0 216*a*) and typically includes a certain quantity of pages. Where "erase block" is used in conjunction with flash memory, it is typically a storage division that is erased prior to being written. Where "erase block" is used with "solid-state storage," it may or may not be erased. As used herein, an erase block may include one erase block or a group of erase blocks with one erase block in each of a row of storage elements (e.g. SSS 0.0 to SSS M.0 216*a-n*), which may also be referred to herein as a virtual erase block. When referring to the logical construct associated with the virtual erase block, the erase blocks may be referred to herein as a logical erase block ("LEB").

Typically, the packets are sequentially stored by order of processing. In one embodiment, where a write data pipeline 106 is used, the sequential storage module 802 stores packets in the order that they come out of the write data pipeline 106. This order may be a result of data segments arriving from a requesting device 155 mixed with packets of valid data that are being read from another storage division as valid data is being recovered from a storage division during a recovery operation as explained below. Re-routing recovered, valid data packets to the write data pipeline 106 may include the garbage collector bypass 316 as described above in relation to the solid-state storage controller 104 of FIG. 3.

The apparatus 800 includes a storage division selection module 804 that selects a storage division for recovery. Selecting a storage division for recovery may be to reuse the storage division by the sequential storage module 802 for writing data, thus adding the recovered storage division to the storage pool, or to recover valid data from the storage division after determining that the storage division is failing, unreliable, should be refreshed, or other reason to take the storage division temporarily or permanently out of the storage pool. In another embodiment, the storage division selection module 804 selects a storage division for recovery by identifying a storage division or erase block with a high amount of invalid data.

In another embodiment, the storage division selection module 804 selects a storage division for recovery by identifying a storage division or erase block with a low amount of wear. For example, identifying a storage division or erase block with a low amount of wear may include identifying a storage division with a low amount of invalid data, a low number of erase cycles, low bit error rate, or low program count (low number of times a page of data in a buffer is written to a page in the storage division; program count may be measured from when the device was manufactured, from when the storage division was last erased, from other arbitrary events, and from combinations of these). The storage division selection module 804 may also use any combination of the above or other parameters to determine a storage division with a low amount of wear. Selecting a storage division for recovery by determining a storage division with a low amount of wear may be desirable to find storage divisions that are under used, may be recovered for wear leveling, etc.

In another embodiment, the storage division selection module 804 selects a storage division for recovery by identifying a storage division or erase block with a high amount of wear. For example, identifying a storage division or erase block with a high amount of wear may include identifying a storage division with a high number of erase cycles, high bit error rate, a storage division with a non-recoverable ECC block, or high program count. The storage division selection module 804 may also use any combination of the above or other parameters to determine a storage division with a high amount of wear. Selecting a storage division for recovery by determining a storage division with a high amount of wear may be desirable to find storage divisions that are over used, may be recovered by refreshing the storage division using an erase cycle, etc. or to retire the storage division from service as being unusable.

The apparatus 800 includes a data recovery module 806 that reads valid data packets from the storage division selected for recovery, queues the valid data packets with other data packets to be written sequentially by the sequential storage module 802, and updates an index with a new physical address of the valid data written by the sequential storage module 802. Typically, the index is the logical index mapping logical identifiers to physical addresses of where packets derived from the data object, file, or other data construct are stored in the solid-state storage 110.

In one embodiment the apparatus 800 includes a storage division recovery module 808 that prepares the storage division for use or reuse and marks the storage division as available to the sequential storage module 802 for sequentially writing data packets after the data recovery module 806 has completed copying valid data from the storage division. In another embodiment, the apparatus 800 includes a storage division recovery module 808 that marks the storage division selected for recovery as unavailable for storing data. Typically this is due to the storage division selection module 804 identifying a storage division or erase block with a high amount of wear such that the storage division or erase block is not in condition to be used for reliable data storage.

In one embodiment, the apparatus 800 is in a solid-state storage device controller 202 of a solid-state storage device 102. In another embodiment, the apparatus 800 controls a solid-state storage device controller 202. In another embodiment, a portion of the apparatus 800 is in a solid-state storage device controller 202. In another embodiment, the logical index updated by the data recovery module 806 is also located in the solid-state storage device controller 202

In one embodiment, the storage division is an erase block and the apparatus 800 includes an erase module 810 that erases an erase block selected for recovery after the data recovery module 806 has copied valid data packets from the selected erase block and before the storage division recovery module 808 marks the erase block as available. For flash memory and other solid-state storage with an erase operation taking much longer than read or write operations, erasing a data block prior to making it available for writing new data is desirable for efficient operation. Where the solid-state storage 110 is arranged in banks 214, the erase operation by the erase module 810 may be executed on one bank while other banks are executing reads, writes, or other operations.

In one embodiment, the apparatus 800 includes a garbage marking module 812 that identifies a data packet in a storage division as invalid in response to an operation indicating that the data packet is no longer valid. For example, if a data packet is deleted, the garbage marking module 812 may identify the data packet as invalid. A read-modify-write operation is another way for a data packet to be identified as invalid. In one embodiment, the garbage marking module 812 may identify the data packet as invalid by updating an index. In another embodiment, the garbage marking module 812 may identify the data packet as invalid by storing another data packet that indicates that the invalid data packet has been deleted. This is advantageous because storing, in the solid-state storage 110, information that the data packet has been deleted allows the logical index reconstruction module 262 or similar module to reconstruct the logical index with an entry indicating that the invalid data packet has been deleted.

In one embodiment, the apparatus 800 may be utilized to fill the remainder of a virtual page of data following a flush command in order to improve overall performance, where the flush command halts data flowing into the write pipeline 106 until the write pipeline 106 empties and all packets have been permanently written into non-volatile solid-state storage 110. This has the benefit of reducing the amount of garbage collection required, the amount of time used to erase storage divisions, and the amount of time required to program virtual pages. For example, a flush command may be received when only one small packet is prepared for writing into the virtual page of the solid-state storage 100. Programming this nearly empty virtual page might result in a need to immediately recover the wasted space, causing the valid data within the storage division to be unnecessarily garbage collected and the storage division erased, recovered and returned to the pool of available space for writing by the sequential storage module 802.

Marking the data packet as invalid rather than actually erasing an invalid data packet is efficient because, as mentioned above, for flash memory and other similar storage an erase operation takes a significant amount of time. Allowing a garbage collection system, as described in the apparatus 800, to operate autonomously within the solid-state storage 110 provides a way to separate erase operations from reads, writes, and other faster operations so that the solid-state storage device 102 can operate much faster than many other solid-state storage systems or data storage devices.

In one embodiment, the apparatus 800 includes a sequential storage module 802, a storage division selection module 804, a data recovery module 806, and a storage division recovery module 808, which are described below. In other embodiments, the apparatus 800 includes a garbage marking module 810 and an erase module 812, which are substantially similar to those described above and with additional functionality as described below. In the embodiment, the apparatus 800 also includes one or more of a read module 814, a read counter module 816, a read counter limit module 818, a read counter preliminary limit module 820, a storage division read module 822, a storage division error module 824, a threshold adjustment module 826, an ECC module 828, and a storage division recovery determination module 830, which are described below.

The apparatus 800, in one embodiment, includes a read module 814 that reads at least a portion of a data packet stored in a first storage division where the first storage division is at least a portion of the solid-state storage 110 in the solid-state storage device 102. The read module 814 may include any read operation available to the solid-state storage controller 104 for reading data stored on the solid-state storage 110. In a preferred embodiment, the read module 814 encompasses read operations native to the solid-state storage controller 104.

The apparatus 800, in one embodiment, includes a read counter module 816 that increments a read counter in conjunction with the read module 814 reading data stored in the first storage division. The read counter corresponds to the first storage division and each storage division in the solid-state storage device 102 includes a corresponding, separate read counter. In one embodiment, a storage division corresponds to an erase block such that there is a read counter for every erase block. In another embodiment, the read counter corresponds to a logical erase block. In other embodiments, the storage division may correspond to some other unit of solid-state storage 110 or a read counter may be assigned to more than one storage division, or less than one storage division. One of skill in the art will recognize other correlations between storage divisions and read counters.

In one embodiment, the apparatus 800 includes a read counter limit module 818 that determines if the read counter corresponding to the first storage division has reached and/or exceeded a maximum read threshold. If the read counter for the first storage division has reached and/or exceeded the maximum read threshold, the storage division selection module 804 marks the first storage division for recovery. The data recovery module 806 then reads valid data packets from the first storage division, stores the valid data packets in a second storage division, and updates the logical index or other index with a new physical address of the moved data packets. The second storage division is typically not contiguous with the first storage division. The index includes a mapping of physical addresses of the data packets stored in the solid-state storage 110 to logical identifiers corresponding to the data packets. The logical identifiers may be file names, object identifiers, logical block addresses, addresses within a thinly provisioned address space, and the like. The sequential storage module 802 may sequentially write the data packets to the second storage division.

The data packets are stored sequentially on the solid-state storage device 102 in an order that the data packets are received from one or more clients 114 and from a storage division marked for recovery such that the sequentially stored data packets are stored contiguously and include the data packets received from the one or more clients interspersed with the data packets received from a storage division marked for recovery.

Keeping track of when data is read is beneficial to countering data corruption as a result of the read disturb phenomenon described above in the Background section. Read disturb is a known phenomenon that affects data integrity, however, bit flips resulting from read disturb are often transient, soft errors that typically do not cause permanent damage. Storage subject to read disturb that causes bit errors can typically be reused after a storage recovery process without an expectation of further bit errors in the recovered storage unless the recovered storage is subject to further read disturb, wears out, or is damaged in some way. The apparatus 800 beneficially tracks read operations occurring in a storage division so that if a high number of reads is encountered in the storage division, the storage division can then be recovered before serious data corruption occurs as a result of the read operations.

The apparatus 800, in one embodiment, includes a read counter preliminary limit module 820, a storage division read module 822, and a storage division error module 824. The read counter preliminary limit module 820 determines if the read counter corresponding to the first storage division has reached a preliminary read threshold. Typically the preliminary read threshold is set lower than the maximum read threshold at a level where a read count for the first storage division may be high enough where error testing of the first storage division is desirable.

The storage division read module 822 reads at least a portion of the data locations within the first storage division if the read counter preliminary limit module 820 determines that the read counter corresponding to the first storage division has reached or exceeded the preliminary read threshold. Typically, the storage division read module 822 would read one or more ECC blocks in one or more erase blocks. In another embodiment, the storage division read module 822 may read a logical erase block comprised of multiple physical erase blocks. In one embodiment, the storage division read module 822 reads an ECC block or logical ECC block in one or more logical erase blocks.

The storage division read module 822 reads the data locations in the first storage division to determine if errors exist in data stored in the storage division. An error may be a bit error, errors in a column of data, errors in a row of data, errors clustered together, and the like. Other options for determining errors in a storage division are described in U.S. Provisional Patent Application No. 61/112,955 entitled "Apparatus, System, and Method for Predicting Errors in Solid-State Storage" to David Flynn, et al., filed Nov. 10, 2008 [hereinafter "'955 Application"], which is hereinafter incorporated by reference.

In one embodiment, the storage division error module 824 determines if errors identified by the storage division read module 822 has reached and/or exceeded an error threshold. If the storage division error module 824 determines that the errors identified by the storage division read module 822 has reached and/or exceeded the error threshold, the storage division selection module 804 selects the first storage division for recovery. In one embodiment, the error threshold includes a number of errors. In another embodiment the error threshold includes a number of errors in a column of data, a row of data, etc. In another embodiment, the error threshold includes some other error criteria and the storage division error module 824 determines if the errors in the storage division meets the criteria. One of skill in the art will recognize other ways for the storage division error module 824 to determine if the errors in the first storage division meet or exceed an error threshold.

In one embodiment, when the read counter preliminary limit module 820 determines that the read counter of the first storage division has reached the preliminary read threshold, the storage division error module 824 increases the preliminary read threshold by a predetermined amount. By increasing the preliminary read threshold, the storage division read module 822 postpones the next time that storage division error module 824 reads the data locations in the first storage division to determine if errors exist in the first storage division. The storage division read module 822 may raise the preliminary read threshold such that the storage division read module 822 reads the first storage division one time or multiple times before the read counter for the first storage division exceeds the maximum read threshold.

A preliminary read threshold for each storage division is preferred so that when the storage division read module 822 determines that the read counter for a storage division has reached the preliminary read threshold for that storage division, the preliminary read threshold for the storage division can be increased independent of preliminary thresholds for other storage divisions.

In another embodiment, when the read counter limit module 818 determines that the read counter for the first storage division has reached the maximum read threshold, the data recovery module 806 resets the read counter for the first storage division. This allows the read counter to start over once the first storage division has been recovered after the storage recovery process described in relation to FIG. 8.

In one embodiment, the apparatus 800 includes a threshold adjustment module 826 that adjusts at least the maximum read threshold. The threshold adjustment module 826 may adjust one or more thresholds based on internal data, external data, and/or user input. The threshold adjustment module 826 may also adjust the preliminary read threshold or other thresholds. The threshold adjustment module 826 may adjust the maximum and preliminary read thresholds or other thresholds using any number of parameters. The changes to the thresholds made by the threshold adjustment module 826 may be used as a basis to adjust other thresholds within a logical or physical domain.

In one embodiment, each storage division includes at least a maximum read threshold. Each storage division may also include a preliminary read threshold. The threshold adjustment module 826 is capable of adjusting each threshold based on configuration and location of the storage division. Test data or other known configuration limitation may be used to adjust the individual thresholds. One of skill in the art will appreciate other ways that the threshold adjustment module 826 may be used to adjust individual thresholds for each storage division, for a group of storage divisions, etc.

For example, the threshold adjustment module 826 may adjust one or more thresholds based on an amount of time that the solid-state storage device is in operation, a number of retired storage divisions or erase blocks, a number of retired logical storage divisions or logical erase blocks, a number of erase cycles, a number of program operations, a read count, an error count, etc. for the storage division, erase block, logical erase block, or the like, operating temperature, or other environmental condition. For example, read data may have a number of ECC errors that exceeds a threshold and the threshold adjustment module 826 may adjust one or more thresholds to reduce the number of ECC errors in future reads. In another example, the thresholds for multiple logical erase blocks may correspond to a single die, and a detected high error rate for that die may cause the thresholds for all logical erase blocks associated with that die to be adjusted. For example, the threshold adjustment module 826 may adjust the maximum and/or preliminary read thresholds downward if the operating temperature is high or the number or erase cycles is high.

In another example, the threshold adjustment module 826 may adjust one or more thresholds based on a number of times the storage division selection module 804 selected a storage division for recovery based on a number of errors found in a storage division, an erase block, a logical storage division, logical erase block, on one or more chips, on one or more die, etc. In this example, for instance the maximum and/or preliminary read thresholds may be influenced by the errors identified by the storage division read module 822. In another example, statistical data on solid-state storage life, parameters, heuristics, rules, and/or algorithms related to the solid-state storage life expectancy may be used by the threshold adjustment module 826 to adjust one or more thresholds.

In other embodiments, external data and or parameters may be used by the threshold adjustment module 826 to adjust the thresholds. For example, the threshold adjustment module 826 may adjust one or more thresholds based on information from a management system. In the example, the information may include information derived from one or more of test data related to solid-state storage, data collected from solid-state storage in use, and data from a solid-state storage supplier. Life expectancy curves may be received from a manufacturer and may be used by the threshold adjustment module 826 to adjust the maximum read threshold or other thresholds.

Probability of failure data or curves may be used by the threshold adjustment module 826 to adjust the maximum and/or preliminary read thresholds in steps as the solid-state storage 110 ages, is read a number times, etc. In another embodiment, the threshold adjustment module 826 may adjust the maximum and/or preliminary read thresholds based on test data, such as qualification testing of the solid-state storage device 102 or a similar device, test data from a manufacturer, test data that is configuration dependent, etc.

In other embodiments, the threshold adjustment module 826 may adjust the maximum and/or preliminary read thresholds based on user input. For example, a customer may require a particular confidence factor that data received by a client 114 as a result of a read request is error free. Error free data may be read error free or data may contain a number of errors that are correctable using ECC. For example, one client 114 may require a low confidence factor for a gaming application while another client 114 may require a higher confidence factor for a mission critical data application. The threshold adjustment module 826 may use user input, internal data, external data, other data, or a combination to adjust the maximum read threshold, the preliminary read threshold, or other threshold. One of skill in the art will recognize other ways for the threshold adjustment module 826 to adjust thresholds.

In one embodiment, the apparatus 800 includes an ECC module 828 reads one or more ECC blocks within the first storage block and then determines that the ECC blocks have a number of errors that exceeds one or more correction thresholds. The storage division selection module 804 then selects the first storage division for recovery if the number of errors exceeds the one or more correction thresholds. Reading and testing ECC blocks is described more fully in the '955 Application.

The ECC module 828 may determines that the ECC blocks exceed the correction thresholds in a number of different ways. For example, the ECC module 828 may determine a mean number of errors, a median number of errors, a distribution of errors, a sum of errors in the ECC blocks, etc. The ECC module 828 may, in another example, determine that at least one ECC block exceeds a correction threshold and this may be sufficient for the storage division selection module 804 to select the storage division for recovery. In another example, the ECC module 828 may determine that one or more ECC blocks exceeds a first correction threshold and a total number of errors of the one or more ECC blocks exceeds a second correction threshold. In another embodiment, other correction mechanisms such as those described in U.S. Provisional Patent Application No. 61/054,055 entitled, Apparatus, System, and Method for Detecting and Replacing Failed Data Storage, for David Flynn, et al., filed May 16, 2008, which is incorporated herein by reference, may be exercised before or after ECC threshold comparisons are made. Other tests may be devised for the ECC module 828 to determine that the ECC blocks may exceed the correction thresholds.

In one embodiment, the apparatus 800 includes a storage division recovery determination module 830 that determines if the first storage division is in a condition to be available for writing data packets after the data recovery module 806 completes copying valid data from the first storage division. The storage division recovery determination module 830 analyzes the recovered storage division to determine if the storage division is suitable to return to the storage pool of available storage divisions.

The storage division recovery determination module 830 may use analysis from the ECC module 828, storage division read module 822, storage division error module 824, or other module to analyze a storage division. For example, if storage division recovery determination module 830 analyzes a storage division and determines that the storage division contains errors, is damaged, etc. the storage division recovery determination module 830 may deem the storage division unsuitable for further use and may retire the storage division. Other methods of determining that a storage division should be retired are described in the '955 Application.

If the storage division recovery determination module 830 determines that the first storage division is suitable for use, the storage division recovery module 808 may then mark the first storage division available for writing data packets and data storage. The sequential storage module 802 may then store data packets sequentially in the first storage division.

Figure 9:
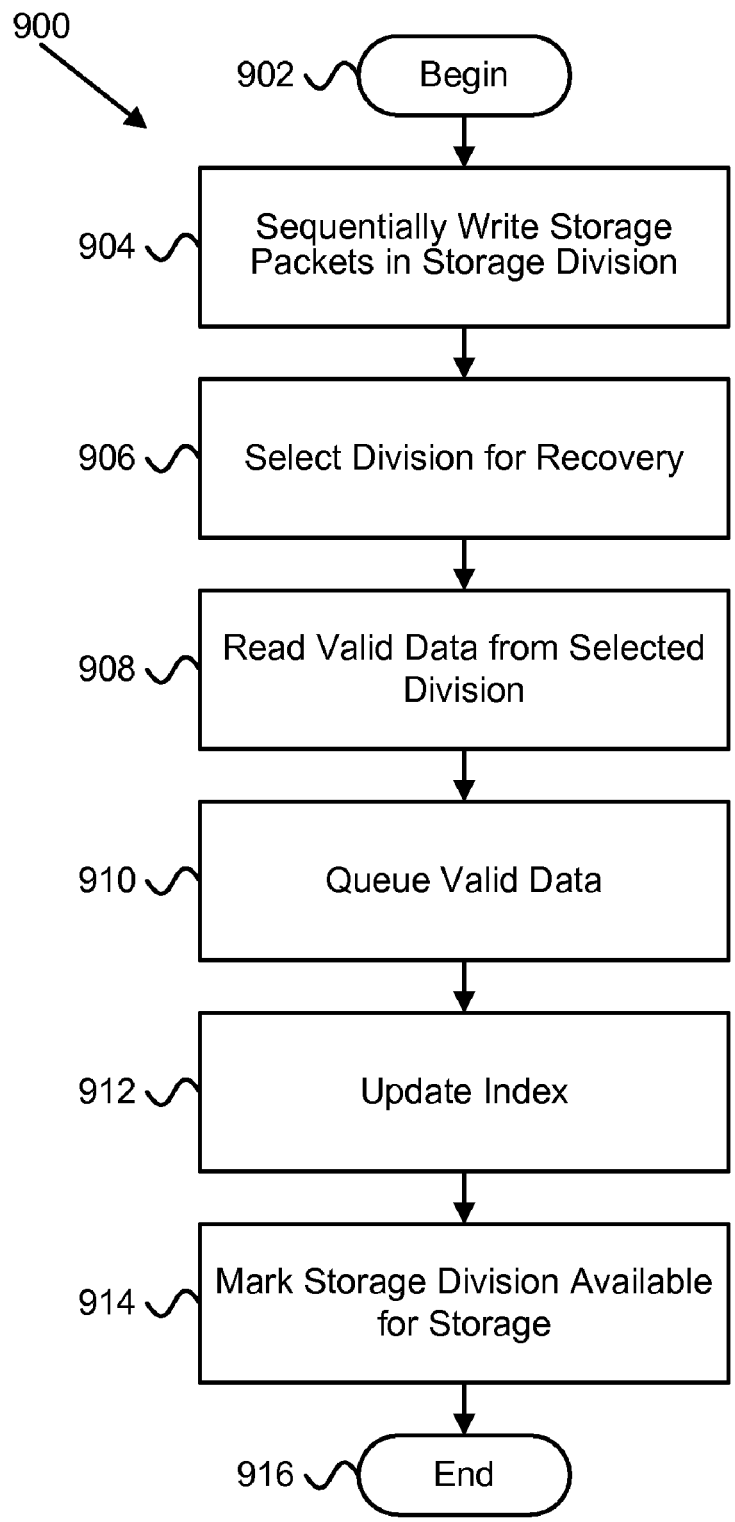
FIG. 9 is a schematic flow chart diagram illustrating one embodiment of a method for garbage collection in a solid state storage device in accordance with the present invention.

FIG. 9 is a schematic flow chart diagram illustrating an embodiment of a method 900 for storage recovery in accordance with the present invention. The method 900 begins 902 and the sequential storage module 802 sequentially writes 904 data packets in a storage division. The storage division is a portion of a solid-state storage 110 in a solid-state storage device 102. Typically a storage division is an erase block. The data packets are derived from an object, file, or other data construct and the data packets are sequentially stored by order of processing.

The storage division selection module 804 selects 906 a storage division for recovery and the data recovery module 806 reads 908 valid data packets from the storage division selected for recovery. Typically valid data packets are data packets that have not been marked for erasure or deletion or some other invalid data marking and are considered valid or "good" data. The data recovery module 806 queues 910 the valid data packets with other data packets scheduled to be written sequentially by the sequential storage module 802. The data recovery module 806 updates 912 a logical index with a new physical address of the valid data written by the sequential storage module 802. The logical index includes a mapping of physical addresses of data packets to logical identifiers. The data packets are those stored in stored in the solid-state storage 110 and the logical identifiers correspond to the data packets.

After the data recovery module 806 completes copying valid data from the storage division, the storage division recovery module 808 marks 914 the storage division selected for recovery as available to the sequential storage module 802 for sequentially writing data packets and the method 900 ends 916.

Figure 10:
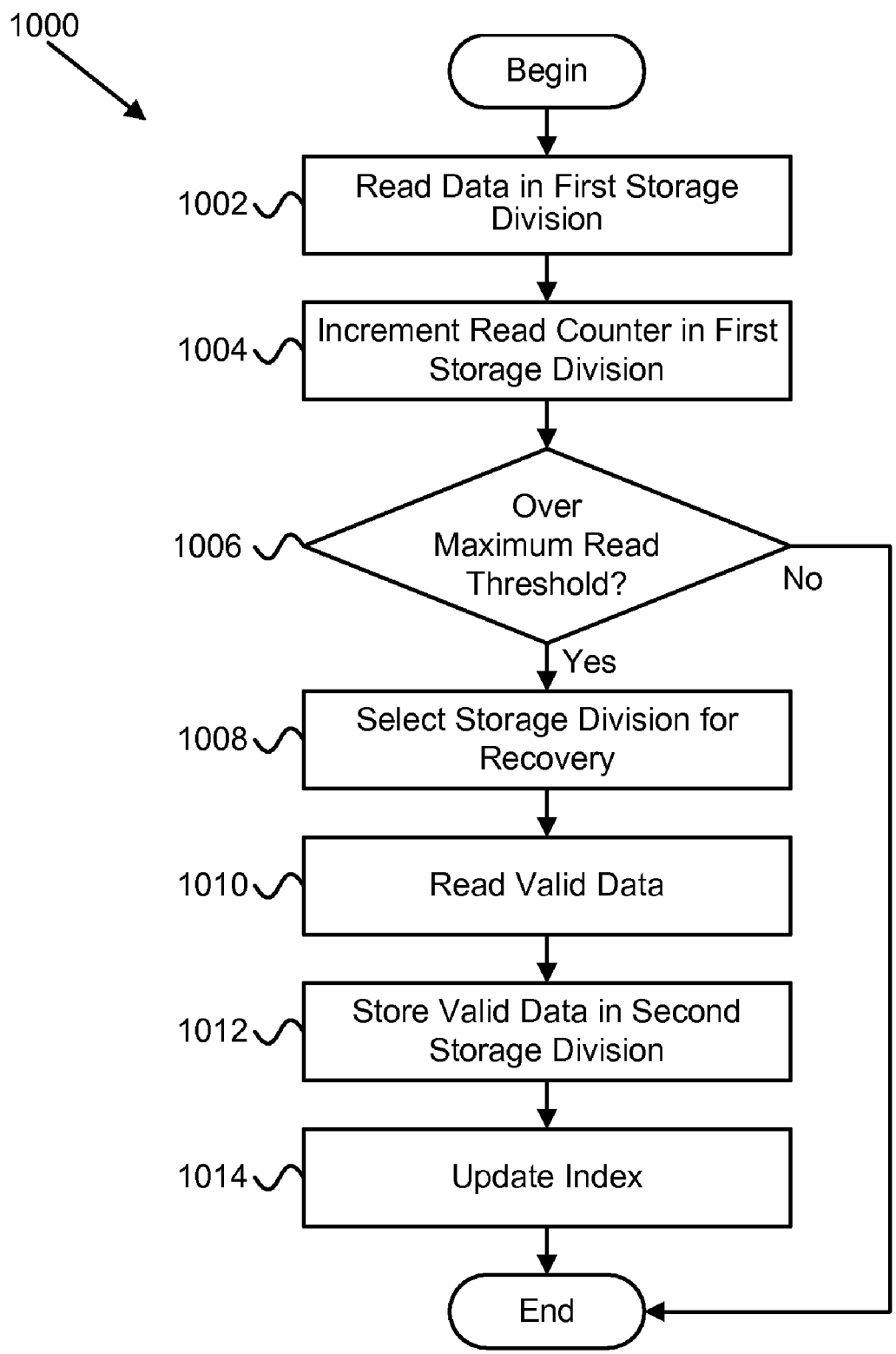
FIG. 10 is a schematic flow chart diagram illustrating one embodiment of a method for storage space recovery after reaching a read count limit in accordance with the present invention.

FIG. 10 is a schematic flow chart diagram illustrating one embodiment of a method 1000 for storage space recovery after reaching a read count limit in accordance with the present invention. The method 1000 begins and the read module 814 reads 1002 data in a first storage division where the first storage division is solid-state storage 110 in the solid-state storage device 102. The read module 814 may be part of the read operations resident on the solid-state controller 104.

The read counter module 816 increments 1004 a read counter in response to the read module 814 reading 1002 data in the first storage division. The read counter corresponds to the first storage division and at least a portion of the storage divisions in the solid-state storage 110 each include a corresponding read counter. Each read counter is incremented 1004 by the read counter module 816 each time a read operation occurs in the storage division corresponding to the read counter.

The read counter limit module 818 determines 1006 if the read counter for the first storage division exceeds a maximum read threshold. If the read counter limit module 818 determines 1006 that the read counter for the first storage division does not exceed the maximum read threshold, the method 1000 ends. If the read counter limit module 818 determines 1006 that the read counter for the first storage division exceeds a maximum read threshold, the storage division selection module 804 selects 1008 the first storage division for recovery. The data recovery module 806 reads 1010 valid data packets from the first storage division, stores 1012 the valid data packets in a second storage division, and updates 1014 the logical index of the solid-state storage controller 104 and the method 1000 ends. The data recovery module 806 updates 1014 the logical index by mapping a logical identifier for each data packet to physical locations where the data packets are stored in the solid-state storage 110.

Figure 11:
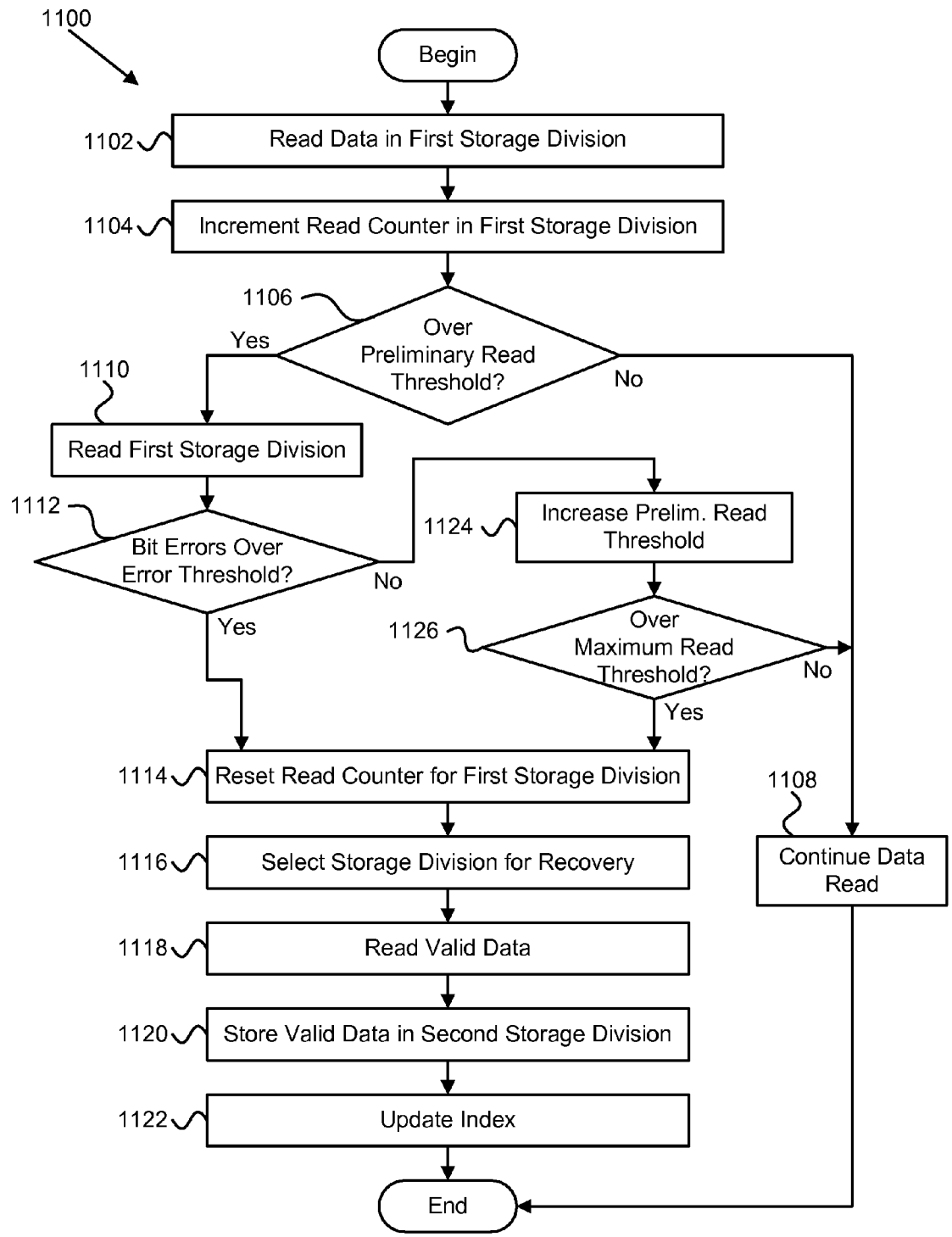
FIG. 11 is a schematic flow chart diagram illustrating an alternate embodiment of a method for storage space recovery after reaching a read count limit in accordance with the present invention.

FIG. 11 is a schematic flow chart diagram illustrating an alternate embodiment of a method 1100 for storage space recovery after reaching a read count limit in accordance with the present invention. The method 1100 begins and the read module 814 reads 1102 data in a first storage division where the first storage division is solid-state storage 110 in the solid-state storage device 102. The read counter module 816 increments 1104 a read counter in response to the read module 814 reading 1102 data in the first storage division where the read counter corresponds to the first storage division.

The read counter preliminary limit module 820 determines 1106 if the read counter for the first storage division exceeds a preliminary read threshold. If the read counter preliminary limit module 820 determines 1106 that the read counter for the first storage division does not exceed the preliminary read threshold, the solid-state storage controller 104 continues 1108 the data read operation and the method 1100 ends.

If the read counter preliminary limit module 820 determines 1106 that the read counter for the first storage division exceeds the preliminary read threshold, the storage division read module 822 reads 1110 a portion or all of the data locations within the first storage division and determines if errors exist in the data read 1110 by the storage division read module 822.

The storage division error module 824 determines 1112 if errors identified by the storage division read module 822 have reached an error threshold. If the storage division error module 824 determines 1112 that the errors identified by the storage division read module 822 have reached the error threshold, the data recovery module 806 resets 1114 the read counter for the first storage division and selects 1116 the first storage division for recovery. The data recovery module 806 reads 1118 valid data packets from the first storage division, stores 1120 the valid data packets in a second storage division, and updates 1122 the logical index of the solid-state storage controller 104 and the method 1100 ends.

If the storage division error module 824 determines 1112 that the errors identified by the storage division read module 822 have not reached the error threshold, the storage division error module 824 increases 1124 the preliminary read threshold for the first storage division. The read counter limit module 818 determines 1126 if the read counter for the first storage division exceeds the maximum read threshold for the first storage division. If the read counter limit module 818 determines 1006 that the read counter for the first storage division does not exceed the maximum read threshold, the solid-state controller 104 continues 1108 the data read operation for data in the first storage division and the method 1100 ends.

If the read counter limit module 818 determines 1126 that the read counter for the first storage division exceeds a maximum read threshold, the data recovery module 806 resets 1114 the read counter for the first storage division and selects 1116 the first storage division for recovery. The data recovery module 806 reads 1118 valid data packets from the first storage division, stores 1120 the valid data packets in a second storage division, and updates 1122 the logical index of the solid-state storage controller 104 and the method 1100 ends.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus for storage recovery, the apparatus comprising:
   a read module that reads at least a portion of a data packet stored in a first storage division, the first storage division comprising a portion of solid-state storage in a solid-state storage device;
   a read counter module that increments a read counter in response to the read module reading data stored in the first storage division, the read counter corresponding to the first storage division, wherein the solid-state storage device comprises a plurality of storage divisions and each storage division comprises a separate read counter;
   a read counter limit module that determines if the read counter corresponding to the first storage division has reached a maximum read threshold;
   a storage division selection module that selects the first storage division for recovery in response to a read counter reaching the maximum read threshold, the read counter corresponding to the first storage division; and
   a data recovery module that, in response to the storage division selection module selecting the first storage division for recovery, reads valid data packets from the first storage division, stores the valid data packets in a second storage division in the solid-state storage device, and updates a logical index with a new physical address of the valid data, the logical index comprising a mapping of physical addresses of data packets stored in the solid-state storage to logical identifiers corresponding to the data packets.

2. The apparatus of claim 1, further comprising:
   a read counter preliminary limit module that determines if the read counter corresponding to the first storage division has reached a preliminary read threshold;
   a storage division read module that reads at least a portion of the data locations within the first storage division in response to the read counter preliminary limit module determining that the read counter corresponding to the first storage division has reached the preliminary read threshold, wherein the storage division read module reads the data locations within the storage division to determine if errors exist in data stored in the storage division;

a storage division error module that determines if errors identified by the storage division read module have reached an error threshold; and wherein the storage division selection module further selects the first storage division for recovery in response to the storage division error module determining that the number of errors identified by the storage division read module has reached the error threshold.

3. The apparatus of claim 2, wherein in response to the read counter preliminary limit module determining that the read counter corresponding to the first storage division has reached the preliminary read threshold, the storage division error module further increases the preliminary read threshold by a predetermined amount.

4. The apparatus of claim 1, wherein in response to the read counter limit module determining that the read counter corresponding to the first storage division has reached a maximum read threshold, the data recovery module further resets the read counter corresponding to the first storage division.

5. The apparatus of claim 1, further comprising a threshold adjustment module that adjusts at least the maximum read threshold.

6. The apparatus of claim 5, wherein the threshold adjustment module adjusts at least the maximum read threshold based on one or more of amount of time that the solid-state storage device is in operation, number of retired storage divisions, number of retired logical storage divisions wherein a logical storage division comprises a group of storage divisions, number of erase cycles, number of program operations, read count, operating temperature, and an environmental condition.

7. The apparatus of claim 5, wherein the threshold adjustment module adjusts at least the maximum read threshold based on a number of times the storage division selection module selected a storage division for recovery as a result of a number of errors found in one or more of a storage division, a chip, a group of chips, a die, a group of die, and a logical storage division wherein the logical storage division comprises a group of storage divisions.

8. The apparatus of claim 5, wherein the threshold adjustment module adjusts at least the maximum read threshold based on one or more of statistical data, parameters, heuristics, rules, and/or algorithms related to solid-state storage life expectancy and curve fitting data.

9. The apparatus of claim 5, wherein the threshold adjustment module adjusts at least the maximum read threshold based on information from a management system, the information comprising information derived from one or more of test data related to solid-state storage, operational data collected from solid-state storage in use, and data from a solid-state storage supplier.

10. The apparatus of claim 5, wherein the threshold adjustment module adjusts at least the maximum read threshold based on a confidence factor, the confidence factor comprising a probability that data transmitted from the solid-state storage as a result of a read request will be error free.

11. The apparatus of claim 5, wherein the threshold adjustment module adjusts at least the maximum read threshold based on one or more of data resulting from testing of the solid-state storage comprising the storage division, manufacturer representative test data, and data dependent upon configuration of the solid-state storage.

12. The apparatus of claim 1, further comprising an ECC module wherein the storage division selection module selects the first storage division for recovery in response to the ECC module reading one or more ECC blocks within the first storage block and determining that the one or more ECC blocks comprise a number of errors that exceeds one or more correction thresholds.

13. The apparatus of claim 12, wherein the ECC module determines that the one or more ECC blocks exceeds the correction thresholds by one or more of determining a mean number of errors, determining a median number of errors, a distribution of errors, determining that at least one ECC block exceeds a correction threshold, and determining that one or more ECC blocks exceeds a first correction threshold and a total number of errors of the one or more ECC blocks exceeds a second correction threshold.

14. The apparatus of claim 1, further comprising a sequential storage module that sequentially writes data packets in a storage division of the solid-state storage device, wherein the data packets are stored sequentially on the solid-state storage device in an order that the data packets are received from one or more clients and from a storage division marked for recovery such that the sequentially stored data packets are stored contiguously within a storage division and comprise the data packets received from the one or more clients interspersed with the data packets received from a storage division marked for recovery.

15. The apparatus of claim 1, further comprising a storage division recovery determination module that determines if the first storage division is in a condition to be available for writing data packets in response to the data recovery module completing copying valid data from the first storage division.

16. The apparatus of claim 1, further comprising a storage division recovery module that marks the first storage division available for writing data packets in response to the data recovery module storing the valid data packets in a second storage division.

17. The apparatus of claim 16, wherein a storage division comprises an erase block and further comprising an erase module that erases an erase block selected for recovery prior to the storage division recovery module marking the erase block available for writing data packets, wherein the erase module erases the erase block selected for recovery in response to the data recovery module copying valid data packets from the selected erase block.

18. The apparatus of claim 16, further comprising a garbage marking module that identifies a data packet in a storage division as invalid in response to an operation indicating that the data packet is no longer valid.

19. The apparatus of claim 18, wherein the data packet in the storage division is a first data packet and an operation indicating that the first data packet is no longer valid comprises writing a second data packet to the solid-state storage device wherein the second data packet indicates that the first data packet is invalid.

20. The apparatus of claim 18, wherein an operation indicating that the data packet is no longer valid comprises one of a delete operation and a read-modify-write operation, the delete operation signifying that the data packet is to be deleted and the read-modify-write operation comprising reading the data packet, modifying the data packet, and writing the modified data packet to another location in the solid-state storage device.

21. The apparatus of claim 18, wherein identifying a data packet as invalid comprises modifying an entry in the logical index to indicate that the data packet is invalid.

22. The apparatus of claim 1, wherein one or more of the storage division selection module, the data recovery module, and the storage division recovery determination module operate autonomously from the read module, the read counter module, and the read counter limit module.

23. The apparatus of claim 1, wherein the storage division selection module selects a storage division for recovery by identifying a storage division with a low amount of wear.

24. The apparatus of claim 23, wherein identifying a storage division with a low amount of wear comprises identifying a storage division with one or more of a low number of erase cycles, a low read count, and a low bit error rate.

25. The apparatus of claim 1, wherein the storage division selection module selects a storage division for recovery by identifying a storage division with a high amount of wear.

26. The apparatus of claim 25, wherein identifying a storage division with a high amount of wear comprises identifying a storage division with one or more of a high number of erase cycles, a high read count, a high bit error rate, a high bit error rate with a low read count, and a non-recoverable error-correcting code ("ECC") block.

27. The apparatus of claim 25, wherein the storage division recovery module marks the storage division selected for recovery as unavailable for storing data.

28. The apparatus of claim 1, wherein the storage division selection module selects a storage division for recovery by identifying a storage division with a high amount of invalid data.

29. The apparatus of claim 1, wherein the storage division selection module selects a storage division for recovery by identifying a storage division using a combination of two or more of a program count, erase cycle count, read count, bit error rate, amount of invalid data, erase cycles, and a non-recoverable ECC block.

30. The apparatus of claim 1, wherein the solid-state storage is arranged in an array of storage elements and a storage division comprises a virtual storage division that includes a storage division within each storage element in a row of storage elements accessed together.

31. A system for storage recovery, the system comprising:
a solid-state storage device comprising solid-state storage, the solid-state storage comprising one or more storage divisions, each storage division comprising a portion of the solid-state storage
a solid-state storage controller comprising
a read module that reads at least a portion of a data packet stored in a first storage division;
a read counter module that increments a read counter in response to the read module reading data stored in the first storage division, the read counter corresponding to the first storage division, wherein each storage division comprises a separate read counter;
a read counter limit module that determines if the read counter corresponding to the first storage division has reached a maximum read threshold;
a storage division selection module that selects the first storage division for recovery in response to a read counter reaching the maximum read threshold, the read counter corresponding to the first storage division; and
a data recovery module that, in response to the storage division selection module selecting the first storage division for recovery, reads valid data packets from the first storage division, stores the valid data packets in a second storage division in the solid-state storage device, and updates a logical index with a new physical address of the valid data, the logical index comprising a mapping of physical addresses of data packets stored in the solid-state storage to logical identifiers corresponding to the data packets.

32. A computer program product comprising a tangible computer readable storage medium having computer usable program code executable to perform operations for storage recovery, the operations of the computer program product comprising:
reading at least a portion of a data packet stored in a first storage division, the first storage division comprising a portion of solid-state storage in a solid-state storage device;
incrementing a read counter in response to reading data stored in the first storage division, the read counter corresponding to the first storage division, wherein the solid-state storage device comprises a plurality of storage divisions and each storage division comprises a separate read counter;
determining if the read counter corresponding to the first storage division has reached a maximum read threshold;
selecting the first storage division for recovery in response to a read counter reaching the maximum read threshold, the read counter corresponding to the first storage division; and
in response to selecting the first storage division for recovery, reading valid data packets from the first storage division, storing the valid data packets in a second storage division in the solid-state storage device, and updating a logical index with a new physical address of the valid data, the logical index comprising a mapping of physical addresses of data packets stored in the solid-state storage to logical identifiers corresponding to the data packets.

33. The computer program product of claim 32, further comprising
determining if the read counter corresponding to the storage division has reached a preliminary read threshold;
reading at least a portion of the data locations within the first storage division in response to determining that the read counter corresponding to the first storage division has reached the preliminary read threshold, wherein the computer program product reads the data locations within the storage division to determine if errors exist in data stored in the storage division;
determining if a number of identified errors has reached an error threshold; and
selecting the first storage division for recovery in response to determining that the number of identified errors has reached the error threshold.

34. The computer program product of claim 32, further comprising sequentially writing data packets in a storage division of the solid-state storage device, wherein the data packets are stored sequentially on the solid-state storage device in an order that the data packets are received from one or more clients and from a storage division marked for recovery such that the sequentially stored data packets are stored contiguously and comprise the data packets received from the one or more clients interspersed with the data packets received from a storage division marked for recovery.

35. The computer program product of claim 32, further comprising marking the first storage division available for writing data packets in response to storing the valid data packets on a second storage division.

36. The computer program product of claim 35, wherein a storage division comprises an erase block and further comprising erasing an erase block selected for recovery prior to marking the erase block available for writing data packets, wherein the erase block is erased in response to copying valid data packets from the selected erase block.

* * * * *